(12) United States Patent
Uchiyama et al.

(10) Patent No.: US 8,482,843 B2
(45) Date of Patent: Jul. 9, 2013

(54) MEMS DEVICE AND METHOD OF MANUFACTURING THE SAME

(75) Inventors: Shingo Uchiyama, Kanagawa (JP); Fusao Shimokawa, Kanagawa (JP); Tomomi Sakata, Kanagawa (JP); Nobuhiro Shimoyama, Kanagawa (JP); Mitsuhiro Makihara, Kanagawa (JP); Mitsuo Usui, Kanagawa (JP)

(73) Assignee: Nippon Telegraph and Telephone Corporation, Tokyo (JP)

( * ) Notice: Subject to any disclaimer, the term of this patent is extended or adjusted under 35 U.S.C. 154(b) by 255 days.

(21) Appl. No.: 12/918,783

(22) PCT Filed: Mar. 2, 2009

(86) PCT No.: PCT/JP2009/053892
§ 371 (c)(1),
(2), (4) Date: Aug. 20, 2010

(87) PCT Pub. No.: WO2009/107835
PCT Pub. Date: Sep. 3, 2009

(65) Prior Publication Data
US 2011/0013256 A1     Jan. 20, 2011

(30) Foreign Application Priority Data

Feb. 29, 2008  (JP) .................. 2008-049520
Jun. 26, 2008  (JP) .................. 2008-166950
Jun. 26, 2008  (JP) .................. 2008-166953
Jun. 26, 2008  (JP) .................. 2008-166955
Jul. 11, 2008  (JP) .................. 2008-181451

(51) Int. Cl.
*G02B 26/00*     (2006.01)

(52) U.S. Cl.
USPC ....................... 359/290; 359/199.1

(58) Field of Classification Search
USPC ................... 359/290, 199.1–200.6
See application file for complete search history.

(56) References Cited

U.S. PATENT DOCUMENTS

| | | | |
|---|---|---|---|
| 6,574,026 B2 * | 6/2003 | Jin et al. | 359/224.1 |
| 6,947,197 B2 * | 9/2005 | Yoon et al. | 359/291 |
| 2004/0063325 A1 * | 4/2004 | Urano et al. | 438/692 |
| 2004/0150869 A1 * | 8/2004 | Kasai | 359/290 |
| 2005/0063038 A1 * | 3/2005 | Filhol | 359/291 |
| 2007/0137480 A1 * | 6/2007 | Bergeron et al. | 95/79 |

FOREIGN PATENT DOCUMENTS

| | | |
|---|---|---|
| JP | 2003-057575 A | 2/2003 |
| JP | 2004-170833 A | 6/2004 |
| JP | 2005-221903 A | 8/2005 |
| JP | 2007-140168 A | 6/2007 |
| JP | 2007-212728 A | 8/2007 |
| JP | 2007-240728 A | 9/2007 |
| WO | WO 2006/073111 A | 7/2006 |

* cited by examiner

*Primary Examiner* — Thomas K Pham
*Assistant Examiner* — Vipin Patel
(74) *Attorney, Agent, or Firm* — Blakely, Sokoloff, Taylor & Zafman LLP

(57) ABSTRACT

A MEMS device includes a mirror substrate (200), an electrode substrate (301) arranged so as to face the mirror substrate (200), a mirror (230) serving as a movable member rotatably supported in an opening portion of the mirror substrate (200) via support members, a driving electrode (101) arranged on an insulating film (104) on a surface of the electrode substrate (301) facing the mirror substrate (200) so as to face the mirror (230) across a gap and drive the mirror (230), and a lower electrode (103) made of a metal or a semiconductor and formed under the insulating film (104) exposed to the gap so as to be in contact with the insulating film (104).

6 Claims, 49 Drawing Sheets

MEMS DEVICE AND METHOD OF MANUFACTURING THE SAME

This is a non-provisional application claiming the benefit of International application number PCT/JP2009/053892 filed Mar. 2, 2009.

TECHNICAL FIELD

The present invention relates to an electrostatically driven MEMS device used in an optical switching device for communication, a measuring device, a display, a scanner, a wavelength selective switch, or the like, and a method of manufacturing the same.

BACKGROUND ART

In the field of an optical network that is the basis of an Internet communication network, the optical MEMS (Micro Electro Mechanical System) technique is moving into the limelight as a technique of implementing multi-channel, WDM (Wavelength Division Multiplexing), and cost reduction, and an optical switch device to be used in optical communication has been developed using this technique. This optical switch device enables high-speed path switching without converting light into an electrical signal or without demultiplexing multiplexed light into wavelengths. As a switching device for switching an optical path, a MEMS mirror array is used (Japanese Patent Laid-Open No. 2003-57575). Such an optical switch device is used to, upon failure occurrence in a use communication path, distribute a signal to another communication path and maintain a communicable state.

The MEMS mirror array is formed by one- or two-dimensionally disposing a plurality of micromirror devices that are a kind of electrostatically driven MEMS devices. FIGS. 61 and 62 show an example of a conventional micromirror device. FIG. 61 is an exploded perspective view showing the arrangement of a conventional micromirror device. FIG. 62 is a sectional view of the micromirror device shown FIG. 61. A micromirror device 100 has a structure in which a mirror substrate 200 having a mirror and an electrode substrate 300 having electrodes are disposed in parallel.

The mirror substrate 200 includes a plate-shaped frame portion 210 having an opening with an almost circular shape viewed from above, a gimbal 220 having an opening with an almost circular shape viewed from above and disposed in the opening of the frame portion 210 via a pair of gimbal connectors 211a and 211b, and a mirror 230 having an almost circular shape viewed from above and disposed in the opening of the gimbal 220 via a pair of mirror connectors 221a and 221b. In addition, a frame member 240 is formed on the upper surface of the frame portion 210 so as to surround the gimbal 220 and the mirror 230.

Each of the pair of gimbal connectors 211a and 211b is formed from a torsion spring, and connects the frame portion 210 and the gimbal 220. The gimbal 220 can rotate about a gimbal rotation axis x in FIG. 61 which passes through the pair of gimbal connectors 211a and 211b. Similarly, each of the pair of mirror connectors 221a and 221b is formed from a torsion spring, and connects the gimbal 220 and the mirror 230. The mirror 230 can rotate about a mirror rotation axis y in FIG. 61 which passes through the pair of mirror connectors 221a and 221b. The gimbal rotation axis x and the mirror rotation axis y are perpendicular to each other. As a result, the mirror 230 rotates about the two axes perpendicular to each other.

The electrode substrate 300 includes a plate-shaped base portion 310, and a terraced projecting portion 320 projecting from the surface (upper surface) of the base portion 310 at a position facing the mirror 230 of the mirror substrate 200 on the opposite side. The base portion 310 and the projecting portion 320 are made of, for example, single-crystal silicon. The projecting portion 320 includes a second terrace 322 having a truncated pyramidal shape and formed on the upper surface of the base portion 310, a first terrace 321 having a truncated pyramidal shape and formed on the upper surface of the second terrace 322, and a pivot 330 having a columnar shape and formed on the upper surface of the first terrace 321. The pivot 330 is formed so as to be located almost at the center of the first terrace 321. The pivot 330 is thus disposed at a position facing the center of the mirror 230. An insulating film 311 is formed on the surface of the electrode substrate 300 where the projecting portion 320 is provided.

Four fan-shaped electrodes 340a to 340d are formed on the insulating film 311 on the upper surface of the base portion 310 including the outer surface of the projecting portion 320 so as to be located in a circle concentric to the mirror 230 of the mirror 230 of the mirror substrate 200 on the opposite side. A pair of convex portions 360a and 360b are formed on the upper surface of the base portion 310 so as to be juxtaposed on both sides of the projecting portion 320. Electrical interconnections 370 are formed between the projecting portion 320 and the convex portions 360a and 360b on the upper surface of the base portion 310. The electrodes 340a to 340d are connected to the electrical interconnections 370 via leads 341a to 341d, respectively.

The mirror substrate 200 and the electrode substrate 300 described above constitute the micromirror device 100 shown in FIG. 62 by bonding the lower surface of the frame portion 210 to the upper surfaces of the convex portions 360a and 360b so that the mirror 230 faces the electrodes 340a to 340d corresponding to the mirror 230.

The mirror 230 is grounded. Positive potentials are applied to the electrodes 340a to 340d to generate an asymmetrical potential difference between them. This allows to attract the mirror 230 by an electrostatic attraction and rotate it in an arbitrary direction.

In recent years, research and development of wavelength selective switches is in progress, which demultiplex multiplexed light into wavelengths and switch paths for the respective wavelengths. Some wavelength selective switches use micromirror devices (Japanese Patent Laid-Open No. 2007-140168). To switch the paths of light of respective wavelengths demultiplexed by a grating or the like, as in a wavelength selective switch, it is necessary to reduce the interval between individual mirrors. If the mirror interval increases relative to the interval of the paths of demultiplexed light of the respective wavelengths, light strikes a region between the mirrors. This makes it impossible to guide light of a wavelength concerned to an output port. However, it is difficult to reduce the mirror interval for the micromirror device shown in FIGS. 61 and 62.

To do this, a mirror array has been proposed which enables to arrange a plurality of micromirror device at a smaller interval (Japanese Patent Laid-Open No. 2007-240728). For this mirror array, an arrangement has been proposed which uses wall electrodes to suppress interference (crosstalk) between adjacent micromirror devices. This mirror array will be explained with reference to the perspective view of FIG. 63.

Although not illustrated in FIG. 63, the mirror array includes an electrode substrate and a mirror substrate facing it. A support structure provided to surround a mirror array region where a plurality of micromirror devices are arranged fixes the mirror substrate above the electrode substrate at a predetermined distance. The electrode substrate and the mirror substrate are arranged in parallel to each other.

On the electrode substrate, a movable beam driving electrode 601a, movable beam driving electrode 601b, mirror driving electrode 603a, and mirror driving electrode 603b are provided for each micromirror device, as shown in FIG. 63. The movable beam driving electrode 601a, movable beam driving electrode 601b, mirror driving electrode 603a, and mirror driving electrode 603b constitute one electrode portion (one electrode portion group).

The mirror substrate has a frame portion (not shown) having an opening to expose the mirror array region. The frame portion is connected to the upper surface of the support structure. Movable beams 613a and 613b each having one end fixed to the frame portion are provided inside the frame portion of the mirror substrate. One end of each of the movable beams 613a and 613b is fixed to a corresponding one of the two opposite internal sides of the frame portion so that the movable beams are aligned at a predetermined distance on the same line in the direction in which the two sides face each other. That is, the movable beams 613a and 613b each having one end fixed and the other end facing that of the counterpart are arranged in line at a predetermined distance. In the example shown in FIG. 63, the movable beams 613a and 613b are aligned on a line parallel to the y-axis direction. Additionally, each of the movable beams 613a and 613b has the other end displaceable in the normal line direction of the mirror substrate, and therefore has a cantilever structure.

A mirror 611 is arranged between the movable beams 613a and 613b and connected to them via a pair of flexible connectors 612a and 612b. The mirror 611 is aligned with the movable beams 613a and 613b, and rotationally arranged between them. The connectors 612a and 612b connect the other end of each of the movable beams 613a and 613b to the mirror 611. The movable beam 613a, mirror 611, and movable beam 613b are aligned in this order on the same line in the direction in which the two sides connected to the movable beams 613a and 613b face each other. The movable beam 613a, mirror 611, movable beam 613b, and pair of connectors 612a and 612b constitute one reflecting portion (one reflecting portion group).

In this example, the movable beam 613a, mirror 611, and movable beam 613b are aligned on a line parallel to the y-axis direction. The mirror 611 can rotate about a first rotation axis which passes through the pair of connectors 612a and 612b. The mirror 611 can also rotate about the first rotation axis parallel to the y-axis. A plurality of micromirror devices are arranged along a direction perpendicular to the alignment (array) direction of the movable beam 613a, mirror 611, and movable beam 613b, thereby forming a mirror array. Note that a metal film of, e.g., gold or aluminum is formed on the surface of the mirror 611 to reflect, for example, light in the infrared range.

In addition, the micromirror device includes wall electrodes 602a and 602b corresponding to the movable beam driving electrodes 601a and 601b, respectively. Two wall electrodes 602a are arranged so as to sandwich at least a region where the movable beam 613a deforms. Similarly, two wall electrodes 602b are arranged so as to sandwich at least a region where the movable beam 613b deforms. The wall electrodes 602a are electrically connected to the movable beam driving electrode 601a, and the wall electrodes 602b are electrically connected to the movable beam driving electrode 601b.

The movable beam 613a facing the movable beam driving electrode 601a has such a width as to be displaceable to the side of the movable beam driving electrode 601a in the region sandwiched between the wall electrodes 602a. Similarly, the movable beam 613b facing the movable beam driving electrode 601b has such a width as to be displaceable to the side of the movable beam driving electrode 601b in the region sandwiched between the wall electrodes 602b. Hence, the movable beams 613a and 613b are formed to be narrower than, for example, the mirror 611.

The above-described movable beam driving electrodes 601a and 601b and the set of the mirror driving electrodes 603a and 603b, the movable beam 613a, the mirror 611, the movable beam 613b, which are paired with the electrodes, and the pair of connectors 612a and 612b form one micromirror device. In one micromirror device, the movable beam driving electrode 601a and the movable beam 613a are arranged so as to face each other in the normal line direction (z-axis direction) of the electrode substrate (mirror substrate), and so are the movable beam driving electrode 601b and the movable beam 613b, and the set of mirror driving electrodes 603a and 603b and the mirror 611.

Driving voltages (driving signals) to drive the movable beams 613a and 613b are applied to the movable beam driving electrodes 601a and 601b via electrical interconnections (not shown). In addition, driving voltages to drive the mirror 611 are applied to the mirror driving electrodes 603a and 603b via electrical interconnections (not shown). Note that the movable beam 613a, mirror 611, movable beam 613b, and the pair of connectors 612a and 612b are set at an equipotential. The equipotential is, for example, the ground potential.

The operation of the micromirror device will be described next. The micromirror device actively moves the pair of connectors 612a and 612b, thereby realizing two-axis rotation via them. First, a predetermined driving voltage is applied to the movable beam driving electrode 601b to generate an electrostatic attraction, and thus attract the movable beam 613b toward the electrode substrate. The movable beam 613b bends (deforms) using its end supported by the frame portion as a fulcrum so that the other end of the movable beam 613b displaces toward the electrode substrate. Consequently, the mirror 611 is attracted toward the electrode substrate on the side of the connector 612b using the connector 612a as a fulcrum. The mirror 611 is not parallel to the electrode substrate any longer but tilts in the y-axis direction.

In the tilt state, the mirror 611 rotates about the second rotation axis which passes through the central portion of the mirror 611 and is parallel to the micromirror device array direction (x-axis direction). The mirror can perform this rotation operation even by applying a predetermined driving voltage to the movable beam driving electrode 601a to attract the other end of the movable beam 613a toward the electrode substrate in the same way as described above. In this case, the mirror 611 rotates about the second rotation axis in a direction opposite to that in the above-described case.

Controlling the voltages applied to the mirror driving electrodes 603a and 603b enables the mirror 611 to rotate about the first rotation axis which passes through the pair of connectors 612a and 612b. For example, a higher voltage is applied to the mirror driving electrode 603b relative to the mirror driving electrode 603a. This allows control to tilt the mirror 611 toward the mirror driving electrode 603b about the first rotation axis.

Providing the wall electrodes 602a and 602b makes it possible to suppress crosstalk between the adjacently arranged micromirror devices, as will be described below. Each micromirror device is arranged at a narrow interval with respect to adjacent micromirror devices. For this reason, if the movable beam driving electrode 601a is a simple parallel-plate electrode, the electrostatic attraction affects not only the movable beam of the micromirror device of interest but also the movable beam of each adjacent micromirror device, and displaces its position. As a result, electrical interference (crosstalk) may occur between the adjacent mirrors 611.

However, the wall electrodes 602a connected to each movable beam driving electrode 601a can separate the electric fields to drive the movable beams for each micromirror device. The wall electrodes 602a almost block the lines of electric force from the movable beam driving electrode 601a to the adjacent movable beams 613a, thereby suppressing the influence of crosstalk. Such crosstalk suppression is most effective when the height of the wall electrodes 602a and 602b almost matches the height-direction position of the movable beams 613a and 613b in the initial state.

In addition, using the wall electrodes can provide an effect of bringing back the movable beam in a direction opposite to the driving electrode. Hence, the deformation amount of the movable beam with respect to an increase in the voltage applied to the driving electrode can be suppressed small.

DISCLOSURE OF INVENTION

Problems to be Solved by the Invention

In an electrostatically driven MEMS device such as the micromirror device shown in FIGS. 61 and 62, the tilt angle of the mirror is determined based on the balance between the restoring force of the springs and the electrostatic attraction generated by the voltages applied between the driving electrodes and the movable electrodes of the mirror or the like. Hence, if predetermined voltages are applied to the fixed electrodes for driving the mirror, a predetermined mirror tilt angle should be obtained. However, if the insulating film near the fixed electrodes is charged due to some reason, and the charge accumulation amount changes over time, the strength of the electric field applied to the mirror changes over time in accordance with the time-rate change of the charge accumulation amount. As a result, the magnitude of electrostatic attraction to rotate the mirror changes, and the mirror tilt angle varies. The mirror tilts when the electrostatic attraction balances the restoring force of the springs. However, if the restoring force changes due to some reason, the mirror tilt angle also varies. This phenomenon is called "drift", which poses a serious problem in using the electrostatically driven MEMS device.

Such drift occurs in the micromirror devices shown in FIG. 63 as well.

In a micromirror device used as an optical switch, if the mirror tilt angle varies due to drift, the signal light loss may vary or increase. In addition, when switching the connection path, it may be impossible to accurately control the mirror tilt angle and connect a new path.

The present invention has been made to solve the above-described problems, and has as its object to provide an electrostatically driven MEMS device capable of suppressing drift of the tilt angle of a movable member such as a mirror and a method of manufacturing the same.

Means of Solution to the Problem

According to the present invention, there is provided a MEMS device comprising a first substrate, a second substrate arranged so as to face the first substrate, a movable member rotatably supported in an opening portion of the first substrate via support members, a driving electrode arranged on an insulating film on a surface of the second substrate facing the first substrate so as to face the movable member across a gap and drive the movable member, and a driving stabilization electrode made of one of a metal and a semiconductor and formed in contact with the insulating film of the second substrate.

According to the present invention, there is also provided a MEMS device comprising a first substrate, a second substrate arranged so as to face the first substrate, a movable member rotatably supported in an opening portion of the first substrate via support members, a driving electrode arranged on an insulating film on a surface of the second substrate facing the first substrate so as to face the movable member across a gap and drive the movable member, a first metal film formed on a surface of the movable member on the other surface side of the first substrate so as to serve as a reflecting surface, and a second metal film formed on a surface of the movable member on one surface side of the first substrate so as to have the same shape as that of the first metal film, wherein the first metal film and the second metal film are made of the same metal material as that of the driving electrode, formed to be similar to and smaller than the movable member, and arranged concentrically with the movable member.

According to the present invention, there is also provided a MEMS device comprising a first substrate, a second substrate arranged so as to face the first substrate, a movable member rotatably supported in an opening portion of the first substrate via support members, a driving electrode arranged on an insulating film on a surface of the second substrate facing the first substrate so as to face the movable member across a gap and drive the movable member, a driving stabilization electrode made of one of a metal and a semiconductor and formed in contact with the insulating film of the second substrate, a first metal film formed on a surface of the movable member on the other surface side of the first substrate so as to serve as a reflecting surface, and a second metal film formed on a surface of the movable member on one surface side of the first substrate so as to have the same shape as that of the first metal film, wherein the first metal film and the second metal film are made of the same metal material as that of the driving electrode, formed to be similar to and smaller than the movable member, and arranged concentrically with the movable member.

According to the present invention, there is also provided a method of manufacturing a MEMS device including a movable member rotatably supported in an opening portion of a semiconductor substrate via support members, comprising the steps of forming the support members and the movable member on a SOI layer of a SOI substrate, etching part of a silicon base portion of the SOI substrate in a region where the support members and the movable member are formed until a buried oxide layer of the SOI substrate is exposed, forming, on the buried oxide layer exposed in the step of etching the silicon base portion, a resist pattern having an opening region corresponding to the region where the movable member is formed, removing the buried oxide layer exposed to the opening region of the resist pattern and the buried oxide layer near an edge of the opening region, depositing a metal film on the movable member of the SOI substrate using the resist pattern as a mask, and removing the resist pattern.

According to the present invention, there is also provided a method of manufacturing a MEMS device including a movable member rotatably supported in an opening portion of a semiconductor substrate via support members, comprising the steps of forming the support members and the movable member on a SOI layer of a SOI substrate, etching a silicon base portion and a buried oxide layer of the SOI substrate in a region where the support members and the movable member are formed until the SOI layer is exposed, applying a resist thinner than the silicon base portion onto the SOI layer exposed in the step of etching the silicon base portion and the buried oxide layer, forming a resist pattern by exposing the resist from a side of the SOI layer on an opposite side of the silicon base portion using the support members or the movable member as a mask, depositing a metal film on a surface of the SOI layer with the formed resist pattern using the resist pattern as a mask, and removing the resist pattern.

Effects of the Invention

According to the present invention, a driving stabilization electrode made of a metal or a semiconductor is provided in contact with the insulating film of the second substrate. This allows to reduce or prevent charge accumulation in the insulating film provided on the surface of the second substrate even when a voltage is applied to the fixed electrodes (driving electrodes) of the MEMS device. It is therefore possible to suppress the phenomenon that the tilt angle of the movable member of the MEMS device changes over time, i.e., drift of the tilt angle.

According to the present invention, first and second metal films made of the same metal material as that of the driving electrodes and having the same shape are formed to be similar to and smaller than the movable member, and arranged concentrically with the movable member. No metal such as Au is formed on the support members. This enables to suppress drift of the tilt angle of the movable member. Additionally, in the present invention, the movable member having, on its surfaces, the metal films made of the same metal as that of the driving electrodes can be prevented from sticking to the driving electrodes.

According to the present invention, the silicon base portion existing in the region where the support members and the movable member are formed is etched until the buried oxide layer of the SOI substrate is exposed. A resist pattern having an opening region corresponding to the region with the movable member is formed on the exposed buried oxide layer. The buried oxide layer exposed to the opening region of the resist pattern and the buried oxide layer near the edge of the opening region are removed. A metal film is deposited on the movable member of the SOI substrate using the resist pattern as a mask, thereby preventing metal film formation on the support members. This allows to suppress drift of the tilt angle of the movable member. Additionally, in the present invention, the metal film can be formed while separating the metal film adhered to the side walls of the resist pattern and the metal film deposited on the desired movable member. It is therefore possible to form a metal film having a fine surface shape on the movable member such as a mirror upon stripping (lift-off) of the resist pattern.

According to the present invention, the silicon base portion and the buried oxide layer of the SOI substrate existing in the region where the support members and the movable member are formed are etched until the SOI layer is exposed. A resist thinner than the silicon base portion is applied onto the exposed SOI layer. A resist pattern is formed by exposing the resist from the side of the SOI layer on the opposite side of the silicon base portion using a portion except the support members as a mask, thereby preventing metal film formation on the support members. This allows to suppress drift of the tilt angle of the movable member. Additionally, in the present invention, a resist pattern that is thinner than the silicon base portion and having a reverse tapered shape can be formed as a mask for metal film formation. The metal film can be formed while separating the metal film adhered to the surface of the resist pattern and the metal film deposited on the surface of the SOI layer. It is therefore possible to form a metal film having a fine surface shape on the movable member such as a mirror upon stripping (lift-off) of the resist pattern.

BEST MODE FOR CARRYING OUT THE INVENTION

[First Embodiment]

Figure 1:
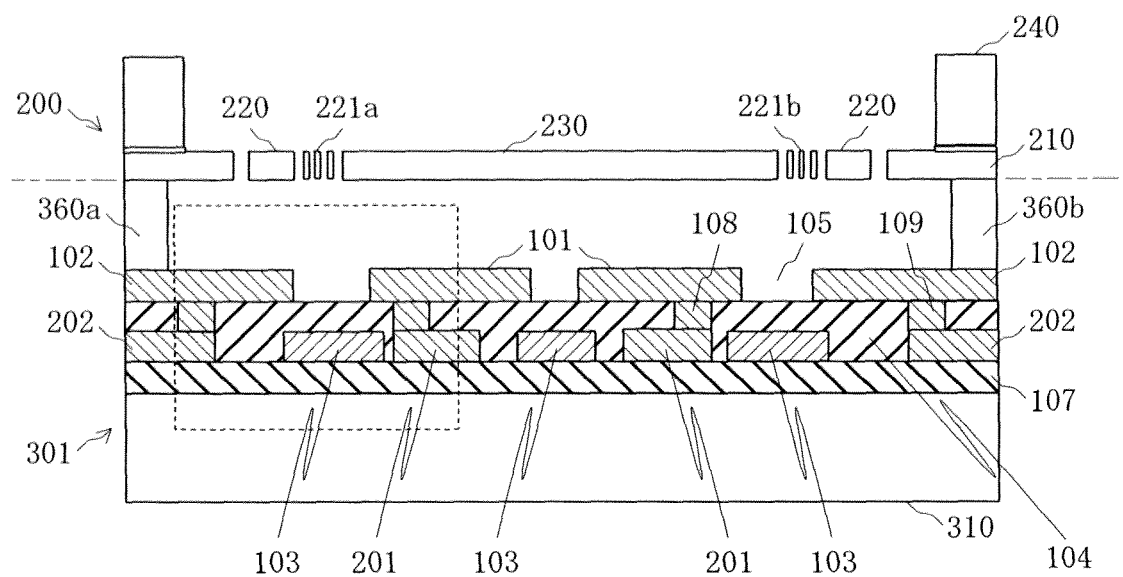
FIG. 1 is a sectional view showing the arrangement of a micromirror device according to the first embodiment of the present invention.

An embodiment of the present invention will now be described in detail with reference to the accompanying drawings. FIG. 1 is a sectional view of a micromirror device that is an electrostatically driven MEMS device according to the first embodiment of the present invention. Note that a mirror array is formed by one- or two-dimensionally disposing a plurality of micromirror devices shown in FIG. 1. The micromirror device according to this embodiment has a structure in which a mirror substrate 200 serving as a first substrate having a mirror and an electrode substrate 301 serving as a second substrate having electrodes are disposed in parallel.

The mirror substrate 200 has almost the same structure as that of the mirror substrate of the conventional micromirror device. The mirror substrate 200 includes a plate-shaped frame portion 210 having an opening with an almost circular shape viewed from above, a gimbal 220 having an opening with an almost circular shape viewed from above and disposed in the opening of the frame portion 210 via a pair of gimbal connectors (not shown), and a mirror 230 serving as a movable member having an almost circular shape viewed from above and disposed in the opening of the gimbal 220 via a pair of mirror connectors 221*a* and 221*b*. In addition, a frame member 240 is formed on the upper surface of the frame portion 210 so as to surround the gimbal 220 and the mirror 230. The gimbal 220 can rotate about a gimbal rotation axis which passes through the pair of gimbal connectors (not shown). Similarly, the mirror 230 can rotate about a mirror rotation axis which passes through the pair of mirror connectors 221*a* and 221*b*. The gimbal rotation axis and the mirror rotation axis are perpendicular to each other. As a result, the mirror 230 rotates about the two axes perpendicular to each other.

The electrode substrate 301 includes a plate-shaped base portion 310 made of, for example, single-crystal silicon, and convex portions 360*a* and 360*b* projecting from the surface (upper surface) of the base portion 310 to be bonded to the mirror substrate 200 on the opposite side. An insulating film 107 is formed on the surface of the electrode substrate 301 where the convex portions 360*a* and 360*b* are provided. The insulating film 107 has a function of preventing driving electrode electrical interconnections 201, a peripheral electrode electrical interconnection 202, and lower electrodes 103 (to be described later) from making an electrical short circuit via the base portion 310 made of a semiconductor such as silicon.

When a silicon substrate is used as the electrode substrate 301, a silicon oxide film is generally used as the insulating film 107. An unprocessed bare silicon substrate is cleaned as needed to make its surface clean, and then thermally oxidized in a thermal oxidation furnace, thereby forming the insulating film 107. A thermal oxide film formed by thermal oxidation out of silicon oxide film forming methods is known to be superior in quality and dielectric breakdown voltage characteristic to, e.g., a silicon oxide film deposited using CVD (Chemical Vapor Deposition) or the like.

The driving electrode electrical interconnections 201 which supply voltages to driving electrodes 101, the peripheral electrode electrical interconnection 202 which supplies a predetermined potential to a peripheral electrode 102, and the lower electrodes 103 serving as driving stabilization electrodes are formed on the upper surface of the insulating film 107. The driving electrode electrical interconnections 201, peripheral electrode electrical interconnection 202, and lower electrodes 103 are formed on the same layer of the electrode substrate 301. Hence, they can be formed simultaneously. The driving electrode electrical interconnections 201 and the peripheral electrode electrical interconnection 202 are connected, via bonding pads (not shown), to predetermined pins of a package that packages the mirror array.

In addition, an insulating film 104 made of a dielectric is formed on the upper surface of the insulating film 107 so as to cover the driving electrode electrical interconnections 201, peripheral electrode electrical interconnection 202, and lower electrodes 103. The driving electrodes 101 for driving the mirror 230 of the mirror substrate 200 on the opposite side are formed on the upper surface of the insulating film 104. Each driving electrode 101 may have a fan shape obtained by dividing a circle concentric to the mirror 230 into four parts, as in the prior art. The driving electrodes 101 may be formed on the upper surface of a projecting portion provided on the upper surface of the substrate, as in the prior art. Alternatively, the driving electrodes 101 made of a metal material may be deposited thick to form a terraced projecting portion by the driving electrodes 101 themselves. The driving electrodes 101 are connected to the driving electrode electrical interconnections 201 via interlayer vertical electrical interconnections 108.

The peripheral electrode 102 is formed in the same layer as that of the driving electrodes 101 on the insulating film 104. The peripheral electrode 102 is provided to avoid exposure of the insulating film 104 which would cause drift of the mirror tilt angle. The peripheral electrode electrical interconnection 202 connected via an interlayer vertical electrical interconnection 109 supplies a predetermined potential to the peripheral electrode 102. The predetermined potential may be the same as that of the mirror 230, and is more preferably set to the ground potential.

The mirror substrate 200 and the electrode substrate 301 described above constitute the micromirror device shown in FIG. 1 by bonding the lower surface of the frame portion 210 to the upper surfaces of the convex portions 360*a* and 360*b* so that the mirror 230 faces the driving electrodes 101 corresponding to the mirror 230.

In the micromirror device shown in FIG. 1, the driving electrode electrical interconnections 201 and the peripheral electrode electrical interconnection 202 are formed in a layer different from the layer where the driving electrodes 101 and the peripheral electrode 102 are formed. However, they may be arranged in the same layer as that of the driving electrodes 101 and the peripheral electrode 102. However, to prevent electric fields generated by the driving electrode electrical interconnections 201 and the peripheral electrode electrical interconnection 202 from acting on driving of the mirror 230, the structure including the electrical interconnections led under the driving electrodes 101 and the peripheral electrode 102 is more preferable. Note that the driving electrode electrical interconnections 201 have larger influence on driving of the mirror 230 than the peripheral electrode electrical interconnection 202.

The mirror 230 of the micromirror device shown in FIG. 1 rotates due to an electrostatic attraction generated by the potential difference between the mirror 230 and the driving electrodes 101. For example, the mirror 230 is grounded. Predetermined positive voltages (driving voltages) are applied to the driving electrodes 101 via the driving electrode electrical interconnections 201 so as to attract the mirror 230 by an electrostatic attraction and rotate it in an arbitrary direction. To rotate the mirror 230 in a desired direction, driving voltages are separately applied to the four driving electrodes 101 to generate potential differences between them.

The mirror 230 stands still when the electrostatic attraction balances the restoring force of springs (the mirror connectors 221a and 221b and the gimbal connectors (not shown)) supporting the mirror 230. If the spring constants of the mirror connectors 221a and 221b and the gimbal connectors can be regarded constant, theoretically, the tilt angle of the mirror 230 is uniquely determined by applying predetermined driving voltages to the driving electrodes 101.

In the micromirror device that is an electrostatically driven MEMS device, the distance between the electrodes (the distance between the mirror 230 and the driving electrodes 101 here) to which the driving voltages are applied is generally several hundred μm to several μm. A voltage of several V to several hundred V is applied to this gap. For example, when a voltage of 100 V is applied to a device with an interelectrode distance of 10 μm, a high electric field of $10^5$ V/cm is generated. If an insulating film such as a dielectric film is arranged near the region where the high electric field is applied, the insulating film may be charged. This charging generates a new electric field, and the tilt angle of the mirror 230 varies over time due to the electric field formed by the charging. This phenomenon is called "drift", which poses a serious problem in using the electrostatically driven MEMS device.

The precise cause of charging of the insulating film is not yet determined. It is assumed that a charge trap center capable of accumulating charges is formed in the insulating film due to the influence of manufacturing process, and electric field application for driving the mirror causes carrier injection from the electrodes into the insulating film, and the charge trap center accumulates charges. In general, the insulating film is assumed to readily accumulate charges as the applied electric field becomes higher. Charge accumulation and charge emission are determined at random by the electric field applied to that portion. For this reason, the equilibrium state of charge accumulation and charge emission changes over time, and the field strength changes over time. As a result, the strength of the electric field formed between the mirror and the driving electrodes also changes over time. This is observed as drift of the mirror tilt angle.

Figure 2:
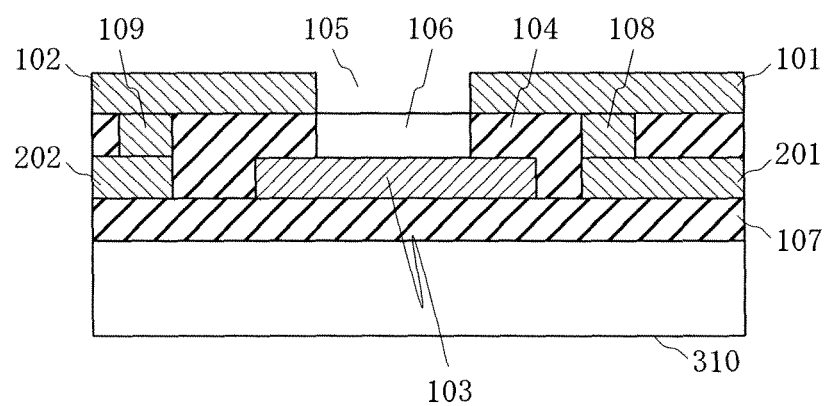
FIG. 2 is an enlarged sectional view of a portion including the driving electrode, peripheral electrode, and lower electrode of the micromirror device according to the first embodiment of the present invention.

Drift of the mirror tilt angle is caused by portions where the insulating film 104 is exposed in the region between the mirror substrate 200 and the electrode substrate 301 and, more particularly, the portions of gaps 105 between the driving electrodes 101 and the peripheral electrode 102 under the mirror 230. FIG. 2 is an enlarged sectional view of a portion indicated by the dotted line in FIG. 1, i.e., a portion including the driving electrode 101, peripheral electrode 102, and lower electrode 103. The insulating film 104 that is exposed at the portion of the gap 105, as shown in FIG. 2, will be referred to as a charge accumulation region 106. Note that although the charge accumulation region 106 is represented by a rectangle, for the descriptive convenience, the actual region boundary is not so clear as in FIG. 2.

For the mirror 230, accumulating charges in the charge accumulation region 106 amounts to an increase in the area of the driving electrodes 101. The strength of the electric field generated by charge accumulation in the charge accumulation region 106 is lower than that of the electric field generated by the driving electrodes 101. However, since the charge accumulation region 106 is placed immediately under the peripheral portion of the mirror 230, the charges in the charge accumulation region 106 give the mirror 230 the largest force to rotate (torque). Hence, the charges in the charge accumulation region 106 largely act on the variation in the tilt angle of the mirror 230.

It has been found that disposing the lower electrode 103 immediately under a portion of the charge accumulation region 106 close to the base portion reduces charge accumulation in the charge accumulation region 106 and thus reduces drift of the mirror tilt angle. The reason is assumed to be as follows.

When the lower electrode 103 is disposed under the gap 105 between the driving electrode 101 and the peripheral electrode 102, part of lines of electric force from the driving electrode 101 to the peripheral electrode 102 can be led into the lower electrode 103. More specifically, when the thickness of the charge accumulation region 106 immediately above the lower electrode 103 is smaller than the width of the gap 105 (the distance between the driving electrode 101 and the peripheral electrode 102), an electric field having a strength higher than that of the electric field formed between the driving electrode 101 and the peripheral electrode 102 is formed between the driving electrode 101 and the lower electrode 103.

Even when a high electric field is generated in the insulating film 104 under the driving electrode 101 or the peripheral electrode 102, and charges are accumulated in this portion, the electric field acting on the mirror 230 is not disturbed because the insulating film is located under the driving electrode 101 or the peripheral electrode 102, and is not exposed to the air. It is therefore possible to decrease the amount of charges accumulated in the charge accumulation region 106, and reduce the phenomenon that the tilt angle of the mirror 230 changes over time regardless of application of predetermined driving voltages to the driving electrodes 101, i.e., drift.

Figure 3:
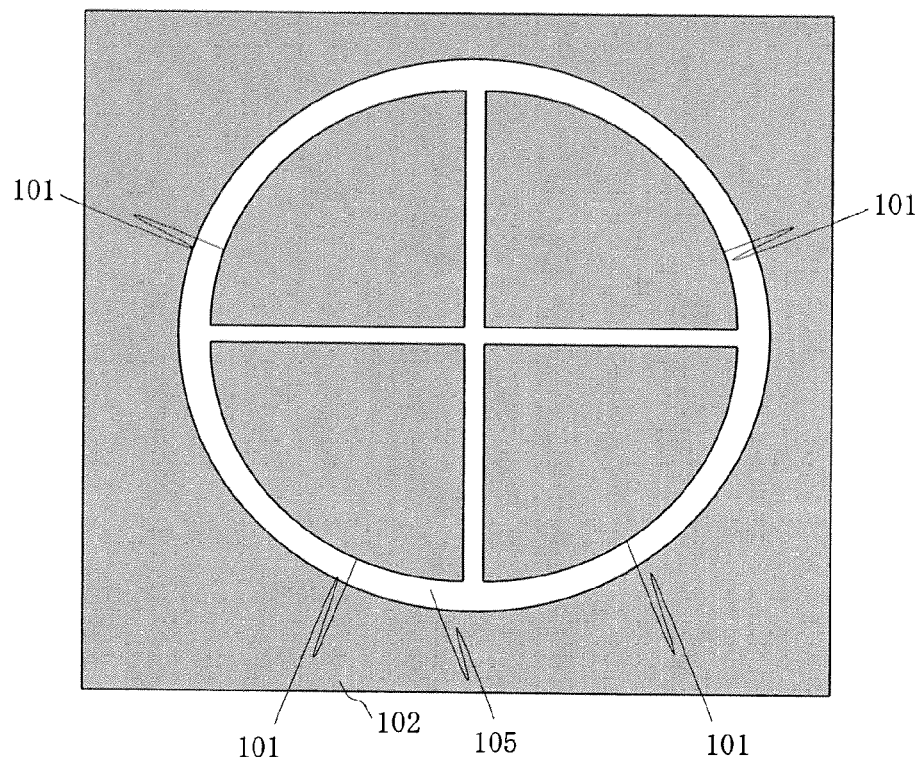
FIG. 3 is a plan view of a layer where the driving electrodes and the peripheral electrode are formed according to the first embodiment of the present invention.
Figure 4:
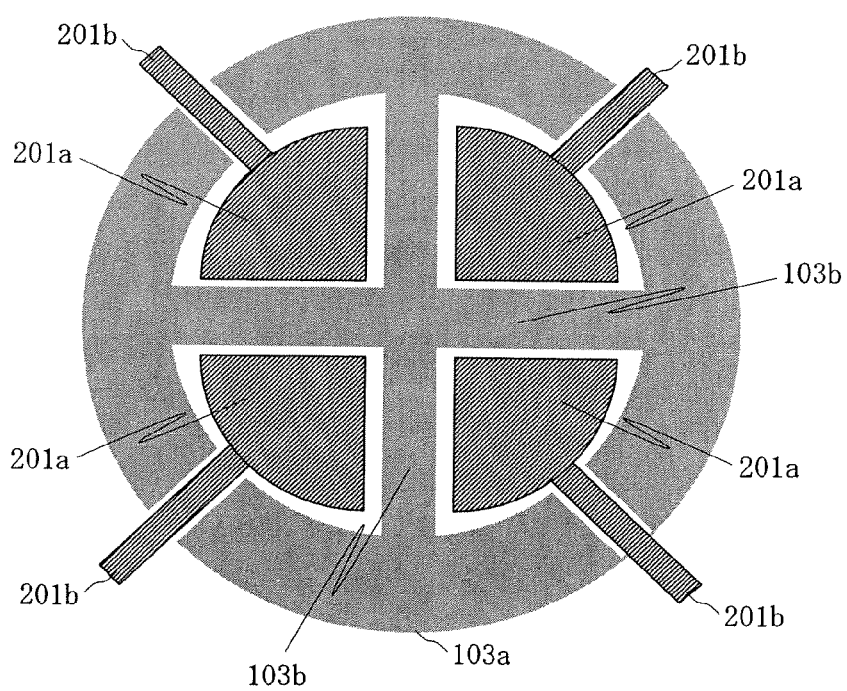
FIG. 4 is a plan view of a layer where the lower electrodes, driving electrode electrical interconnections, and a peripheral electrode electrical interconnection are formed according to the first embodiment of the present invention.
Figure 5:
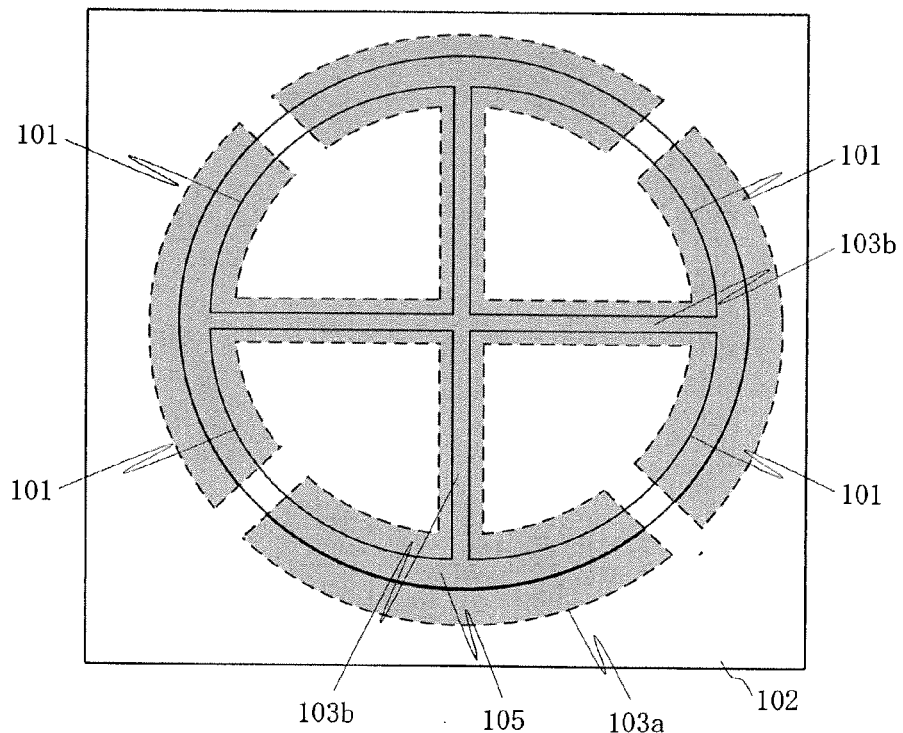
FIG. 5 is a plan view showing the lower electrodes seen through the driving electrodes and the peripheral electrode according to the first embodiment of the present invention.

The lower electrodes 103 are formed in the same layer as that of the driving electrode electrical interconnections 201 and the peripheral electrode electrical interconnection 202. FIG. 3 is a plan view of a layer where the driving electrodes 101 and the peripheral electrode 102 are formed. FIG. 4 is a plan view of a layer where the lower electrodes 103, driving electrode electrical interconnections 201, and peripheral electrode electrical interconnection 202 are formed. FIG. 5 is a plan view showing the lower electrodes 103 seen through the driving electrodes 101 and the peripheral electrode 102. The peripheral electrode electrical interconnection 202 is not illustrated in FIG. 4. The driving electrode electrical interconnections 201 and the peripheral electrode electrical interconnection 202 are not illustrated in FIG. 5 for easier understanding.

As shown in FIG. 4, the driving electrode electrical interconnections 201 include electrical interconnections 201a formed immediately under the driving electrodes 101, and electrical interconnections 201b that connect the electrical interconnections 201a to the bonding pads (not shown). Each driving electrode electrical interconnections 201a has a fan shape obtained by dividing a circle concentric to the mirror 230 on the opposite side into four parts, like the driving electrodes 101. However, each driving electrode electrical interconnection 201a has an area smaller than that of a corresponding driving electrode 101. The electrical interconnections 201*b* that connect the bonding pads (not shown) run from the driving electrode electrical interconnections 201*a*.

The lower electrodes 103 include an electrode 103*a* formed around the driving electrode electrical interconnections 201*a*, and an electrode 103*b* formed between the driving electrode electrical interconnections 201*a*. The lower electrode 103*a* is formed into an annular shape concentric to the mirror 230 in a region outside the four fan-shaped driving electrode electrical interconnections 201*a* without coming into contact with their outer edges. However, the lower electrode 103*a* is not formed in the regions of the electrical interconnections 201*b*. The lower electrode 103*b* is formed into a cross shape in the cross-shaped region sandwiched between the four fan-shaped driving electrode electrical interconnections 201*a* without coming into contact with them.

The lower electrode 103*a* is formed in the region on which the rotating force (torque) for driving the mirror 230 most largely acts. Hence, disposition of the lower electrode 103*a* is important. On the other hand, the lower electrode 103*b* is formed in a region on which the rotating force for driving the mirror 230 does not so largely act, as compared to the lower electrode 103*a*. Hence, the lower electrode 103*b* need not always be formed. However, the lower electrode 103*b* can contribute to further reduce drift of the mirror tilt angle.

The potential to be applied to the lower electrodes 103*a* and 103*b* may be the same as that of the driving electrodes 101 or that of the peripheral electrode 102. The lower electrodes 103*a* and 103*b* may be controlled to a potential different from that of the driving electrodes 101 or the peripheral electrode 102. Most preferably, the peripheral electrode 102 and the mirror 230 are set at the ground potential, and the lower electrodes 103*a* and 103*b* are also set at the ground potential so as to stabilize the potential of the entire micromirror device.

Each driving electrode 101 has a fan shape obtained by dividing a circle concentric to the mirror 230 on the opposite side into four parts. The total area of the four fan-shaped driving electrodes 101 is larger than the total area of the four fan-shaped driving electrode electrical interconnections 201*a* and smaller than the area of the mirror 230. The area of the driving electrodes 101 is made smaller than that of the mirror 230 to avoid a "pull-in" phenomenon in which the electrostatic attraction exceeds the restoring force of the springs so that the posture of the mirror 230 becomes uncontrollable, and the peripheral portion of the mirror 230 collides against the driving electrodes 101 and sticks.

As shown in FIG. 3, the peripheral electrode 102 is formed in the region outside the four fan-shaped driving electrodes 101 into such a shape that prevents excess exposure of the insulating film 104 without coming into contact with the outer edges of the driving electrodes 101. The region between the driving electrodes 101 and the peripheral electrode 102 is the gap 105 that prevents an electrical short circuit between the electrodes 101 and 102.

The electrode structure of the micromirror device according to this embodiment is observed from the upper surface (the surface on the side where the mirror substrate is arranged). As shown in FIG. 5, the lower electrodes 103 are formed in the region under the gap 105, the regions under the periphery of the driving electrodes 101, and the region under the inner edge of the peripheral electrode 102. The charge accumulation region 106 (insulating film 104) is exposed at the portion of the gap 105. However, since the lower electrodes 103 exist under the charge accumulation region 106, the influence of charging of the charge accumulation region 106 can be reduced. It is consequently possible to reduce drift of the tilt angle of the mirror 230.

Note that as shown in FIG. 5, the lower electrode 103 is preferably wider than the gap 105. More specifically, one end of the lower electrode 103 needs to be arranged under the driving electrodes 101, and the other end of the lower electrode 103 needs to be arranged under the peripheral electrode 102, as is apparent from FIG. 2. This structure allows the lower electrode 103 to cover the lower portion of the charge accumulation region 106 where the insulating film 104 is exposed so that further drift reduction can be expected.

Figure 6:
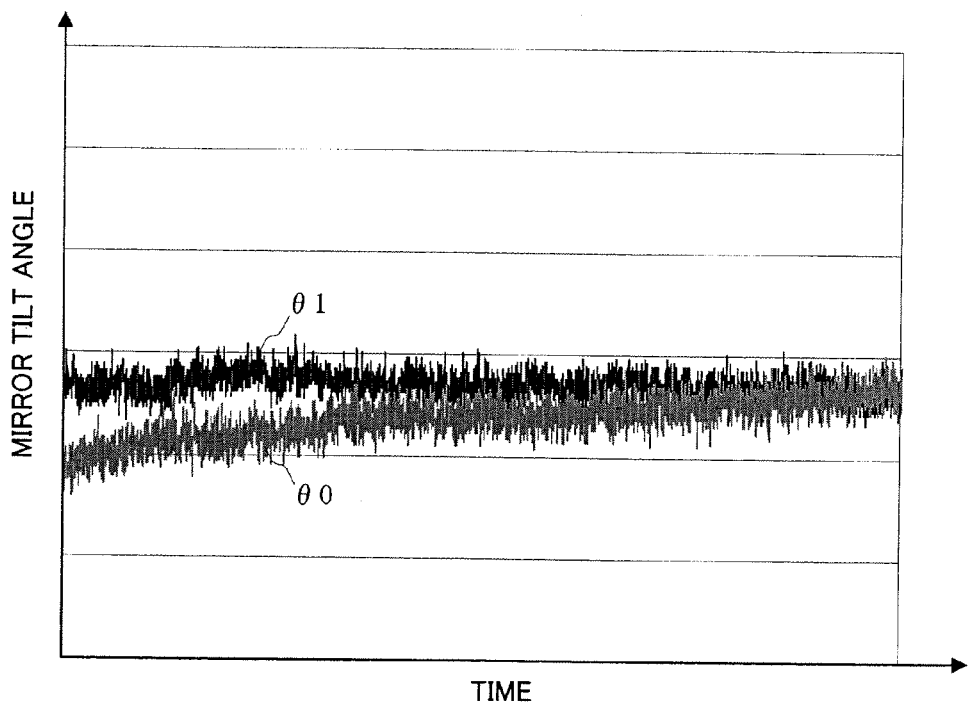
FIG. 6 is a graph showing results obtained by measuring the time-rate changes of the mirror tilt angles of the micromirror device according to the first embodiment of the present invention and a conventional micromirror device.

FIG. 6 shows a result obtained by measuring the time-rate change of the tilt angle of the mirror 230 using an actually manufactured micromirror device having the structure shown in FIGS. 1 to 5 by applying the ground potential to the mirror 230, peripheral electrode 102, and lower electrodes 103 and predetermined driving voltages to the driving electrodes 101. The abscissa represents the elapsed time (1 hr in full range), and the ordinate represents the mirror tilt angle in an arbitrary scale. θ0 represents the result of a conventional micromirror device without the lower electrodes 103, and θ1 represents the result of the micromirror device of this embodiment.

In the conventional micromirror device, even when the voltages applied to the driving electrodes are constant, the mirror tilt angle gradually changes (increases). On the other hand, in the micromirror device of this embodiment, the tilt angle of the mirror 230 does not change over time as far as the voltages applied to the driving electrodes 101 are constant. That is, this proves that drift can be reduced.

A method of manufacturing the micromirror device according to this embodiment will be described below. Note that the present invention is not limited to the following manufacturing method, and only a description of a typical manufacturing method will be described below.

A method of manufacturing the mirror substrate 200 will be described first. The mirror substrate 200 is prepared using a SOI (Silicon On Insulator) substrate. Using a SOI substrate as a starting substrate, the gimbal 220, mirror 230, gimbal connectors, and mirror connectors 221*a* and 221*b* are formed on the SOI layer by a known lithography technique.

First, a photosensitive resist is applied to the SOI layer in a desired thickness by spin coating. A reticle (mask) having a light-shielding body in a shape conforming to a pattern is aligned with the substrate having the photosensitive resist and held. The reticle is irradiated with light having the photosensitive wavelength of the photosensitive resist so as to form an image corresponding to the silhouette of the light-shielding body on the wafer with the photosensitive resist. The irradiation is performed after determining the light irradiation time for obtaining a desired pattern in a desired size. The resist with a latent image formed is immersed in a developer. After determining the time of immersing the wafer with resist in the developer so as to form a desired pattern in a desired size, the wafer is immersed in the developer for the determined time. After that, the entire wafer is dried to harden the resist. A resist pattern is formed on the SOI substrate thus far.

Using the formed resist as a mask, the frame portion 210, gimbal 220, mirror 230, gimbal connectors, mirror connectors 221*a* and 221*b*, and the like are formed on the SOI layer by DRIE (Deep Reactive Ion Etching) that is a deep engraving technique for silicon. At this time, an etching intermediate film may be used. Alternatively, the silicon may directly be processed using the resist as an etching mask. After etching the silicon, the photosensitive resist used as a mask is removed. After removal, the wafer is cleaned to expose a clean silicon surface.

Then, the base substrate is processed. First, a protective organic film is applied to the SOI surface side. A photosensitive resist or a film of, e.g., polyimide having known workability may be used. Since this film needs to be removed finally, a film having high strippability and removability is preferably used. After forming the protective film on the SOI surface, a photosensitive resist film is applied to the base substrate. When applying the photosensitive resist, the SOI surface side comes into contact with the sample table of the coater. However, since the protective film is deposited, there is no damage to the structure formed on the SOI surface.

After applying the photosensitive resist, a reticle (mask) having a light-shielding body in a shape conforming to a desired pattern is aligned with the substrate having the photosensitive resist and, more particularly, with the structure on the SOI surface and held. The reticle is irradiated with light having the photosensitive wavelength of the photosensitive resist so as to form an image corresponding to the silhouette of the light-shielding body on the wafer with the photosensitive resist. The irradiation is performed after determining the light irradiation time for obtaining a desired pattern in a desired size. The resist with a latent image formed is immersed in a developer. After determining the time of immersing the wafer with resist in the developer so as to form a desired pattern in a desired size, the wafer is immersed in the developer for the determined time. After that, the entire wafer is dried to harden the resist. A resist pattern is formed on the base substrate thus far.

Using the formed resist as a mask, the silicon of the unnecessary base substrate where the mirror is formed on the SOI layer is removed by DRIE that is a deep engraving technique for silicon. At this time, an etching intermediate film such as a silicon oxide film may be used. Alternatively, the silicon may directly be processed using the resist as an etching mask. After etching the silicon, the photosensitive resist used as a mask is removed. After removal, the wafer is cleaned to expose a clean silicon surface. Then, a silicon oxide film that forms a BOX (Buried Oxide) layer is removed by etching.

Then, the organic film that protects the SOI layer pattern is removed by etching, thereby forming a movable structure. When a plurality of chips are formed on the wafer, a process called dicing is performed to cut the wafer and separate the chips. After that, the protective film on the SOI layer is removed by etching. Generally, a plurality of chips are formed on a wafer, as in the latter case.

After the mirror chip is formed in the above-described way, a metal is deposited only on the mirror surface of the mirror substrate 200 and desired places of the bonding interface using a stencil mask. To use the micromirror device as a device for communication, a metal such as gold or aluminum is deposited to increase the reflectance of infrared rays to be used. When the structure surface is made of silicon, an adhesion improving layer of, e.g., titanium or chromium is sometimes used to improve the adhesion of the deposited gold or aluminum to the silicon. Before dicing, a metal pattern may be formed on the mirror by a known lithography technique. The mirror substrate 200 having the rotatable mirror 230 is in the above-described way.

A method of manufacturing the electrode substrate 301 will be described next. First, a thermal oxide film is formed on the surface of the substrate as the base. A metal sputtering film is deposited on the surface of the thermal oxide film, and used as the seed layer of the succeeding plating process. Then, a resist is applied to form a resist pattern necessary for forming the driving electrode electrical interconnections 201, peripheral electrode electrical interconnection 202, and lower electrodes 103 by a known lithography technique. A metal such as gold is grown by plating using the resist pattern as a mask.

After forming the driving electrode electrical interconnections 201, peripheral electrode electrical interconnection 202, and lower electrodes 103, the resist used as a mask is stripped. After cleaning, for example, a silicon oxide film is deposited as the insulating film 104 by CVD (Chemical Vapor Deposition) or the like. A known lithography technique and etching technique are applied to the insulating film 104 to form the interlayer vertical electrical interconnections 108 and 109. Then, the driving electrodes 101 and the peripheral electrode 102 are formed by a plating process. The convex portions 360a and 360b are formed on the peripheral electrode 102 to form a gap between the mirror 230 and the driving electrodes 101. The seed layer of an unnecessary portion is removed as needed by an etching process. The electrode substrate 301 is formed in the above-described way.

Finally, the mirror substrate 200 and the electrode substrate 301 are aligned with each other. The upper surfaces of the convex portions 360a and 360b of the electrode substrate 301 are soldered. The solder is melted at 390° C. to bond the mirror substrate 200 to the electrode substrate 301. The bonding need not always be done using solder. It may be bonding using Ag paste, ultrasonic bonding using Au—Au, or eutectic bonding using AuSn. The micromirror device is thus completed.

In the micromirror device according to this embodiment, gold (Au) is used as the material of the driving electrode electrical interconnections 201, peripheral electrode electrical interconnection 202, driving electrodes 101, peripheral electrode 102, and lower electrodes 103. However, the present invention is not limited to this. As the material of these electrodes, aluminum (Al), tungsten (W), tantalum (Ta), titanium (Ti), copper (Cu), tin (Sn), silver (Ag), or a compound thereof is usable. A semiconductor may be used for the lower electrodes 103.

[Second Embodiment]

Figure 7:
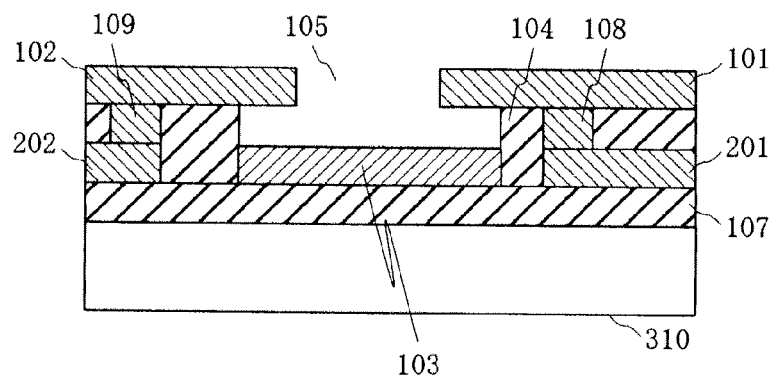
FIG. 7 is an enlarged sectional view of a portion including the driving electrode, peripheral electrode, and lower electrode of a micromirror device according to the second embodiment of the present invention.

FIG. 7 is a sectional view of a micromirror device that is an electrostatically driven MEMS device according to the second embodiment of the present invention. FIG. 7 is an enlarged sectional view of a region indicated by the dotted line in FIG. 1. Note that a mirror array is formed by one- or two-dimensionally disposing a plurality of micromirror devices shown in FIG. 7.

In this embodiment, the insulating film 104 serving as a charge accumulation region exposed to the region of the gap 105 in the micromirror device according to the first embodiment is partially or wholly removed. The remaining components are the same as in the first embodiment.

In the micromirror device according to the second embodiment, an insulating film 104 under the region of a gap 105 is removed to expose a lower electrode 103 to the space. This structure can further reduce the area of the insulating film 104 exposed to the space. It is therefore possible to reduce drift of the mirror tilt angle more effectively than in the first embodiment. Note that the insulating film 104 may partially remain on the lower electrode 103.

In the micromirror device according to this embodiment as well, the characteristic shown in FIG. 6 was obtained by experiments (the result is not illustrated). More specifically, in the micromirror device having the conventional structure in which no lower electrodes is used, and the insulating film 104 (charge accumulation region 106) exposed to the space is not removed, even when the voltages applied to the driving electrodes are constant, the tilt angle of the mirror 230 gradually changes (increases). On the other hand, in the micromirror device of this embodiment, the tilt angle of the mirror 230 does not change over time as far as the voltages applied to driving electrodes 101 are constant. That is, this proves that drift can be reduced.

[Third Embodiment]

Figure 8:
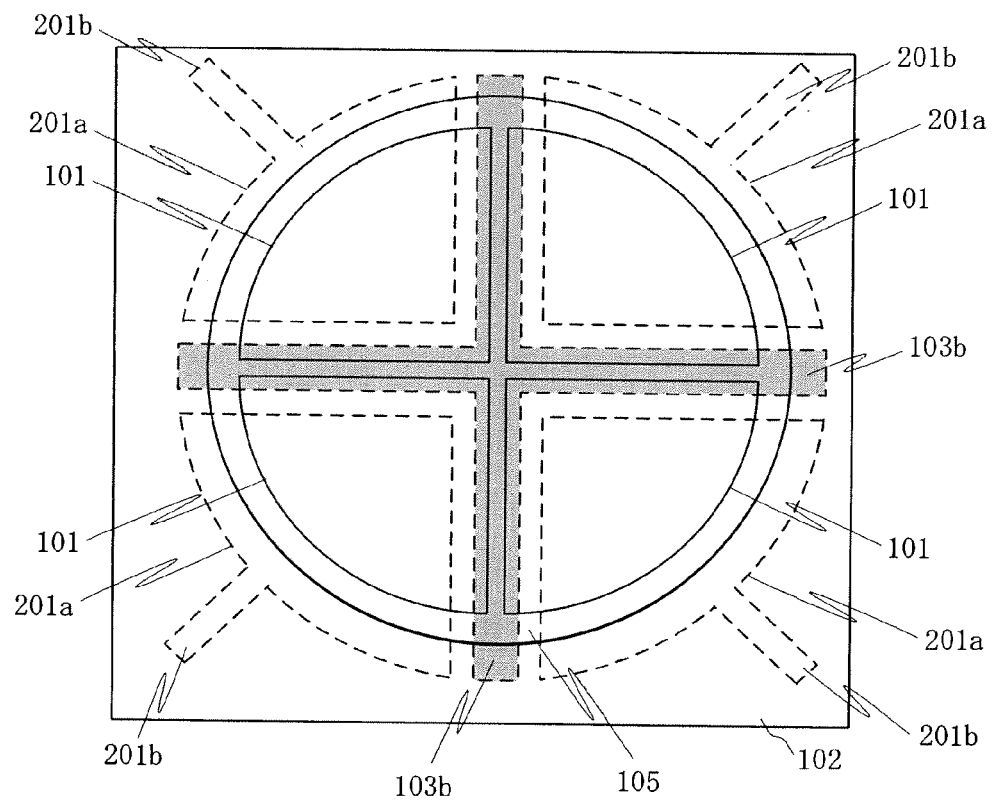
FIG. 8 is a plan view showing the electrode arrangement of a micromirror device according to the third embodiment of the present invention.

FIG. 8 is a plan view showing the electrode arrangement of a micromirror device according to the third embodiment of the present invention. This plan view illustrates underlying lower electrodes 103 and driving electrode electrical interconnections 201 seen through driving electrodes 101 and a peripheral electrode 102. A peripheral electrode electrical interconnection 202 is not illustrated in FIG. 8.

In the first embodiment, the lower electrodes 103 include the annular lower electrode 103a and the cross-shaped lower electrode 103b. In the third embodiment, a lower electrode 103a is omitted, and only a lower electrode 103a is formed. In addition, the area of driving electrode electrical interconnections 201a, which is smaller than that of the driving electrodes 101 in the first embodiment, is increased so that the driving electrode electrical interconnections 201a extend up to the region where the lower electrode 103a existed. The lower electrode 103b is formed into a cross shape in the cross-shaped region sandwiched between the four fan-shaped driving electrode electrical interconnections 201a without coming into contact with them.

As described in the first embodiment, the lower electrodes 103a and 103b are preferably set at the ground potential. However, when the lower electrode 103a is set at the ground potential, the action of decreasing the rotating force (torque) for driving a mirror 230 becomes large. For this reason, the driving voltages to be applied to the driving electrodes 101 need to be raised by the decrease of the rotating force. In this embodiment, to avoid this problem, the lower electrode 103a is omitted, and only the lower electrode 103b is formed. The lower electrode 103b does not so largely act on the rotating force for driving the mirror 230, as compared to the lower electrode 103a. Hence, even when the lower electrode 103b is set at the ground potential, the rotating force does not so largely decrease.

[Fourth Embodiment]

Figure 9:
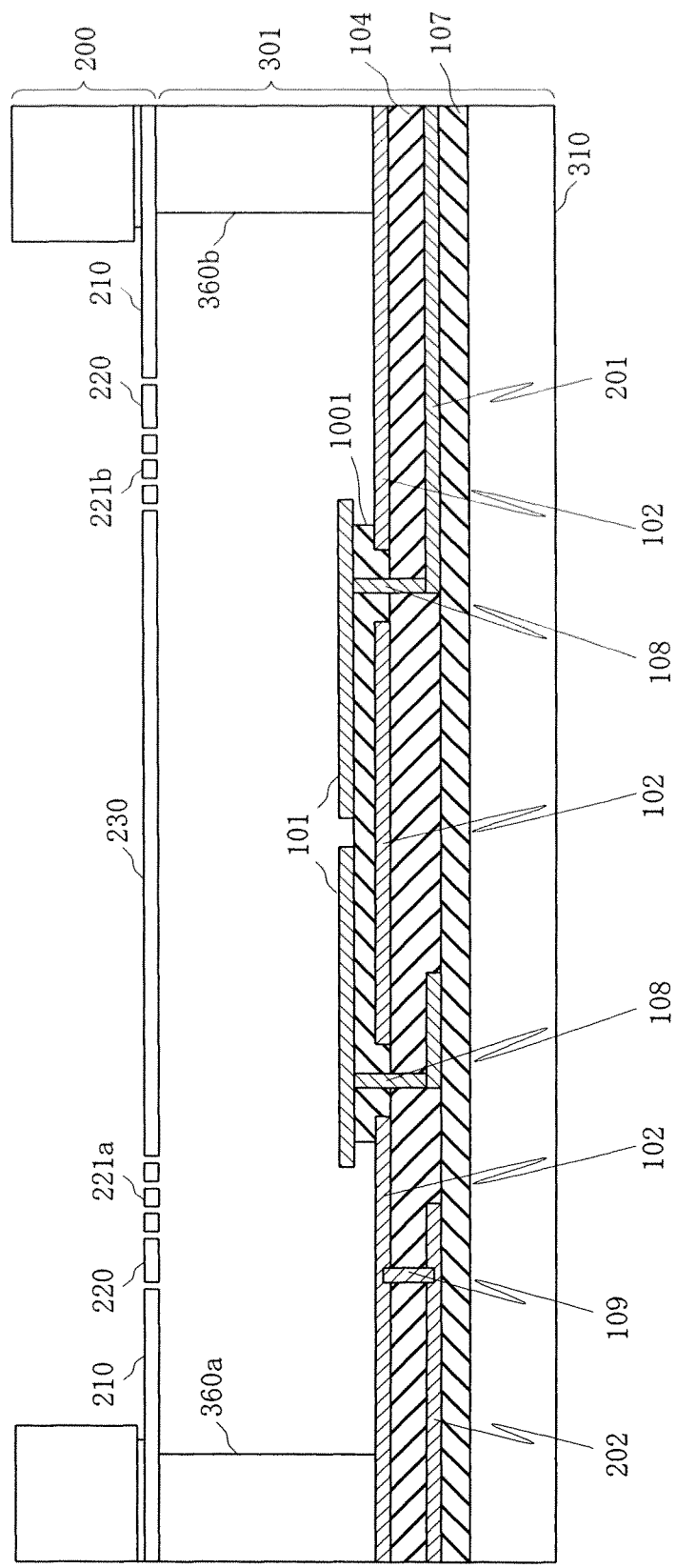
FIG. 9 is a sectional view showing the arrangement of a micromirror device according to the fourth embodiment of the present invention.

The fourth embodiment of the present invention will be described next. FIG. 9 is a sectional view of a micromirror device that is an electrostatically driven MEMS device according to the fourth embodiment of the present invention. Note that a mirror array is formed by one- or two-dimensionally disposing a plurality of micromirror devices shown in FIG. 9. The micromirror device according to this embodiment has a structure in which a mirror substrate 200 serving as a first substrate having a mirror and an electrode substrate 301 serving as a second substrate having electrodes are disposed in parallel.

Figure 61:
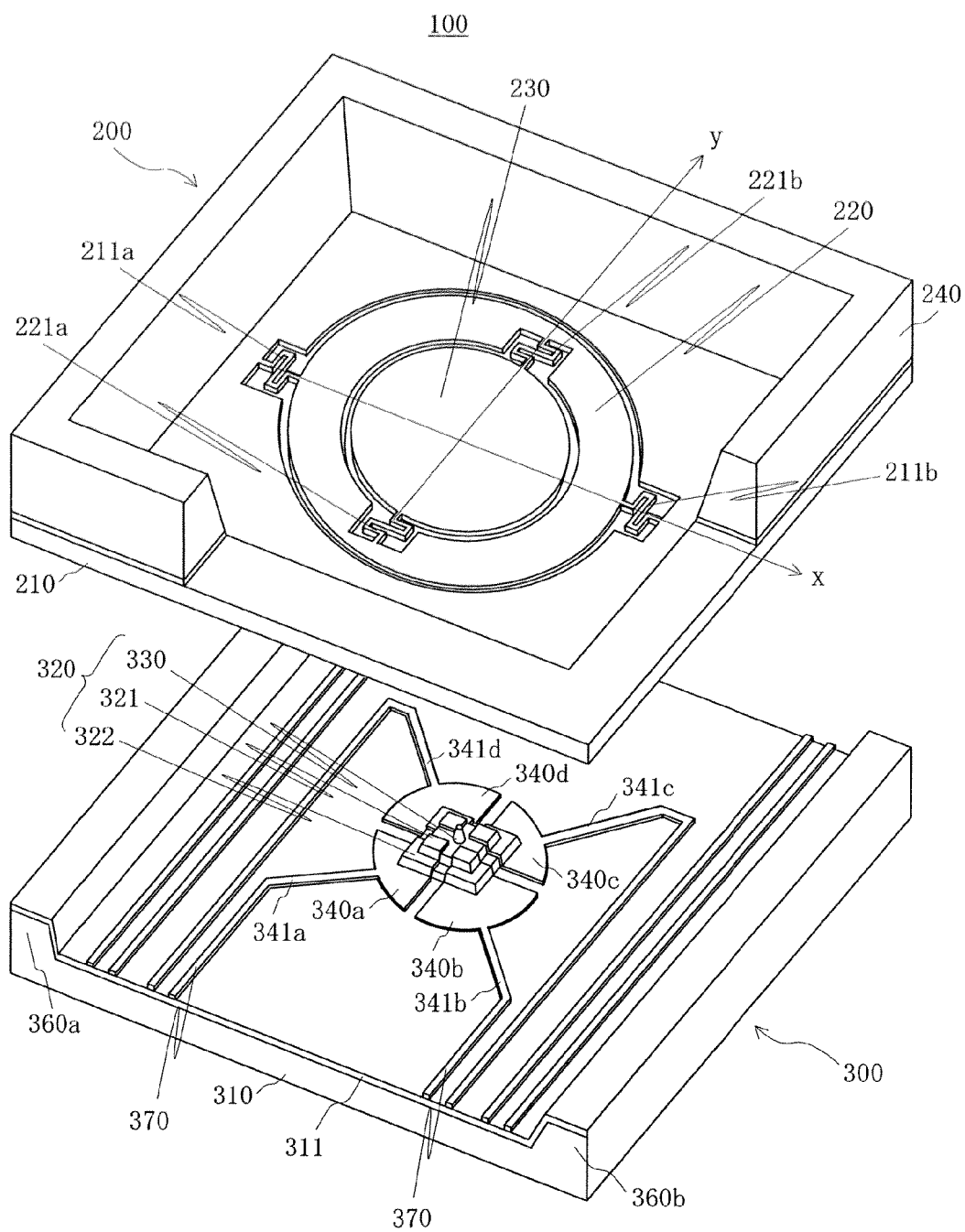
FIG. 61 is an exploded perspective view showing the arrangement of a conventional micromirror device.
Figure 62:
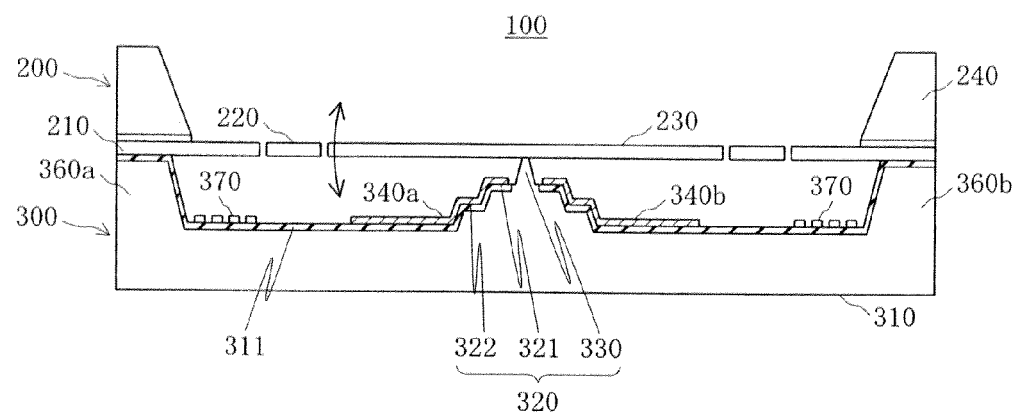
FIG. 62 is a sectional view of the micromirror device shown FIG. 61.

The mirror substrate 200 has almost the same structure as that of the mirror substrate of the conventional micromirror device shown in FIGS. 61 and 62, and is preferably formed using a SOI (Silicon On Insulator) substrate. The mirror substrate 200 includes a plate-shaped frame portion 210 having an opening with an almost circular shape viewed from above, a gimbal 220 having an opening with an almost circular shape viewed from above and disposed in the opening of the frame portion 210 via a pair of gimbal connectors (not shown), and a mirror 230 serving as a movable member having an almost circular shape viewed from above and disposed in the opening of the gimbal 220 via a pair of mirror connectors 221a and 221b. The gimbal 220 can rotate about a gimbal rotation axis which passes through the pair of gimbal connectors (not shown). Similarly, the mirror 230 can rotate about a mirror rotation axis which passes through the pair of mirror connectors 221a and 221b. The gimbal rotation axis and the mirror rotation axis are perpendicular to each other. As a result, the mirror 230 rotates about the two axes perpendicular to each other.

The electrode substrate 301 includes a plate-shaped base portion 310 made of, for example, single-crystal silicon, and convex portions 360a and 360b projecting from the surface (upper surface) of the base portion 310 to be bonded to the mirror substrate 200 on the opposite side. An insulating film 107 is formed on the surface of the electrode substrate 301 where the convex portions 360a and 360b are provided. The insulating film 107 has a function of preventing driving electrode electrical interconnections 201 and a peripheral electrode electrical interconnection 202 (to be described later) from making an electrical short circuit via the base portion 310 made of a semiconductor such as silicon.

When a silicon substrate is used as the electrode substrate 301, a silicon oxide film is generally used as the insulating film 107. An unprocessed bare silicon substrate is cleaned as needed to make its surface clean, and then thermally oxidized in a thermal oxidation furnace, thereby forming the insulating film 107. A thermal oxide film formed by thermal oxidation out of silicon oxide film forming methods is known to be superior in quality and dielectric breakdown voltage characteristic to, e.g., a silicon oxide film deposited using CVD (Chemical Vapor Deposition) or the like.

The driving electrode electrical interconnections 201 which supply voltages to driving electrodes 101 and the peripheral electrode electrical interconnection 202 which supplies a predetermined potential to a peripheral electrode 102 are formed on the upper surface of the insulating film 107. The driving electrode electrical interconnections 201 and the peripheral electrode electrical interconnection 202 are formed on the same layer of the electrode substrate 301. Hence, they can be formed simultaneously. In other words, they cannot cross each other. For this reason, electrical interconnection leading needs a contrivance. The driving electrode electrical interconnections 201 and the peripheral electrode electrical interconnection 202 are connected, via bonding pads (not shown), to predetermined pins of a package that packages the micromirror device or the mirror array. When a predetermined DC voltage is applied to a pin of the package, the voltage is applied to the driving electrode 101 in a one-to-one correspondence with that pin so that the mirror 230 can rotate. To form the driving electrode electrical interconnections 201 and the peripheral electrode electrical interconnection 202, for example, a metal thin film on the insulating film 107 is processed by a known etching technique.

In addition, an insulating film 104 made of a dielectric is formed on the upper surface of the insulating film 107 so as to cover the driving electrode electrical interconnections 201 and the peripheral electrode electrical interconnection 202. The peripheral electrode 102 is formed on the upper surface of the insulating film 104 so that the insulating film 104 such as a silicon oxide film is not exposed to the surface of the electrode substrate 301 when viewed from the side of the mirror 230 of the mirror substrate 200 on the opposite side. To form the peripheral electrode 102, for example, a metal thin film on the insulating film 104 is processed by a known etching technique.

An insulating film 1001 made of a dielectric is formed on the upper surface of the peripheral electrode 102 so as to partially cover the peripheral electrode 102. The driving electrodes 101 for driving the mirror 230 of the mirror substrate 200 on the opposite side are formed on the upper surface of the insulating film 1001. When viewed from the side of the mirror 230 of the mirror substrate 200 on the opposite side, the insulating film 1001 is almost covered with the driving electrodes 101 and invisible from the side of the mirror 230 except part thereof. More preferably, the insulating film 1001 under the peripheral portions of the driving electrodes 101 is removed, as shown in FIG. 9.

The driving electrodes 101 are connected to the driving electrode electrical interconnections 201 via interlayer vertical electrical interconnections 108 that extend through the insulating films 104 and 1001. The peripheral electrode 102 is connected to the peripheral electrode electrical interconnection 202 via an interlayer vertical electrical interconnection 109 that extends through the insulating film 104. Note that the vertical holes formed for the interlayer vertical electrical interconnections are sometimes referred to as via holes, and interlayer vertical electrical interconnections formed by filling the vertical holes with a metal are sometimes referred to as vias.

The mirror substrate 200 and the electrode substrate 301 described above constitute the micromirror device shown in FIG. 9 by bonding the lower surface of the frame portion 210 to the upper surfaces of the convex portions 360a and 360b so that the mirror 230 faces the driving electrodes 101 corresponding to the mirror 230.

As described above, the peripheral electrode 102 serving as a driving stabilization electrode is formed in a layer (to be referred to as a second conductive layer hereinafter) between a driving electrode layer (to be referred to as a first conductive layer hereinafter) where the driving electrodes 101 are provided and an electrode electrical interconnection layer (to be referred to as a third conductive layer hereinafter) where the driving electrode electrical interconnections 201 and the peripheral electrode electrical interconnection 202 are provided, and has a function of avoiding exposure of the insulating film 107 or 104 which causes drift of the mirror tilt angle. The driving electrodes 101 have a function of driving the mirror 230 and a function of avoiding exposure of the insulating film 1001 which causes drift of the mirror tilt angle.

In this embodiment, when the electrode substrate 301 is viewed from the side of the mirror 230, the dielectric that causes drift of the mirror tilt angle is rarely exposed. For this reason, even when the insulating films 104, 107, and 1001 are charged, the charging does not influence the electric fields formed between the mirror 230 and the driving electrodes 101. It is therefore possible to suppress drift of the mirror tilt angle. Additionally, in this embodiment, the driving electrode electrical interconnections 201 and the peripheral electrode electrical interconnection 202 are provided in the layer under the peripheral electrode 102. Hence, the electric fields emitted from the electrical interconnections 201 and 202 do not influence the electric fields formed between the mirror 230 and the driving electrodes 101, and the mirror tilt angle can more accurately be controlled.

Figure 10:
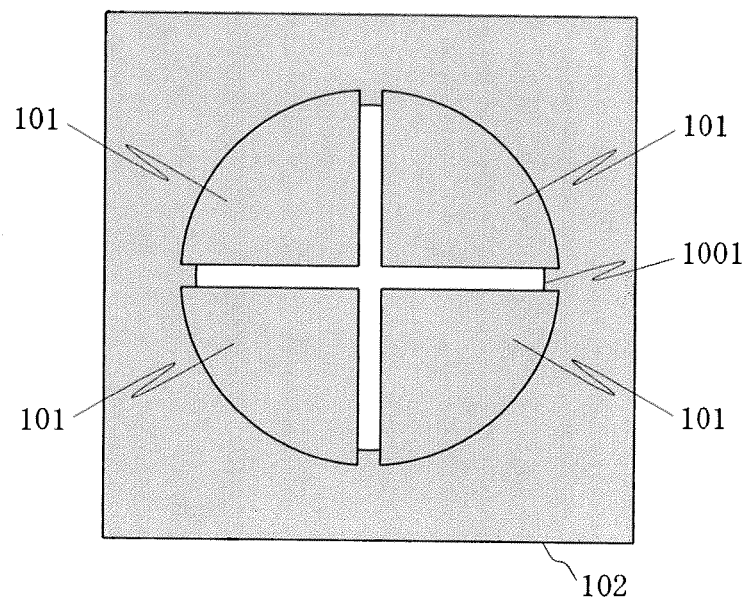
FIG. 10 is a plan view showing the driving electrodes viewed from above according to the fourth embodiment of the present invention.
Figure 11:
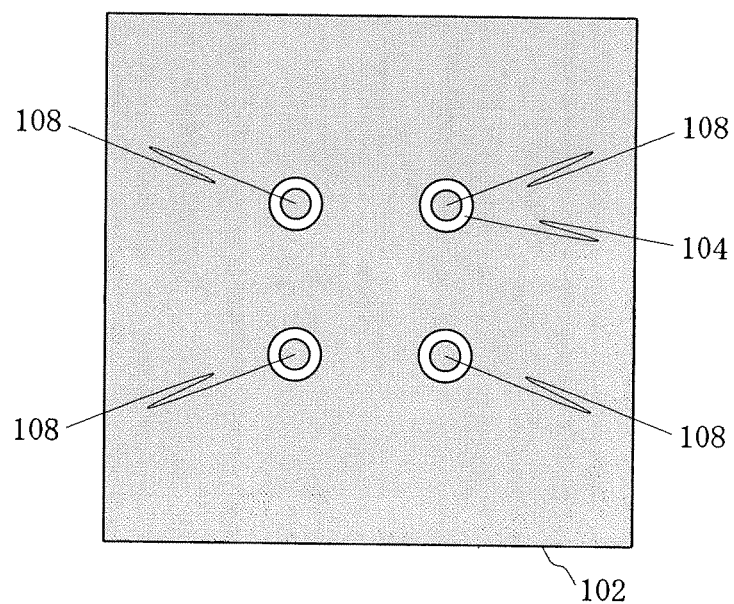
FIG. 11 is a plan view of a second conductive layer where a peripheral electrode is formed according to the fourth embodiment of the present invention.
Figure 12:
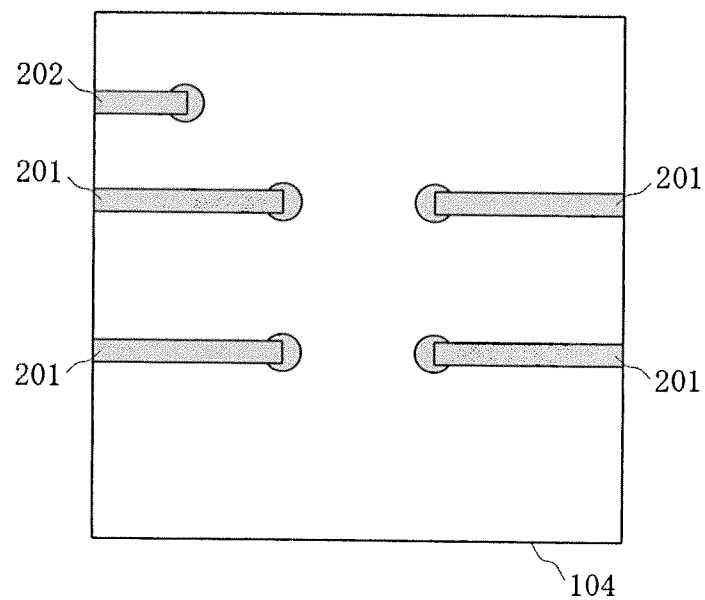
FIG. 12 is a plan view of a third conductive layer where driving electrode electrical interconnections and a peripheral electrode electrical interconnection are formed according to the fourth embodiment of the present invention.
Figure 13:
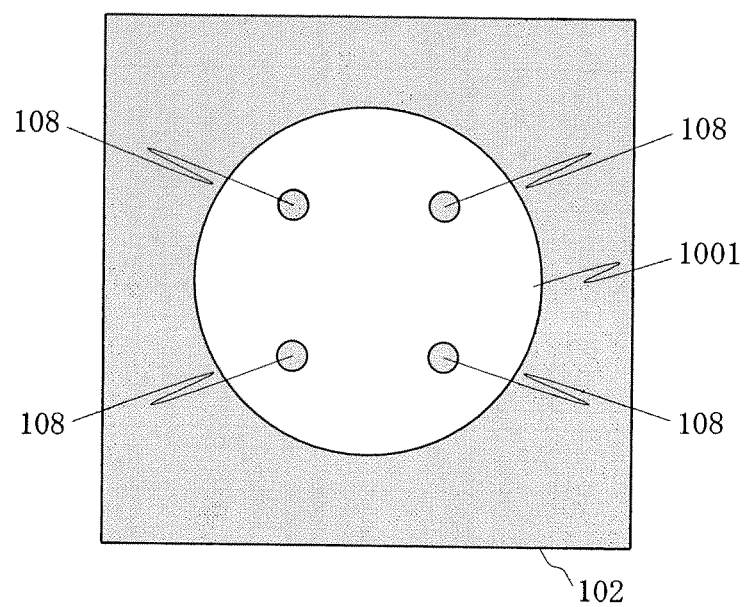
FIG. 13 is a plan view of a layer where an insulating film between a first conductive layer and the second conductive layer is formed according to the fourth embodiment of the present invention.
Figure 14:
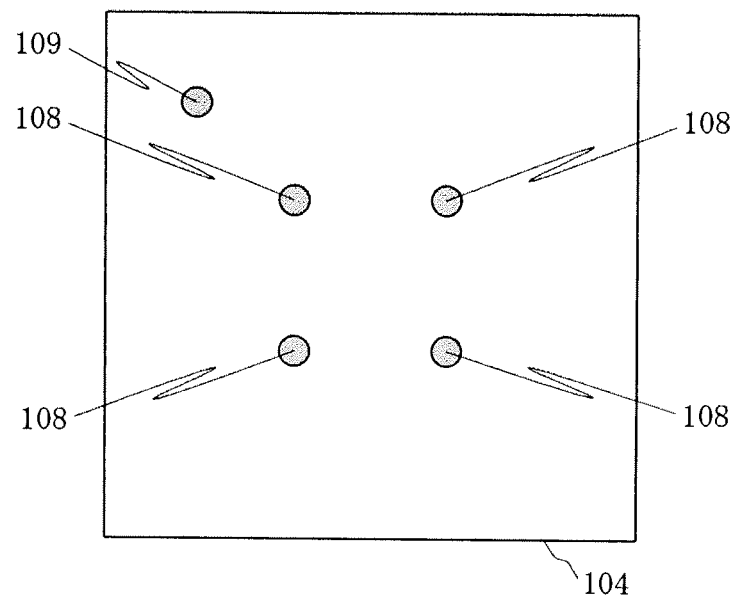
FIG. 14 is a plan view of a layer where an insulating film between the second conductive layer and the third conductive layer is formed according to the fourth embodiment of the present invention.
Figure 15:
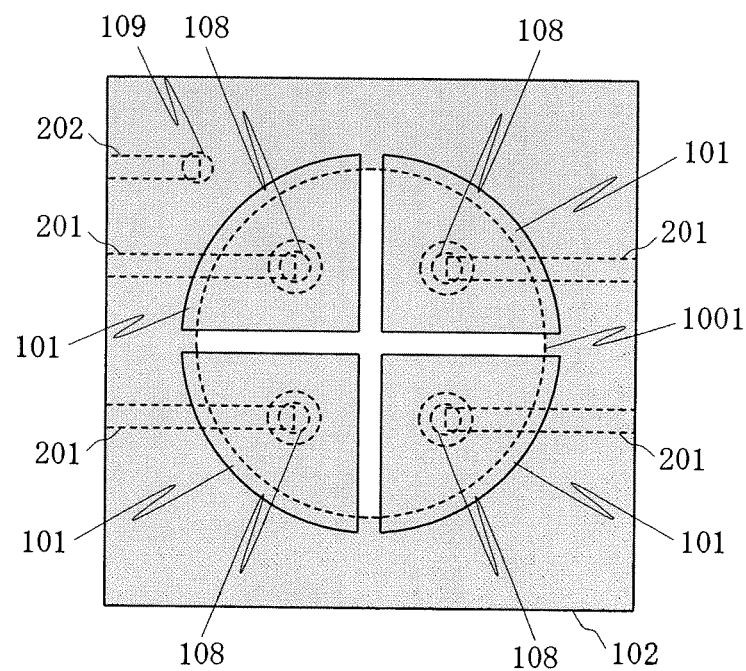
FIG. 15 is a plan view seen through the driving electrodes and layers under them according to the fourth embodiment of the present invention.

FIG. 10 is a plan view showing the driving electrodes viewed from above. FIG. 11 is a plan view of the second conductive layer where the peripheral electrode 102 is formed. FIG. 12 is a plan view of the third conductive layer where the driving electrode electrical interconnections 201 and the peripheral electrode electrical interconnection 202 are formed. FIG. 13 is a plan view of the layer where the insulating film 1001 is formed. FIG. 14 is a plan view of the layer where the insulating film 104 is formed. FIG. 15 is a plan view seen through the driving electrodes 101 and layers under them.

As shown in FIG. 11, the peripheral electrode 102 is preferably formed to almost completely cover the upper surface of the electrode substrate 301. This structure allows to extremely reduce exposure of the insulating film 104.

To provide the interlayer vertical electrical interconnections 108, gaps for insulation need to be formed between the interlayer vertical electrical interconnections 108 and the peripheral electrode 102. Hence, the insulating film 104 is exposed near the interlayer vertical electrical interconnections 108 in the level of the second conductive layer shown in FIG. 11. However, the interlayer vertical electrical interconnections 108 are provided immediately under the driving electrodes 101. For this reason, even when the insulating film 104 is exposed in the level of the second conductive layer, the insulating film 104 is covered with the driving electrodes 101 and not exposed when the electrode substrate 301 is viewed from the side of the mirror 230. Hence, the insulating film 104 exposed from the peripheral electrode 102 never induces drift of the mirror tilt angle.

The structure of the micromirror device according to this embodiment has been described above with reference to FIG. 9. However, the present invention is not limited to the above-described structure, and various changes and modifications can be made without departing from spirit and scope of the present invention. Various application examples of the micromirror device will be described below.

Each driving electrode 101 may have a fan shape obtained by dividing a circle concentric to the mirror 230 into four parts, as in the conventional micromirror device shown in FIGS. 61 and 62. The driving electrodes 101 may be formed on the upper surface of a projecting portion provided on the upper surface of the base portion 310, as in the prior art.

In the above description, the peripheral electrode 102 is preferably formed to almost completely cover the upper surface of the electrode substrate 301. However, the peripheral electrode 102 may be omitted at portions that rarely influence drift of the mirror 230. For example, the peripheral electrode 102 need not always exist at portions near the convex portions 360a and 360b and far apart from the mirror 230.

The peripheral electrode 102 receives a predetermined potential supplied from the peripheral electrode electrical interconnection 202 connected via the interlayer vertical electrical interconnection 109. The predetermined potential may be an equipotential to the mirror 230. Since different voltages are sometimes applied to the plurality of driving electrodes 101, the ground potential is more preferably applied to the peripheral electrode 102.

In the micromirror device shown in FIG. 9, the driving electrode electrical interconnections 201 and the peripheral electrode electrical interconnection 202 are formed in a layer different from the layer where the driving electrodes 101 and the peripheral electrode 102 are formed. However, they may partially be arranged in the same layer as that of the peripheral electrode 102. However, to prevent electric fields generated by the driving electrode electrical interconnections 201 and the peripheral electrode electrical interconnection 202 from acting on driving of the mirror 230, and completely cover the insulating film, the structure including the electrical interconnections 201 and 202 led under the driving electrodes 101 and the peripheral electrode 102 is more preferable. Note that the driving electrode electrical interconnections 201 have larger influence on driving of the mirror 230 than the peripheral electrode electrical interconnection 202.

The mirror 230 of the micromirror device shown in FIG. 9 rotates due to an electrostatic attraction generated by the potential difference between the mirror 230 and the driving electrodes 101. For example, the mirror 230 is grounded. Predetermined positive voltages (driving voltages) are applied to the driving electrodes 101 via the driving electrode electrical interconnections 201 so as to attract the mirror 230 by an electrostatic attraction and rotate it in an arbitrary direction. To rotate the mirror 230 in a desired direction, different driving voltages are applied to the four driving electrodes 101 to generate potential differences between them.

The mirror 230 stands still when the electrostatic attraction balances the restoring force of springs (the mirror connectors 221a and 221b and the gimbal connectors (not shown)) supporting the mirror 230. If the spring constants of the mirror connectors 221a and 221b and the gimbal connectors can be regarded constant, theoretically, the tilt angle of the mirror 230 is uniquely determined by applying predetermined driving voltages to the driving electrodes 101.

In the micromirror device that is an electrostatically driven MEMS device, the distance between the electrodes (the distance between the mirror 230 and the driving electrodes 101 here) to which the driving voltages are applied is generally several hundred μm to several μm. A voltage of several hundred V is applied to this gap. For example, when a voltage of 100 V is applied to a device with an interelectrode distance of 10 μm, a high electric field of $10^5$ V/cm is generated. If an insulating film such as a dielectric film is arranged near the region where the high electric field is applied, the insulating film may be charged. This charging generates a new electric field, and the tilt angle of the mirror 230 varies over time due to the electric field formed by the charging.

The precise cause of charging of the insulating film is not yet determined. It is assumed that a charge trap center capable of accumulating charges is formed in the insulating film due to the influence of manufacturing process, and electric field application for driving the mirror 230 causes carrier injection from the electrodes into the insulating film, and the charge trap center accumulates charges. In general, the insulating film is assumed to readily accumulate charges as the applied electric field becomes higher. The equilibrium state of charge accumulation and charge emission changes over time, and the field strength changes over time. As a result, the strength of the electric field formed between the mirror 230 and the driving electrodes 101 also changes over time. This is observed as drift of the mirror tilt angle.

Drift of the mirror tilt angle is caused by portions where the insulating film 104 is exposed in the region between the mirror substrate 200 and the electrode substrate 301 and, more particularly, the portion existing under the mirror 230. In this embodiment, the peripheral electrode 102 is arranged in the layer different from that of the driving electrodes 101, so that a structure is formed in which the peripheral electrode 102 gets under the driving electrodes 101. Adopting such an electrode arrangement makes it possible to spread the gap portion between the driving electrodes 101 and the peripheral electrode 102 not horizontally but vertically. In addition, when processing the driving electrodes 101 so as to be slightly projected from the insulating film 1001 on the lower side, a structure for more effectively hiding the insulating film 1001 from the mirror 230 can be implemented.

When the driving voltages are applied to the driving electrodes 101, and the ground potential is applied to the mirror 230 and the peripheral electrode 102, the mirror 230 is maintained at an angle at which the restoring force of the springs balances the electrostatic attraction generated by the driving voltages. Even when charge injection into the insulating film 1001 occurs between the driving electrodes 101 and the peripheral electrode 102, the influence on the electric fields formed between the mirror 230 and the driving electrodes 101 is suppressed small. As a result, drift of the mirror tilt angle can be reduced.

A method of manufacturing the micromirror device according to this embodiment will be described below. Note that the present invention is not limited to the following manufacturing method, and only a description of a typical manufacturing method will be described below.

A method of manufacturing the mirror substrate 200 will be described first. The mirror substrate 200 is prepared using a SOI substrate. Using a SOI substrate as a starting substrate, the gimbal 220, mirror 230, gimbal connectors, and mirror connectors 221a and 221b are formed on the SOI layer by a known lithography technique.

In the step of manufacturing the mirror substrate 200, first, a photosensitive resist is applied to the SOI layer in a desired thickness by spin coating. A reticle (mask) having a light-shielding body in a shape conforming to a pattern is aligned with the substrate having the photosensitive resist and held. The reticle is irradiated with light having the photosensitive wavelength of the photosensitive resist so as to form an image corresponding to the silhouette of the light-shielding body on the wafer with the photosensitive resist. The irradiation is performed after determining the light irradiation time for obtaining a desired pattern in a desired size. The resist with a latent image formed is immersed in a developer. After determining the time of immersing the wafer with resist in the developer so as to form a desired pattern in a desired size, the wafer is immersed in the developer for the determined time. After that, the entire wafer is dried to harden the resist. A resist pattern is formed on the SOI substrate thus far.

Using the formed resist as a mask, the frame portion 210, gimbal 220, mirror 230, gimbal connectors, mirror connectors 221a and 221b, and the like are formed on the SOI layer by DRIE (Deep Reactive Ion Etching) that is a deep engraving technique for silicon. At this time, an etching intermediate film may be used. Alternatively, the silicon may directly be processed using the resist as an etching mask. After etching the silicon, the photosensitive resist used as a mask is removed. After removal, the wafer is cleaned to expose a clean silicon surface.

Then, the silicon base substrate is processed. First, a protective organic film is applied to the SOI surface side. A photosensitive resist or a film of, e.g., polyimide having known workability may be used as the organic film. Since this organic film needs to be removed finally, a film having high strippability and removability is preferably used. After forming the protective film on the SOI surface, a photosensitive resist is applied to the base substrate. When applying the photosensitive resist, the SOI surface side comes into contact with the sample table of the coater. However, since the protective film is deposited, there is no damage to the structure formed on the SOI surface.

After applying the photosensitive resist, a reticle (mask) having a light-shielding body in a shape conforming to a desired pattern is aligned with the substrate having the photosensitive resist and, more particularly, with the structure on the SOI surface and held. The reticle is irradiated with light having the photosensitive wavelength of the photosensitive resist so as to form an image corresponding to the silhouette of the light-shielding body on the wafer with the photosensitive resist. The irradiation is performed after determining the light irradiation time for obtaining a desired pattern in a desired size. The resist with a latent image formed is immersed in a developer. After determining the time of immersing the wafer with resist in the developer so as to form a desired pattern in a desired size, the wafer is immersed in the developer for the determined time. After that, the entire wafer is dried to harden the resist. A resist pattern is formed on the base substrate thus far.

Using the formed resist as a mask, the silicon of the unnecessary base substrate where the mirror 230 and the like are formed on the SOI layer is removed by DRIE that is a deep engraving technique for silicon. At this time, an etching intermediate film such as a silicon oxide film may be used. Alternatively, the silicon may directly be processed using the resist as an etching mask. After etching the silicon, the photosensitive resist used as a mask is removed. After removal, the wafer is cleaned to expose a clean surface. Then, a silicon oxide film that forms a BOX (Buried Oxide) layer is removed by etching.

Then, the organic film that protects the SOI layer pattern is removed by etching, thereby forming a movable structure. When a plurality of chips are formed on the wafer, a process called dicing is performed to cut the wafer and separate the chips. After that, the protective film on the SOI layer is removed by etching. Forming a plurality of chips on a wafer is more general than forming only one chip on a wafer.

After the mirror chip is formed in the above-described way, a metal is deposited only on the mirror surface of the mirror substrate 200 and desired places of the bonding interface using a stencil mask. To use the micromirror device as a device for communication, a metal such as gold or aluminum that reflects infrared rays well is deposited to increase the reflectance of infrared rays to be used. When the structure surface is made of silicon, an adhesion improving layer of titanium or chromium is sometimes used to improve the adhesion of the deposited gold or aluminum to the silicon. Before dicing, a metal pattern may be formed on the mirror by a known lithography technique. The mirror substrate 200 having the rotatable mirror 230 is in the above-described way.

A method of manufacturing the electrode substrate 301 will be described next. First, the insulating film 107 made of a thermal oxide film is formed on the surface of the base portion 310 as the base. A metal sputtering film is deposited on the surface of the insulating film 107, and used as the first seed layer of the succeeding plating process. Then, a resist is applied to form a resist pattern necessary for forming the driving electrode electrical interconnections 201 and the peripheral electrode electrical interconnection 202 by a known lithography technique. A metal such as gold is grown by plating using the resist pattern as a mask.

After forming the driving electrode electrical interconnections 201 and the peripheral electrode electrical interconnection 202 on the insulating film 107 by plating, the resist used as a mask is stripped. After cleaning, the unnecessary first seed layer portion is removed by etching. Subsequently, the insulating film 104 formed from, for example, a silicon oxide film is deposited by CVD (Chemical Vapor Deposition) or the like so as to cover the driving electrode electrical interconnections 201 and the peripheral electrode electrical interconnection 202 on the insulating film 107. At this time, if the planarity of the surface of the insulating film 104 is poor, a planarization process is executed after depositing the insulating film 104.

A resist is applied to the insulating film 104 by spin coating. A resist pattern to be used to form the interlayer vertical electrical interconnections 108 and 109 is formed by a known lithography technique. The insulating film 104 is etched by a known etching technique using the resist as a mask, thereby forming vertical holes to be used to form the interlayer vertical electrical interconnections 108 up to such a depth that reaches the driving electrode electrical interconnections 201 and also forming a vertical hole to be used to form the interlayer vertical electrical interconnection 109 up to such a depth that reaches the peripheral electrode electrical interconnection 202. The resist that covers the surface is stripped after the vertical hole formation, and the substrate is cleaned to make its surface clean.

A metal sputtering film is deposited on the surface of the insulating film 104, and used as the second seed layer of the succeeding plating process. A resist is applied to form, by a known lithography technique, a resist pattern to be used to form the peripheral electrode 102 and the interlayer vertical electrical interconnections 108 and 109. The interlayer vertical electrical interconnection 109 that connects the peripheral electrode 102 to the peripheral electrode electrical interconnection 202, the peripheral electrode 102, and the interlayer vertical electrical interconnections 108 that connect the driving electrodes 101 to the driving electrode electrical interconnections 201 are formed by plating using the resist pattern as a mask. Note that the interlayer vertical electrical interconnections 108 are formed up to the midway point of their projecting from the insulating film 104. After the resist is stripped, the unnecessary second seed layer is removed by etching. The substrate is cleaned again to make its surface clean.

Next, the insulating film 1001 formed from, for example, a silicon oxide film is deposited on the entire sample surface by CVD or the like. If the planarity of the surface of the insulating film 1001 is poor, a planarization process is executed after depositing the insulating film 1001. A resist is applied to the insulating film 1001 by spin coating. A resist pattern to be used to form the interlayer vertical electrical interconnections 108 is formed by a known lithography technique. The insulating film 1001 is etched by a known etching technique using the resist as a mask, thereby forming vertical holes to be used to form the interlayer vertical electrical interconnections 108 up to such a depth that reaches the interlayer vertical electrical interconnections 108 on their way to completion. The resist that covers the surface is stripped after the vertical hole formation, and the substrate is cleaned to make its surface clean.

A metal sputtering film is deposited on the surface of the insulating film 1001, and used as the third seed layer of the succeeding plating process. A resist is applied to from, by a known lithography technique, a resist pattern to be used to form the driving electrodes 101. The driving electrodes 101 and the interlayer vertical electrical interconnections 108 up to such a height that connects the electrical interconnections on their way to completion to the driving electrodes 101 are formed by plating using the resist pattern as a mask. After the resist is stripped, the unnecessary third seed layer is removed by etching. The substrate is cleaned again to make its surface clean.

Figure 16:
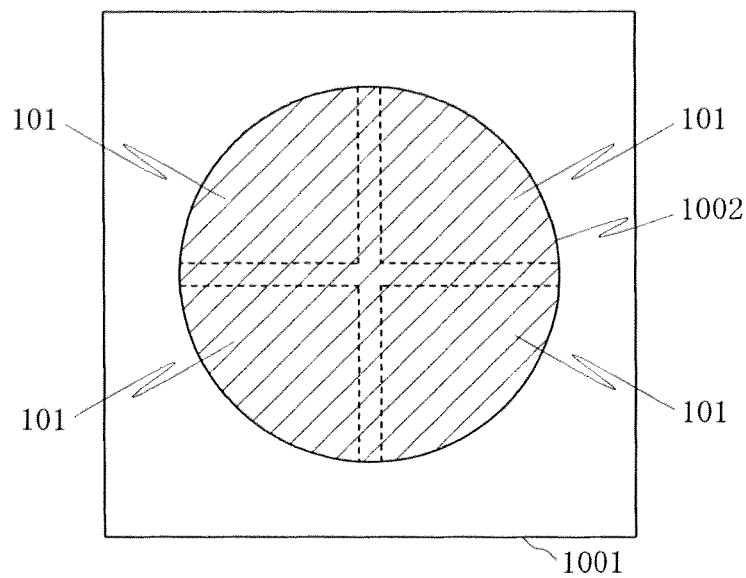
FIG. 16 is a plan view showing a resist pattern to be used to remove the insulating film between the first conductive layer and the second conductive layer by etching according to the fourth embodiment of the present invention.

A resist is applied to the driving electrodes 101 and the insulating film 1001 by spin coating. A resist pattern to be used to remove the insulating film 1001 by etching is formed by a known lithography technique. FIG. 16 is a plan view showing the resist pattern at this time. Reference numeral 1002 denotes a region masked by the resist. The insulating film 1001 is removed by etching using the resist pattern as a mask. The insulating film 1001 except the regions of the four fan-shaped driving electrodes 101 and the cross-shaped region sandwiched between the driving electrodes 101 is thus removed by etching.

To use dry etching, etching conditions are determined not to etch the peripheral electrode 102 or to leave the peripheral electrode 102 having a sufficient thickness. Conversely, based on the relationship between the etching conditions and the thickness of the peripheral electrode 102 to be implemented, the peripheral electrode 102 may be formed by plating to a relatively large initial deposition thickness.

After the peripheral electrode 102 is exposed by etching the insulating film 1001, a wet process using hydrofluoric acid or buffered hydrofluoric acid is performed to further etch part of the insulating film 1001. With this process, the insulating film 1001 under the peripheral portions of the driving electrodes 101 is etched in a direction along the substrate surface, and the structure with the driving electrodes 101 overhanged from the edge of the insulating film 1001 can be implemented. Instead of etching the insulating film 1001 by dry etching, wet etching may be used from the beginning, as a matter of course. The resist that covers the surface is stripped after etching of the insulating film 1001, and the substrate is cleaned to make its surface clean.

A thick resist is applied by spin coating. A resist pattern to be used to form the convex portions 360a and 360b is formed by a known lithography technique. The convex portions 360a and 360b are formed by plating using the resist pattern as a mask. After that, the resist that covers the surface is stripped, and the substrate is cleaned to make its surface clean. The electrode substrate 301 is formed in the above-described way.

An example of formation of the electrode substrate 301 has been described above. The interlayer vertical electrical interconnection formation and the electrode structure formation may be separate processes. If an electrical connection state can reliably be ensured, the electrode substrate 301 may be formed without depositing the second and third seed layers. A metal may be deposited on the driving electrodes 101 by plating to form a driving electrode structure having a terraced surface.

Finally, the mirror substrate 200 and the electrode substrate 301 are aligned with each other. The upper surfaces of the convex portions 360a and 360b of the electrode substrate 301 are soldered. The solder is melted by heating to bond the mirror substrate 200 to the electrode substrate 301. The micromirror device is thus completed.

[Fifth Embodiment]

Figure 17:
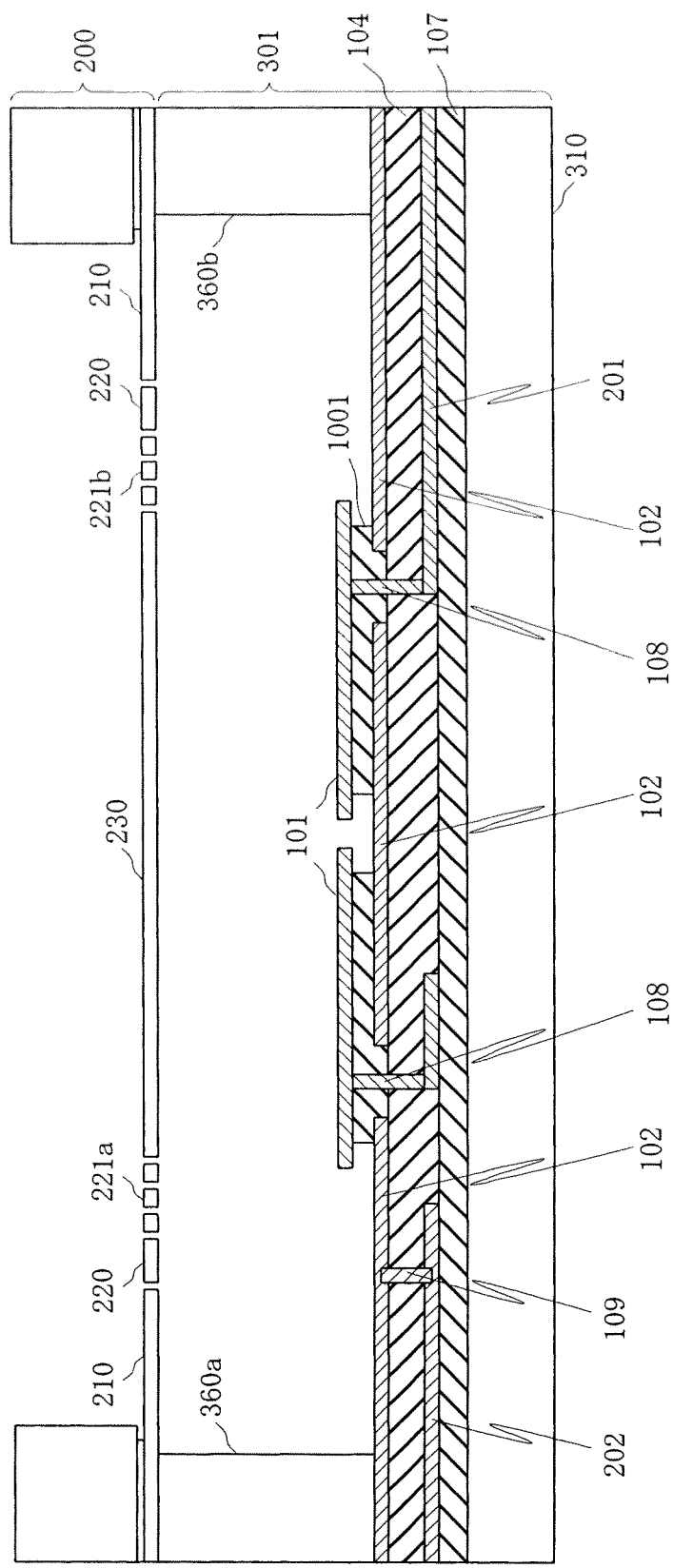
FIG. 17 is a sectional view showing the arrangement of a micromirror device according to the fifth embodiment of the present invention.

The fifth embodiment of the present invention will be described next. FIG. 17 is a sectional view of a micromirror device that is an electrostatically driven MEMS device according to the fifth embodiment of the present invention.

In the fourth embodiment, the insulating film 1001 is exposed to the cross-shaped region sandwiched between the four fan-shaped driving electrodes 101, as shown in FIG. 15. The influence of the charged exposed insulating film 1001 on drift of the mirror tilt angle is small. However, a structure in which the insulating film 1001 is not exposed at all when viewed from the side of the mirror 230 is more preferable, as a matter of course. In the fifth embodiment, such a structure in which an insulating film 1001 is not exposed at all is implemented.

Figure 18:
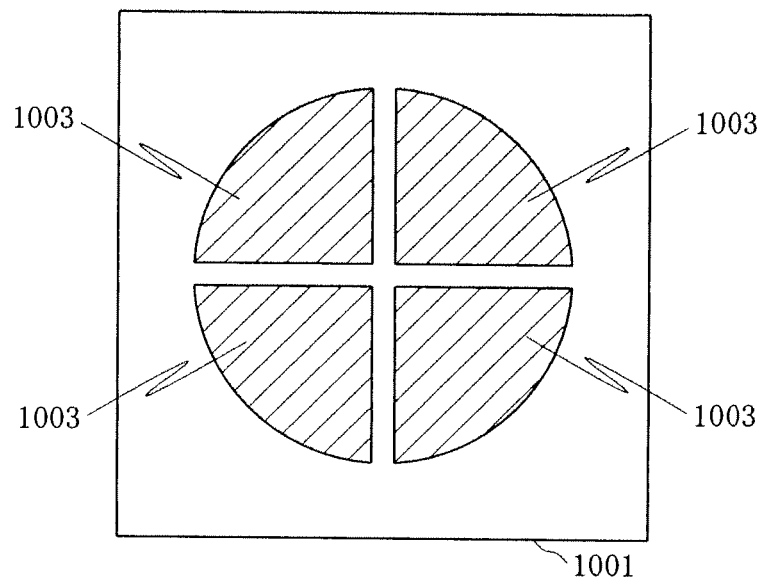
FIG. 18 is a plan view showing a resist pattern to be used to remove an insulating film between a first conductive layer and a second conductive layer by etching according to the fifth embodiment of the present invention.

A micromirror device manufacturing method of this embodiment is almost the same as in the fourth embodiment except the shape of a resist pattern to be used to remove the insulating film 1001 by etching. FIG. 18 is a plan view showing the resist pattern to be used to remove the insulating film 1001 by etching. Reference numeral 1003 denotes a region masked by the resist. The regions 1003 are the same as the regions of driving electrodes 101. When the insulating film 1001 is removed by etching using the resist pattern as a mask, the insulating film 1001 except the regions of the driving electrodes 101 is removed by etching. In addition, the insulating film 1001 that exists under the edges of the driving electrodes 101 is removed by etching. Note that the insulating film 1001 may be etched using the driving electrodes 101 as a mask.

Figure 19:
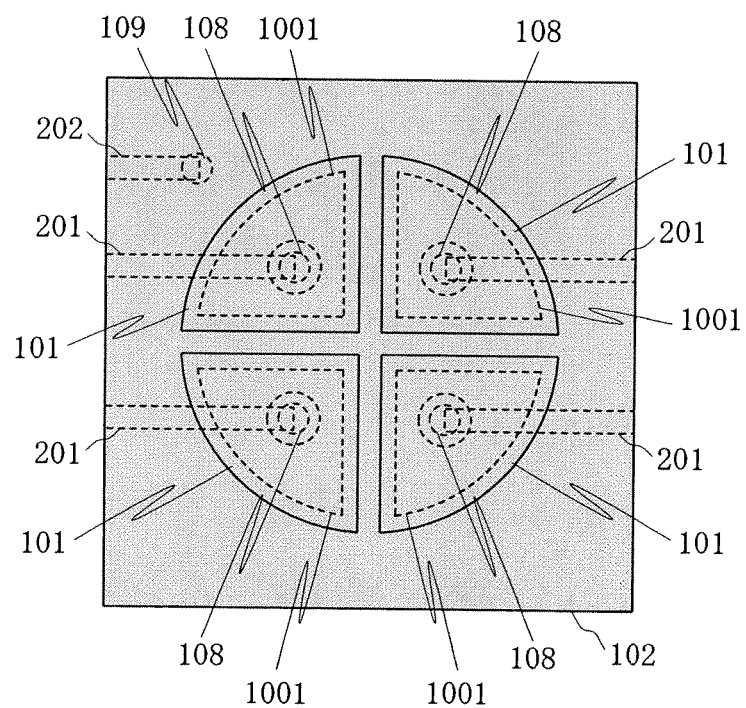
FIG. 19 is a plan view seen through driving electrodes and layers under them according to the fifth embodiment of the present invention.

FIG. 19 is a plan view seen through the driving electrodes 101 and layers under them. In this embodiment, the structure with the driving electrodes 101 overhanged from the edge of the insulating film 1001 can be implemented in the above-described way. A structure in which the insulating film 1001 is not exposed at all when viewed from the side of a mirror 230 is thus implemented.

In the micromirror devices according to the fourth and fifth embodiments, gold (Au) is used as the material of the driving electrode electrical interconnections 201, peripheral electrode electrical interconnection 202, driving electrodes 101, peripheral electrode 102, and convex portions 360a and 360b. However, the present invention is not limited to this. As the conductive material of these electrical interconnections, electrodes, and convex portions, aluminum (Al), tungsten (W), tantalum (Ta), titanium (Ti), copper (Cu), tin (Sn), silver (Ag), or a compound thereof is usable. Alternatively, a semiconductor material such as silicon may be used.

In the fourth and fifth embodiments, the structure of the conductive material is formed using plating. However, any other known film deposition technique such as sputtering, CVD, or deposition is usable without any problem as long as it can deposit a conductive film to a desired thickness.

In each of the fourth and fifth embodiments, a micromirror device having a mirror that can rotate about two axes perpendicular to each other has been described. However, the present invention is not limited to this. The present invention can also be practiced in general for any electrostatically driven MEMS device that includes a movable member (movable electrode) and a driving electrode (fixed electrode), and can drive the movable member by an electrostatic attraction generated by the potential difference between the movable member and the driving electrode, as a matter of course.

[Sixth Embodiment]

Figure 20:
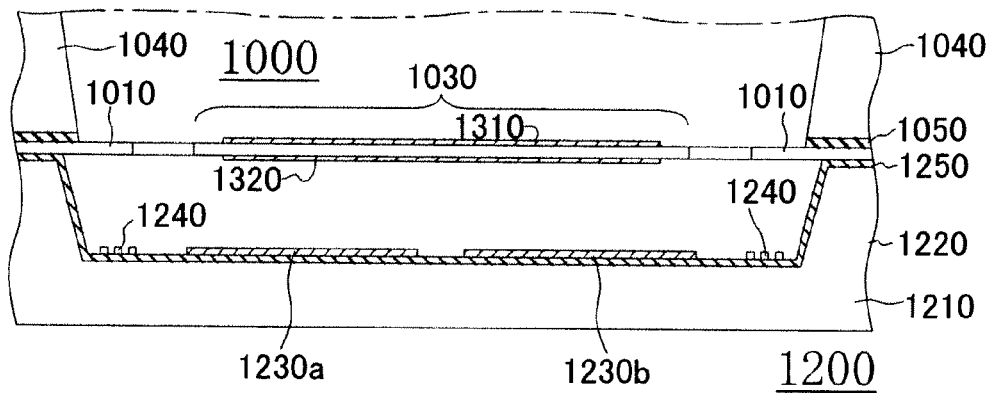
FIG. 20 is a sectional view showing the arrangement of a micromirror device according to the sixth embodiment of the present invention.
Figure 21:
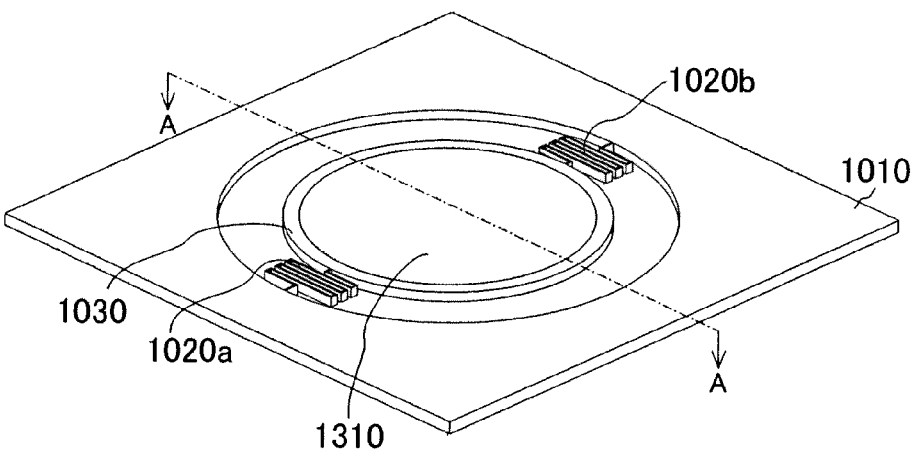
FIG. 21 is a perspective view showing a partial arrangement of the micromirror device according to the sixth embodiment of the present invention.

The sixth embodiment of the present invention will be described next with reference to FIGS. 20 and 21. FIG. 20 is a sectional view showing the arrangement of a micromirror device that is an electrostatically driven MEMS device according to the sixth embodiment of the present invention. FIG. 21 is a perspective view showing a partial arrangement of the micromirror device according to the sixth embodiment. In this embodiment, a micromirror device having a rotatable mirror 1030 with one rotation axis will be exemplified.

The micromirror device has a structure in which a mirror substrate 1000 serving as a first substrate having the mirror 1030 and an electrode substrate 1200 serving as a second substrate having driving electrodes for driving the mirror 1030 are disposed in parallel.

The mirror substrate 1000 includes a plate-shaped support frame 1010 having an opening with an almost circular shape viewed from above. The mirror substrate 1000 also includes the mirror 1030 with a circular shape viewed from above, which is disposed in the opening of the support frame 1010 while being connected to the support frame 1010 by a pair of mirror connectors 1020a and 1020b. The support frame 1010, mirror connectors 1020a and 1020b, and mirror 1030 are integrally formed from, for example, single-crystal silicon. A reinforcing frame 1040 is formed on the upper surface of the support frame 1010 so as to surround the support frame 1010 and the mirror 1030. The reinforcing frame 1040 is connected to the support frame 1010 via an insulating layer 1050.

The pair of mirror connectors 1020a and 1020b are formed from, for example, meander-shaped torsion springs and connect the support frame 1010 to the mirror 1030. The mirror 1030 can rotate about a mirror rotation axis which passes through the pair of mirror connectors 1020a and 1020b.

The electrode substrate 1200 includes a plate-shaped base portion 1210 and convex portions 1220 juxtaposed on its peripheral portion. Two driving electrodes 1230a and 1230b are formed on the base portion 1210 in the region inside the convex portions 1220 so as to be located in a circle concentric to the mirror 1030 on the opposite side. Electrical interconnections 1240 are formed around the driving electrodes 1230a and 1230b on the upper surface of the base portion 1210. The electrical interconnections 1240 are connected to the driving electrodes 1230a and 1230b via leads (not shown) in a region (not shown). The driving electrodes and electrical interconnections are formed on an insulating layer 1250.

The mirror substrate 1000 and the electrode substrate 1200 described above constitute one micromirror device by bonding the lower surface of the support frame 1010 to the upper surfaces of the convex portions 1220 so that the mirror 1030 faces the driving electrodes 1230a and 1230b corresponding to the mirror 1030. In this micromirror device, for example, the mirror 1030 is electrically grounded. Positive voltages (driving voltages) are applied to the driving electrodes 1230a and 1230b to generate an asymmetrical potential difference between them. This allows to attract the mirror 1030 toward the electrode substrate 1200 by an electrostatic attraction and rotate the mirror 1030 about the mirror rotation axis by an arbitrary angle.

In the micromirror device according to this embodiment, metal films 1310 and 1320 having the same shape are formed on both surfaces of the mirror 1030. The metal films 1310 and 1320 are made of a metal such as aluminum or Au. If the micromirror device uses infrared rays as light, Au is preferably used in consideration of the reflectance of infrared rays. If light in, for example, the visible range is used, aluminum is usable.

In this embodiment, the metal film 1310 serves as the reflecting surface of the mirror 1030. The metal film 1320 is formed to suppress bending of the mirror 1030 upon forming the metal film 1310.

In addition, the metal films 1310 and 1320 are formed to be similar to and smaller than the mirror 1030, and arranged concentrically with the mirror 1030. For example, the metal films 1310 and 1320 are formed into a circular shape that is concentric to the mirror 1030 and has a radius (diameter) smaller than that of the mirror 1030. For this reason, the mirror 1030 has regions without the metal films at its peripheral portion.

Figure 22:
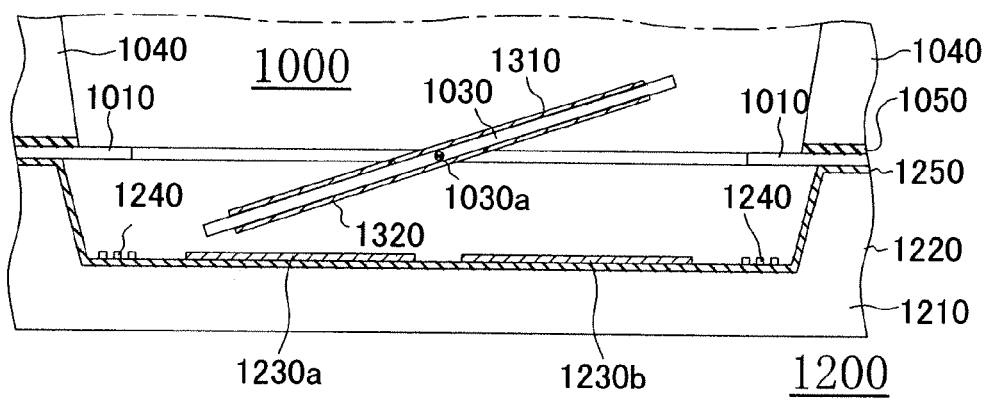
FIG. 22 is a sectional view showing the arrangement of the micromirror device according to the sixth embodiment of the present invention.

According to the micromirror device of this embodiment having the above-described arrangement, when the edge of the mirror 1030 comes into contact with the driving electrode 1230a or 1230b, the driving electrode 1230a or 1230b does not come into contact with the metal film 1320. For example, as shown in the sectional view of FIG. 22, even when the edge of the mirror 1030 on the side of the driving electrode 1230a comes into contact with the driving electrode 1230a as the mirror rotates about a mirror rotation axis 1030a that passes through the pair of mirror connectors 1020a and 1020b, the metal film 1320 never comes into contact with the driving electrode 1230a. This prevents stick of the driving electrodes and the mirror having, on its surfaces, metal films made of the same metal as that of the driving electrodes when the device is uncontrollable, and the applied voltages are set to zero before collision so that the mirror and the driving electrodes are set at an equipotential and collide with each other.

From the viewpoint of preventing contact between the metal film 1320 and the driving electrode 1230a or 1230b described above, the metal film 1320 need not always be formed to be similar to the mirror 1030. Considering portions where the rotating mirror 1030 comes into contact with the driving electrodes 1230a and 1230b, the metal film 1320 may be formed in the entire region except predetermined regions starting from the contact portions. For example, in regions connected to the mirror connectors 1020a and 1020b, the metal film 1320 may be formed up to the edge of the mirror 1030.

However, the metal film 1320 is not uniformly formed on the mirror 1030 in the 360° direction from its circle center (center). That is, stress generated upon forming the metal film 1320 is not uniform. In this state, it is not easy to maintain the planarity of the mirror 1030. For example, nonuniform stress generated between the mirror 1030 and the metal films 1310 and 1320 due to a change in temperature distorts the mirror 1030.

However, for example, when the metal films 1310 and 1320 similar to the circular mirror 1030 are formed concentrically with the mirror 1030, the stress is generated uniformly, and the planarity of the mirror 1030 can easily be maintained.

The manufacture of the micromirror device according to this embodiment will briefly be described next. A method of manufacturing the mirror substrate 1000 will briefly be described first. First, a SOI substrate is prepared. The SOI layer of the SOI surface is patterned by a known lithography technique and known etching technique, thereby forming the support frame 1010, mirror connectors 1020a and 1020b, and mirror 1030.

For example, a photosensitive resist is applied to the SOI layer by spin coating to form a photosensitive resist layer having a desire thickness. A reticle (photomask) having a light-shielding body pattern in a shape conforming to the pattern of the above-described mirror and mirror connectors is aligned with the SOI substrate having the photosensitive resist layer and held. In this state, the reticle is irradiated with light having the photosensitive wavelength of the photosensitive resist so as to project the projected image of the light-shielding body pattern onto the photosensitive resist layer. The light irradiation is performed in accordance with an irradiation time determined to obtain a desired resist pattern in a desired size. With this exposure, the latent image of the light-shielding body pattern is formed on the photosensitive resist layer.

After thus forming the latent image, a developing process is performed for a time determined to form a desired resist pattern in a desired size. With this developing process, for example, an exposed portion is dissolved into the developer, and an unexposed portion is left as the resist pattern. After a liquid process such as the stop of development is performed, the SOI substrate is dried. In addition, the resist pattern is hardened by a heat treatment.

The SOI layer is selectively removed by etching using the resist pattern formed in the above-described way as a mask. For example, the SOI layer is etched up to such a depth that reaches a buried insulating layer by DRIE that is a well-known deep engraving technique for silicon. With this etching, the support frame 1010, mirror connectors 1020a and 1020b, and mirror 1030 are formed on the SOI layer.

In this patterning, an etching intermediate film made of an inorganic material may be used. The shape of the resist pattern may temporarily be transferred to the etching intermediate film, and the SOI layer may be etched using the pattern formed on the etching intermediate film as a mask. Note that in any case, after forming the pattern of the mirror and the mirror connectors on the SOI layer, the mask layer used as the etching mask is removed. For example, the resist pattern can be removed by asking using oxygen plasma or the like. After removing the mask layer, the substrate is cleaned to expose a clean silicon surface.

Next, the base portion of the SOI substrate is processed to form the reinforcing frame 1040. For example, a protective organic film is first formed on the surface of the SOI layer with the pattern of the mirror and connectors. A photosensitive resist or a material such as polyimide having known workability may be used as the organic film. Since the organic film needs to be removed finally, a film that has high strippability and can easily be removed is preferably used.

After forming the protective organic film on the surface of the SOI layer, a photosensitive resist is applied to the surface of the base portion 310 (the lower surface of the SOI substrate) to form a photosensitive resist film. When forming the photosensitive resist film, the SOI layer side is arranged to face the substrate table of the coater. However, since the protective organic film is formed, the SOI layer does not come into direct contact, and there is no damage to each formed portion.

A reticle (photomask) having a light-shielding body pattern in a shape conforming to the pattern of the opening portion of the reinforcing frame 1040 is aligned with the SOI substrate having the photosensitive resist layer and held. In this state, the reticle is irradiated with light having the photosensitive wavelength of the photosensitive resist so as to project the projected image of the light-shielding body pattern onto the photosensitive resist layer. The light irradiation is performed in accordance with an irradiation time determined to obtain a desired resist pattern in a desired size. With this exposure, the latent image of the light-shielding body pattern is formed on the photosensitive resist layer.

After thus forming the latent image, a developing process is performed for a time determined to form, for example, a frame-shaped resist pattern in a desired size. With this developing process, for example, an exposed portion is dissolved into the developer, and an unexposed portion is left as the frame-shaped resist pattern. After a liquid process such as the stop of development is performed, the SOI substrate is dried. In addition, the resist pattern is hardened by a heat treatment.

After thus forming the resist pattern to be used to form the reinforcing frame 1040, for example, the base portion is selectively removed by etching by the above-described DRIE. In this etching as well, the base portion is etched up to such a depth that reaches a buried insulating layer using the resist pattern as a mask. With this etching, an opening portion is formed in the base portion. The reinforcing frame 1040 having an opening portion in a region corresponding to the portion of the above-described mirror, gimbals, and the like is formed by this etching. In addition, the buried insulating layer is selectively removed by etching, thereby exposing part of the support frame 1010, mirror connectors 1020*a* and 1020*b*, mirror 1030, and the like to the side of the insulating film 104. This etching is performed by, for example, a well-known wet process using buffered hydrofluoric acid (BHF) or known dry etching.

In this patterning, an etching intermediate film made of an inorganic material may be used. The shape of the resist pattern may temporarily be transferred to the etching intermediate film, and the base portion (and the buried insulating layer) may be etched using the pattern formed on the etching intermediate film as a mask. Note that in any case, after forming the pattern of the reinforcing frame 1040 on the base portion and removing the buried insulating layer, the mask layer used as the etching mask is removed. For example, the resist pattern can be removed by asking using oxygen plasma or the like. After removing the mask layer, the substrate is cleaned to expose a clean silicon surface.

After thus forming the reinforcing frame 1040, the organic film that protects the surface of the SOI layer is removed to make the mirror 1030 rotatable. Note that when forming a plurality of micromirror devices on a SOI substrate, mirror substrate chips corresponding to the portions of the micromirror devices formed on the SOI substrate are cut off. In this case, after the substrate is cut into the respective chips, the above-described protective film (protective film) is removed.

After forming the mirror substrate 1000 in the above-described way, the metal films 1310 and 1320 are formed on both surfaces of the mirror 1030, respectively. They are formed by selectively depositing a target metal material only in regions round the center of the mirror 1030, whose radius is smaller than that of the mirror 1030 by, for example, focused ion beam deposition. For example, to use the device for communication, Au is used as the metal material to increase the reflectance of signal light (infrared rays) to be used. Note that when Au is used, an adhesion improving layer of, e.g., titanium or chromium may be used to improve the adhesion to silicon.

The metal films 1310 and 1320 may be formed by depositing the metal material in desired regions by a deposition method using a stencil mask. Alternatively, the metal films 1310 and 1320 can also be formed by selectively forming metal films using a so-called lift-off method. In the lift-off method, a resist pattern is formed first. After forming the resist pattern, a metal film is formed. Then, the resist pattern is removed to remove the metal film on it to leave the metal film in a desired region, thereby forming the metal films 1310 and 1320. Otherwise, after a metal film is formed, selective etching may be performed using a resist pattern to form the metal films 1310 and 1320.

Note that considering the stresses of the metal films to be formed, preferably, metal films having the same thickness are formed on both surfaces of the mirror 1030 using the same manufacturing method to implement a state in which the stresses of the metal films formed on both surfaces balance, thereby suppressing deformation of the mirror 1030.

As described above, since the metal films 1310 and 1320 are formed only in the internal regions of the mirror 1030, no metal films are formed on, for example, the mirror connectors 1020*a* and 1020*b*. The mirror connectors 1020*a* and 1020*b* are fine structures that largely deform as the mirror 1030 rotates. If metal films adhere to the mirror connectors 1020*a* and 1020*b*, their states change over time so as to change the angle of the mirror 1030 even when it is controlled to a predetermined tilt angle by supplying control signals to the driving electrodes 1230*a* and 1230*b*, and the like. However, according to this embodiment, metal film formation outside the mirror 1030 is suppressed, as described above, thereby preventing metal adhesion to the mirror connectors 1020*a* and 1020*b*. This suppresses the above-described time-rate change of the mirror connectors 1020*a* and 1020*b*, and enables to accurately control the position of the mirror 1030.

[Seventh Embodiment]

Figure 23:
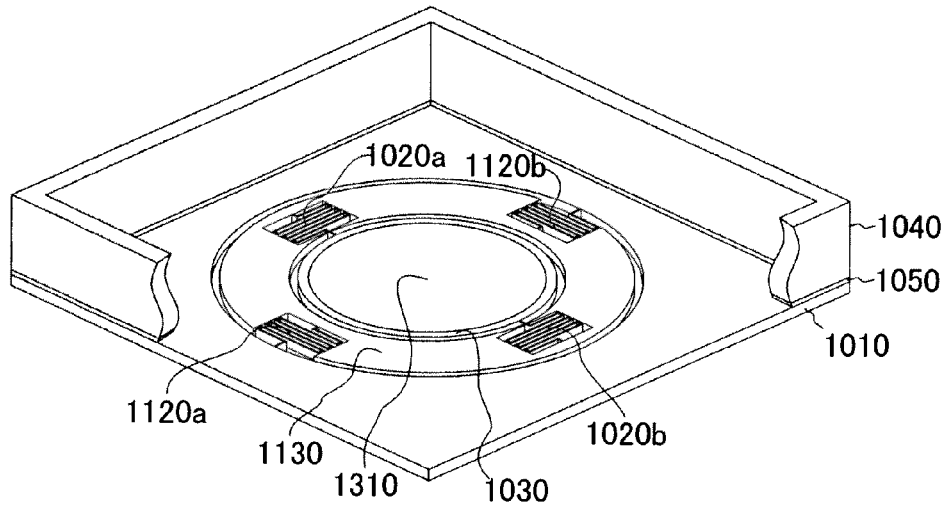
FIG. 23 is a perspective view showing a partial arrangement of a micromirror device according to the seventh embodiment of the present invention.
Figure 24:
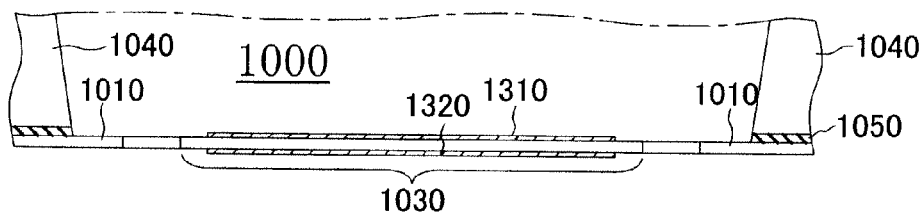
FIG. 24 is a sectional view showing a partial arrangement of the micromirror device according to the seventh embodiment of the present invention.

The seventh embodiment of the present invention will be described next with reference to FIGS. 23 and 24. FIG. 23 is a perspective view showing a partial arrangement of a micromirror device that is an electrostatically driven MEMS device according to this embodiment. FIG. 24 is a sectional view showing a partial arrangement (mirror substrate) of the micromirror device according to this embodiment. In this embodiment, a micromirror device having a rotatable mirror 1030 with two rotation axes will be exemplified.

As in the above-described sixth embodiment, the micromirror device has a structure in which a mirror substrate 1000 having the rotatable mirror 1030 and an electrode substrate 1200 having driving electrodes for driving the mirror 1030 are disposed in parallel. Note that the electrode substrate is not illustrated in FIGS. 23 and 24.

The mirror substrate 1000 includes a plate-shaped support frame 1010, a ring-shaped gimbal 1130, and the disk-shaped mirror 1030. The support frame 1010 has an opening with an almost circular shape viewed from above. The gimbal 1130 is arranged in the opening of the support frame 1010 and connected to the support frame 1010 via a pair of connectors 1120*a* and 1120*b*. The gimbal 1130 also has an opening with an almost circular shape viewed from above. The mirror 1030 is arranged in the opening of the gimbal 1130 and connected to the gimbal 1130 via a pair of mirror connectors 1020*a* and 1020*b*.

A reinforcing frame 1040 is formed at the peripheral portion of the support frame 1010 so as to surround the gimbal 1130 and the mirror 1030. The reinforcing frame 1040 reinforces the entire mirror substrate 1000. Note that the reinforcing frame 1040 is fixed to the support frame 1010 via an insulating layer 1050. In addition, metal films 1310 and 1320 made of a metal such as gold or aluminum are formed on the upper and lower surfaces of the mirror 1030.

The connectors 1120*a* and 1120*b* are provided in the notches of the gimbal 1130. The connectors 1120*a* and 1120*b* are formed from, for example, meander-shaped torsion springs and connect the support frame 1010 to the gimbal 1130. The gimbal 1130 thus connected to the support frame 1010 is supported by the connectors 1120*a* and 1120*b* to be rotatable about a rotation axis (gimbal rotation axis) which passes through the connectors 1120*a* and 1120*b*.

The mirror connectors 1020*a* and 1020*b* are provided in the notches of the gimbal 1130. The mirror connectors 1020*a* and 1020*b* are formed from, for example, meander-shaped torsion springs and connect the gimbal 1130 to the mirror 1030. The mirror 1030 thus connected to the gimbal 1130 is supported to be rotatable about a rotation axis (mirror rotation axis) which passes through the mirror connectors 1020*a* and 1020*b*.

Note that in this embodiment, the gimbal rotation axis and the mirror rotation axis are perpendicular to each other. Note that the connectors 1120*a* and 1120*b* and the mirror connectors 1020*a* and 1020*b* need not always have the meander shape, and can have any other shape suitable to rotate the gimbal 1130 and the mirror 1030.

The above-described mirror substrate 1000 can be formed from, for example, a SOI (Silicon On Insulator) substrate. The support frame 1010, connectors 1120*a* and 1120*b*, gimbal 1130, mirror connectors 1020*a* and 1020*b*, and mirror 1030 can be formed by patterning a SOI layer made of single-crystal silicon and provided on the buried insulating layer of the SOI substrate. In addition, the reinforcing frame 1040 can be formed by processing the base portion under the buried insulating layer. In this embodiment, the insulating layer 1050 corresponds to the buried insulating layer of the SOI substrate.

Note that the electrode substrate has, on the plate-shaped base portion, four driving electrodes in a circle concentric to the mirror 1030 on the opposite side. The remaining components are the same as in the electrode substrate 1200 of the sixth embodiment. The driving electrode substrate may have the same structure as the electrode substrate 300 described with reference to FIGS. 61 and 62.

The mirror substrate 1000 and the electrode substrate described above constitute one micromirror device by bonding the lower surface of the support frame 1010 to the upper surfaces of convex portions 1220 so that the mirror 1030 faces the four driving electrodes corresponding to the mirror 1030. In this micromirror device, for example, the mirror 1030 is electrically grounded. Positive voltages (driving voltages) are applied to the four driving electrodes to generate an asymmetrical potential difference between them. This allows to attract the mirror 1030 toward the electrode substrate 1200 by an electrostatic attraction and rotate the mirror 1030 in an arbitrary direction.

In this embodiment as well, the metal films 1310 and 1320 formed on both surfaces of the mirror 1030 to suppress its bending are formed to be similar to and smaller than the mirror 1030, and arranged concentrically with the mirror 1030. For this reason, the mirror 1030 has regions without the metal films at its peripheral portion.

In the micromirror device of this embodiment having the above-described arrangement as well, when the edge of the mirror 1030 comes into contact with a driving electrode on the electrode substrate, the driving electrode does not come into contact with the metal film 1320. This prevents stick of the driving electrodes and the mirror having, on its surfaces, metal films made of the same metal as that of the driving electrodes.

The width between the outer edge of the metal film 1320 and that of the mirror 1030 will be explained next with reference to FIG. 25. The explanation will be made using the micromirror device (micromirror device) according to the above-described sixth embodiment. A width d of the region where no metal film is formed is calculated as follows. Note that the mirror 1030 is assumed to be a plate with a circular shape viewed from above and rotatable about a mirror rotation axis 1030*a* that passes through the center of the mirror and is parallel to the mirror substrate 1000.

Figure 25:
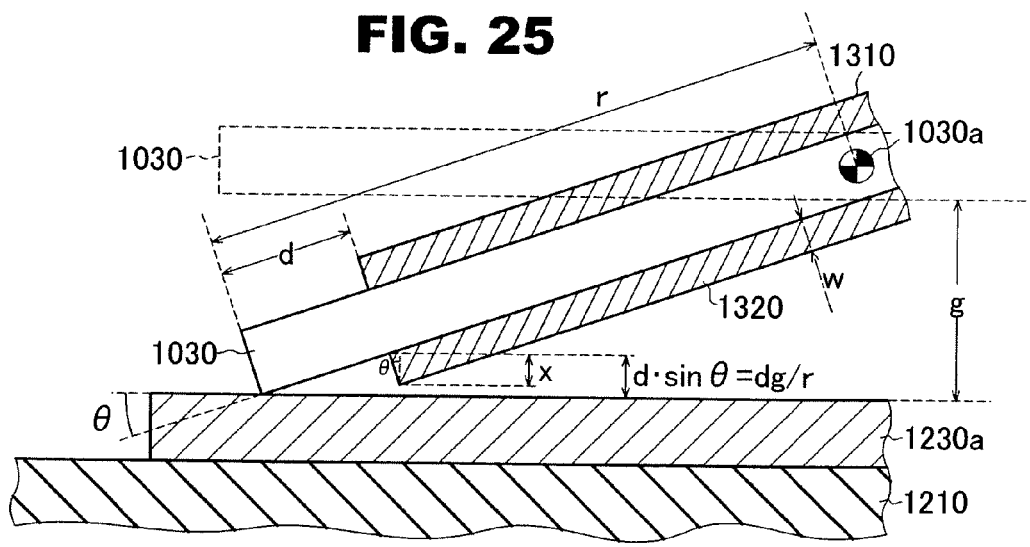
FIG. 25 is a view for explaining the width between the outer edge of the metal film and the outer edge of the mirror in the micromirror devices according to the sixth and seventh embodiments of the present invention.

As shown in FIG. 25, let d be the width of the region at the outer edge of the mirror 1030 where no metal film is formed, r be the radius of the mirror 1030, g be the distance between the mirror 1030 and a driving electrode 1230*a* when the mirror 1030 is not rotating (tilting), and w be the thickness of the metal film 1320.

When the mirror 1030 rotates, and the outer edge of the mirror 1030 comes into contact with the driving electrode 1230*a*, an angle θ made by the mirror 1030 and the driving electrode 1230*a* is "θ=arcsin(g/r)". Hence, the distance to a point farthest from the driving electrode in the region at the outer edge of the mirror 1030 where no metal film is formed is "d·sin θ=dg/r". A variable "x" in FIG. 25 need only satisfy a relation "x<d·sin θ=dg/r . . . (1)" to prevent contact between the metal film 1320 and the driving electrode 1230*a*.

Since "x=w·cos θ=(w/r)(r$^2$−g$^2$)$^{1/2}$ . . . (2)", we obtain "d>(w/g)(r$^2$−g$^2$)$^{1/2}$ . . . (3)" from expressions (1) and (2).

When the region where no metal film is to be deposited at the outer edge of the mirror 1030 is designed to satisfy expression (3), contact between the metal film 1320 and the driving electrode 1230*a* (driving electrode 1230*b*) can be prevented. For example, when the radius of the mirror 1030=800 μm, g=100 μm, and the thickness w of the metal film 1320=1 μm, the width d is set to 7.9 μm or more. In other words, the radius of the metal film 1320 having a circular shape is set to be smaller than the radius of the mirror 1030 by 7.9 μm or more.

Note that the present invention is characterized in that the metal films 1310 and 1320 having the same shape and provided on both surfaces of the mirror 1030 are formed to be similar to and smaller than the mirror 1030, and arranged concentrically with the mirror 1030 so as to implement a reflecting function and maintain planarity. Important is that no metal film is formed at the outer edge of the mirror 1030, and the metal film 1320 is prevented from coming into contact with the driving electrode 1230*a* (driving electrode 1230*b*) even when the edge of the mirror 1030 comes into contact with the driving electrode 1230*a* (driving electrode 1230*b*). The remaining arrangements can be modified as needed without departing from spirit and scope of the present invention, as a matter of course.

For example, the planar shape of the mirror 1030 and the metal films 1310 and 1320 need not always be circular. They may have any other shape such as an elliptical or rectangular shape. From the viewpoint of maintaining the planarity of the mirror 1030, the mirror 1030 preferably has a circular planar shape that makes stress uniformly act. As described above, the mirror may perform either a uniaxial operation by the pair of mirror connectors or a biaxial operation by adding a gimbal and a pair of connectors.

The mirror 1030 (mirror substrate 1000) need not always use silicon. Any other material such as silicon carbide or silicon nitride may be used if it can obtain a mechanical strength necessary for forming the mirror substrate 1000. For example, covalent crystal materials such as single-crystal silicon and silicon carbide are suitable because they have low reactivity and high chemical stability and allow to obtain a relatively high mechanical strength.

As described above, when Au is used as the metal films 1310 and 1320, an underlying layer (adhesion improving layer) made of titanium or the like to improve adhesion can be formed on the mirror 1030 to improve the adhesion between the metal films 1310 and 1320 and the mirror 1030. This also applies to a case in which platinum is used as the metal films 1310 and 1320. The adhesion improving layer may be formed all over the mirror 1030. For example, the adhesion improving layer is formed all over the mirror 1030, and in this state, the metal films 1310 and 1320 are formed on the mirror 1030, as described above.

When the adhesion improving layer is formed, as described above, the adhesion improving layer is exposed in the region at the edge of the mirror 1030 that collides with the driving electrode. When the edge of the mirror 1030 collides with the driving electrode in this state, the adhesion improving layer comes into contact with the driving electrode. However, even when the layer made of titanium comes into contact with the driving electrode made of Au, they cause neither sticking nor operation errors, so no problem is posed. Sticking that causes a problem is assumed to occur when both the driving electrode and the component which may be come into contact with it are made of a material such as gold or platinum that is excellent in ductility and malleability. Hence, unless the portion that comes into contact with the driving electrode is made of such a material, the problem of sticking is assumed to hardly arise.

As described above, when the adhesion improving layer is used, it need not always be formed in the same region as that of the metal films 1310 and 1320. The adhesion improving layer can be formed so as to be exposed in a region where the metal film 1310 or 1320 is not formed. In other words, the formation region of the adhesion improving layer is not particular limited. Hence, formation of the adhesion improving layer is easy, unlike formation of the metal films 1310 and 1320. Even when a gimbal is used, the metal films 1310 and 1320 are not formed on the gimbal. For this reason, even when the gimbal comes into contact with the driving electrode, the problem of sticking between them can be suppressed, as in the case of the mirror 1030.

[Eighth Embodiment]

Figure 26:
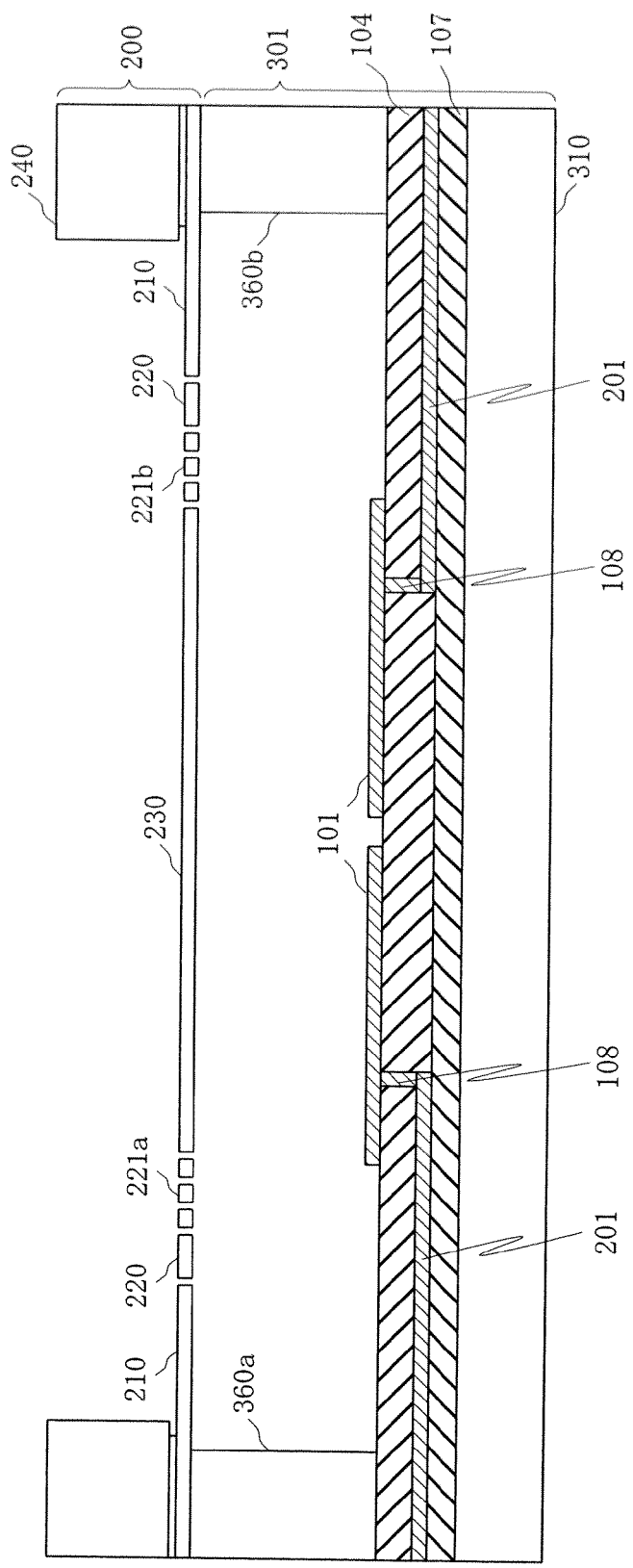
FIG. 26 is a sectional view showing the arrangement of a micromirror device according to the eighth embodiment of the present invention.

The eighth embodiment of the present invention will be described next. FIG. 26 is a sectional view of a micromirror device that is an electrostatically driven MEMS device according to the eighth embodiment of the present invention. Note that a mirror array is formed by one- or two-dimensionally disposing a plurality of micromirror devices shown in FIG. 26. The micromirror device according to this embodiment has a structure in which a mirror substrate 200 having a mirror and an electrode substrate 301 having electrodes are disposed in parallel.

The mirror substrate 200 has almost the same structure as that of the mirror substrate of the conventional micromirror device shown in FIGS. 61 and 62. The mirror substrate 200 includes a plate-shaped frame portion 210 having an opening with an almost circular shape viewed from above, a gimbal 220 having an opening with an almost circular shape viewed from above and disposed in the opening of the frame portion 210 via a pair of gimbal connectors (not shown), and a mirror 230 serving as a movable member having an almost circular shape viewed from above and disposed in the opening of the gimbal 220 via a pair of mirror connectors 221*a* and 221*b*. The gimbal 220 can rotate about a gimbal rotation axis which passes through the pair of gimbal connectors (not shown). Similarly, the mirror 230 can rotate about a mirror rotation axis which passes through the pair of mirror connectors 221*a* and 221*b*. The gimbal rotation axis and the mirror rotation axis are perpendicular to each other. As a result, the mirror 230 rotates about the two axes perpendicular to each other. Note that although a metal film is formed on the surface of the mirror 230, as will be described later, the metal film is not illustrated in FIG. 26.

The electrode substrate 301 includes a plate-shaped base portion 310 made of, for example, single-crystal silicon, and convex portions 360*a* and 360*b* projecting from the surface (upper surface) of the base portion 310 to be bonded to the mirror substrate 200 on the opposite side. An insulating film 107 is formed on the surface of the electrode substrate 301 where the convex portions 360*a* and 360*b* are provided. The insulating film 107 has a function of preventing driving electrode electrical interconnections 201 (to be described later) from making an electrical short circuit via the base portion 310 made of a semiconductor such as silicon.

When a silicon substrate is used as the electrode substrate 301, a silicon oxide film is generally used as the insulating film 107. An unprocessed bare silicon substrate is cleaned as needed to make its surface clean, and then thermally oxidized in a thermal oxidation furnace, thereby forming the insulating film 107. A thermal oxide film formed by thermal oxidation out of silicon oxide film forming methods is known to be superior in quality and dielectric breakdown voltage characteristic to, e.g., a silicon oxide film deposited using CVD (Chemical Vapor Deposition) or the like.

The driving electrode electrical interconnections 201 which supply voltages to driving electrodes 101 are formed on the upper surface of the insulating film 107. The driving electrode electrical interconnections 201 are connected, via bonding pads (not shown), to predetermined pins of a package that packages the micromirror device or the mirror array. When a predetermined DC voltage is applied to a pin of the package, the voltage is applied to the driving electrode 101 in a one-to-one correspondence with that pin so that the mirror 230 can rotate. To form the driving electrode electrical interconnections 201, for example, a metal thin film on the insulating film 107 is processed by a known etching technique.

In addition, an insulating film 104 made of a dielectric is formed on the upper surface of the insulating film 107 so as to cover the driving electrode electrical interconnections 201. The driving electrodes 101 for driving the mirror 230 of the mirror substrate 200 on the opposite side are formed on the upper surface of the insulating film 104. The driving electrodes 101 are connected to the driving electrode electrical interconnections 201 via interlayer vertical electrical interconnections 108 that extend through the insulating film 104. Note that the vertical holes formed for the interlayer vertical electrical interconnections are sometimes referred to as via holes, and interlayer vertical electrical interconnections formed by filling the vertical holes with a metal are sometimes referred to as vias.

The mirror substrate 200 and the electrode substrate 301 described above constitute the micromirror device shown in FIG. 26 by bonding the lower surface of the frame portion 210 to the upper surfaces of the convex portions 360a and 360b so that the mirror 230 faces the driving electrodes 101 corresponding to the mirror 230.

Each driving electrode 101 may have a fan shape obtained by dividing a circle concentric to the mirror 230 into four parts, as in the conventional micromirror device shown in FIGS. 61 and 62. The driving electrodes 101 may be formed on the upper surface of a projecting portion provided on the upper surface of the base portion 310, as in the prior art.

The mirror 230 of the micromirror device shown in FIG. 26 rotates due to an electrostatic attraction generated by the potential difference between the mirror 230 and the driving electrodes 101. For example, the mirror 230 is grounded. Predetermined positive voltages (driving voltages) are applied to the driving electrodes 101 via the driving electrode electrical interconnections 201 so as to attract the mirror 230 by an electrostatic attraction and rotate it in an arbitrary direction. To rotate the mirror 230 in a desired direction, driving voltages are separately applied to the four driving electrodes 101 to generate potential differences between them.

The mirror 230 stands still when the electrostatic attraction balances the restoring force of springs (the mirror connectors 221a and 221b and the gimbal connectors (not shown)) supporting the mirror 230. If the spring constants of the mirror connectors 221a and 221b and the gimbal connectors can be regarded constant, theoretically, the tilt angle of the mirror 230 is uniquely determined by applying predetermined driving voltages to the driving electrodes 101.

A method of manufacturing the micromirror device according to this embodiment will be described below. A method of manufacturing the mirror substrate 200 will be described first. The mirror substrate 200 is prepared using a SOI substrate. Using a SOI substrate as a starting substrate, the gimbal 220, mirror 230, gimbal connectors, and mirror connectors 221a and 221b are formed on the SOI layer by a known lithography technique.

In the step of manufacturing the mirror substrate 200, first, a photosensitive resist is applied to the SOI layer in a desired thickness by spin coating. A reticle (mask) having a light-shielding body in a shape conforming to a pattern is aligned with the substrate having the photosensitive resist and held. The reticle is irradiated with light having the photosensitive wavelength of the photosensitive resist so as to form an image corresponding to the silhouette of the light-shielding body on the wafer with the photosensitive resist. The irradiation is performed after determining the light irradiation time for obtaining a desired pattern in a desired size. The resist with a latent image formed is immersed in a developer. After determining the time of immersing the wafer with resist in the developer so as to form a desired pattern in a desired size, the wafer is immersed in the developer for the determined time. After that, the entire wafer is dried to harden the resist. A resist pattern is formed on the SOI substrate thus far.

Using the formed resist as a mask, the frame portion 210, gimbal 220, mirror 230, gimbal connectors, mirror connectors 221a and 221b, and the like are formed on the SOI layer by DRIE (Deep Reactive Ion Etching) that is a deep engraving technique for silicon. At this time, an etching intermediate film may be used. Alternatively, the silicon may directly be processed using the resist as an etching mask. After etching the silicon, the photosensitive resist used as a mask is removed. After removal, the wafer is cleaned to expose a clean silicon surface.

Then, the base substrate (silicon base portion) is processed. First, a protective organic film is applied to the SOI surface side. A photosensitive resist or a film of, e.g., polyimide having known workability may be used as the organic film. Since this organic film needs to be removed finally, a film having high strippability and removability is preferably used. However, since a resist is used to process the lower surface while the protective film remains, it is essential to select a material that never poses a problem at that time.

After forming the organic film on the SOI surface, a photosensitive resist is applied to the lower surface of the base substrate on the opposite side of the SOI surface. When applying the photosensitive resist, the SOI surface side comes into contact with the sample table of the coater. However, since the organic film is deposited, there is no damage to the structure formed on the SOI surface. After applying the photosensitive resist, a reticle (mask) having a light-shielding body in a shape conforming to a desired pattern is aligned with the substrate having the photosensitive resist and, more particularly, with the structure on the SOI surface and held. The reticle is irradiated with light having the photosensitive wavelength of the photosensitive resist so as to form an image corresponding to the silhouette of the light-shielding body on the wafer with the photosensitive resist. The irradiation is performed after determining the light irradiation time for obtaining a desired pattern in a desired size. The resist with a latent image formed is immersed in a developer. After determining the time of immersing the wafer with resist in the developer so as to form a desired pattern in a desired size, the wafer is immersed in the developer for the determined time. After that, the entire wafer is dried to harden the resist. A resist pattern is formed on the base substrate thus far.

Using the formed resist as a mask, the silicon of the unnecessary base substrate on the lower side of a portion where the mirror 230 and the like are formed on the SOI layer is removed by DRIE that is a deep engraving technique for silicon. At this time, an etching intermediate film such as a silicon oxide film may be used. Alternatively, the silicon may directly be processed using the resist as an etching mask. After etching the silicon, the photosensitive resist used as a mask is removed. After removal, the wafer is cleaned to expose a clean surface.

FIGS. 27A to 27D and 28A to 28D are sectional views showing steps in depositing a metal film on the mirror surface according to this embodiment. The sectional views illustrate steps after the unnecessary base substrate has been removed by etching, and the wafer has been cleaned.

Figure 27A:
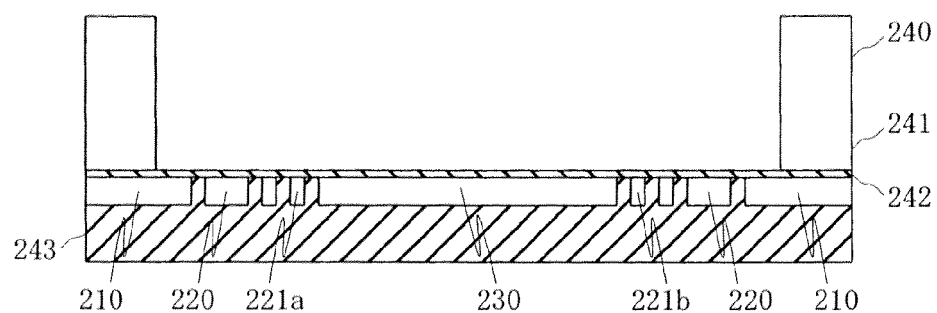
FIGS. 27A to 27D are sectional views showing steps in depositing a metal film on a mirror surface according to the eighth embodiment of the present invention.

As shown in FIG. 27A, the frame portion 210, gimbal 220, mirror 230, mirror connectors 221a and 221b, and gimbal connectors (not shown) are formed on the SOI layer. A frame member 240 is formed by etching an unnecessary base substrate (silicon base portion) 241 on the lower side of a portion where the frame portion 210, gimbal 220, mirror 230, mirror connectors 221a and 221b, gimbal connectors, and the like are formed. A protective organic film 243 is formed on the SOI surface side.

Figure 27B:
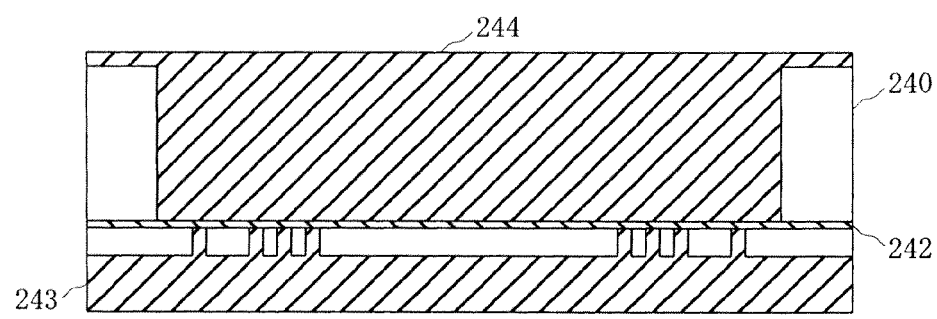

As shown in FIG. 27B, a resist 244 is applied again. To apply the resist 244 into the etched portion of the silicon base portion 241, the resist 244 is applied to be thicker than the silicon base portion 241, or applied using a spray resist coater use of which has started in recent years. In the example shown in FIG. 27B, the resist 244 is applied thick by the conventional method.

Figure 27C:
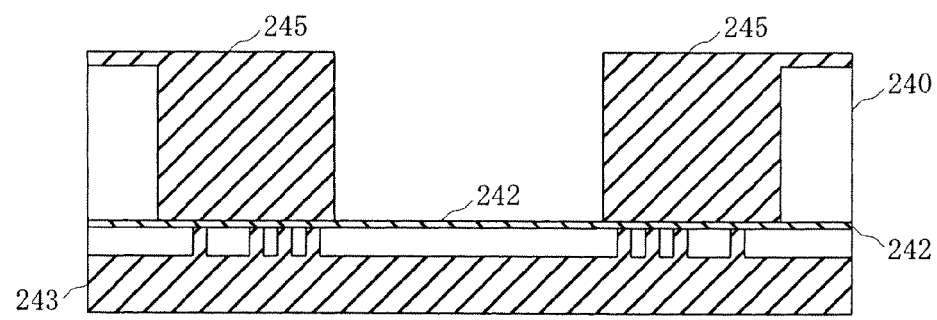

After applying the photosensitive resist 244, a reticle (mask) having a light-shielding body in a shape conforming to a desired pattern is aligned with the substrate having the resist 244 and, more particularly, with the structure on the SOI surface and held. The reticle is irradiated with light having the photosensitive wavelength of the resist 244 so as to form an image corresponding to the silhouette of the light-shielding body on the wafer with the resist 244. The irradiation is performed after determining the light irradiation time for obtaining a desired pattern in a desired size. The resist 244 with a latent image formed is immersed in a developer. After determining the time of immersing the wafer with resist in the developer so as to form a desired pattern in a desired size, the wafer is immersed in the developer for the determined time. After that, the entire wafer is dried to harden the resist 244. A resist pattern 245 is formed on the lower surface of the base substrate thus far (FIG. 27C). As shown in FIG. 27C, the resist pattern 245 has an opening in a region facing the mirror 230. Note that a more vertical, higher-quality pattern can be formed by not a pattern forming technique using a single resist layer but a pattern forming technique using multiple resist layers.

Figure 27D:
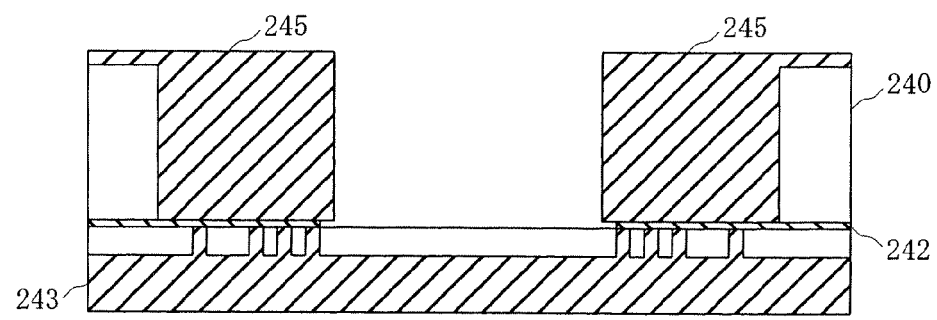

Using the resist pattern 245 as a mask, a BOX layer 242 made of a silicon oxide film is etched using a hydrofluoric acid-based solution such as buffered hydrofluoric acid. When a hydrofluoric acid-based solution is used, isotropic etching occurs. For this reason, the BOX layer 242 under the edges of the resist pattern 245 is also etched in the horizontal direction as much as the vertical thickness of the BOX layer 242. Hence, the etching of the BOX layer 242 progresses horizontally from the edges of the resist pattern 245, and a structure with the resist pattern 245 projecting from the BOX layer 242 can be formed, as shown in FIG. 27D. The BOX layer 242 is preferably thicker than the metal film to be deposited on the mirror surface. The thickness of the metal film necessary for reflecting infrared rays is preferably 50 nm or more and, more preferably, 100 nm or more. Hence, making allowance for errors, the thickness of the BOX layer 242 is preferably 1 μm or more. Note that when the etching should progress horizontally by more than the thickness of the BOX layer 242, the etching amount can be controlled by over etching.

Figure 28A:
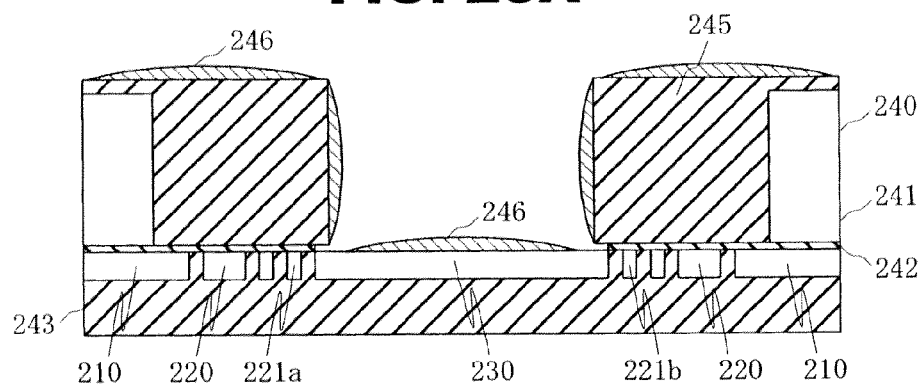
FIGS. 28A to 28D are sectional views showing steps in depositing a metal film on a mirror surface according to the eighth embodiment of the present invention.

After etching the BOX layer 242, a metal film 246 of gold or the like is deposited by sputtering or deposition (FIG. 28A). Since the mirror 230 is formed from silicon, gold is deposited directly or after an underlying metal such as titanium or chromium is deposited to improve the adhesion between gold and silicon. When depositing different metal films, they are preferably continuously deposited without extracting the wafer from the vacuum apparatus.

Figure 28B:
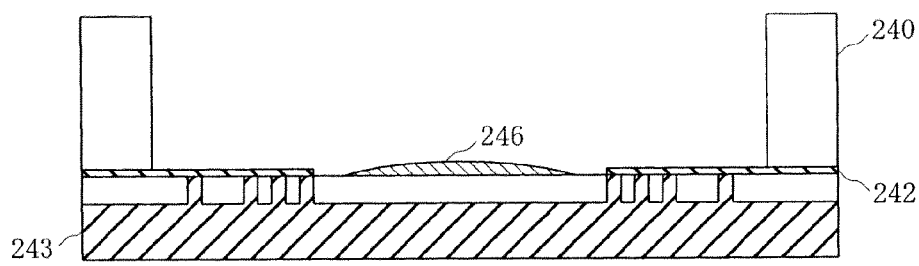

After depositing the metal film 246, the resist pattern 245 is stripped together with the metal film 246 adhered to it (FIG. 28B). In this case, the resist pattern 245 is stripped using a resist stripper such as N-methylpyrrolidone. The type of the resist stripper can freely be selected in accordance with the resist in use, as a matter of course. When the resist is applied thick, it can easily be stripped by the stress of the thick resist.

Figure 28C:
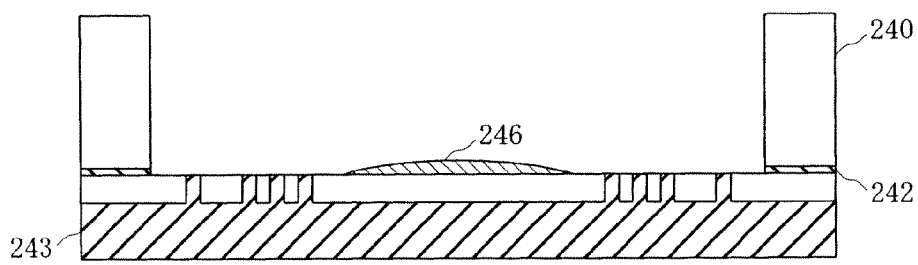

Next, the BOX layer 242 exposed after the stripping of the resist pattern 245 is etched using a hydrofluoric acid-based solution such as buffered hydrofluoric acid (FIG. 28C). The metal film 246 is thus locally deposited in a desired region of the mirror 230.

Figure 28D:
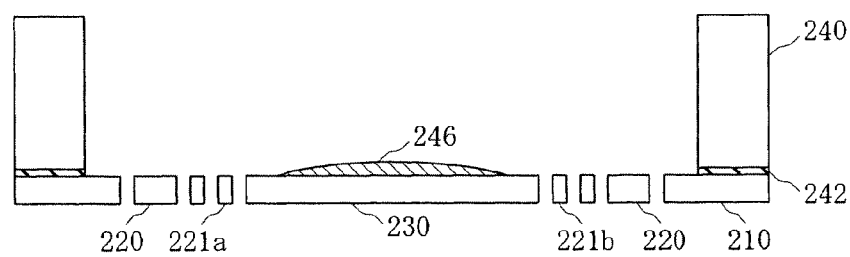

Finally, the organic film 243 that protects the mirror structure and the like is removed by etching, thereby forming a rotatable structure (FIG. 28D). When a plurality of chips are formed on the wafer, a process called dicing is performed to cut the wafer and separate the chips. After that, the organic film 243 is removed by etching. Note that forming protective films on both surfaces of the substrate at the time of dicing allows to prevent damage to the structures such as the mirror connectors 221a and 221b and the gimbal connectors. Forming a plurality of chips on a wafer is more general than forming only one chip on a wafer. The mirror substrate 200 having the rotatable mirror 230 is formed in the above-described way.

A method of manufacturing the electrode substrate 301 will be described next. FIGS. 29A to 29G and 30A to 30F are sectional views showing steps in the manufacture of the electrode substrate 301.

Figure 29A:
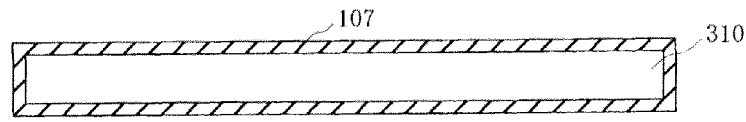
FIGS. 29A to 29G are sectional views showing steps in the manufacture of an electrode substrate according to the eighth embodiment of the present invention.
Figure 29B:
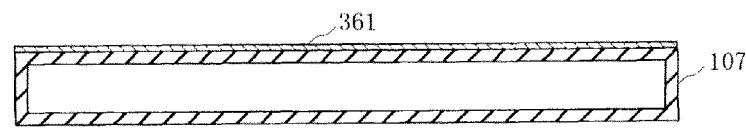
Figure 29C:
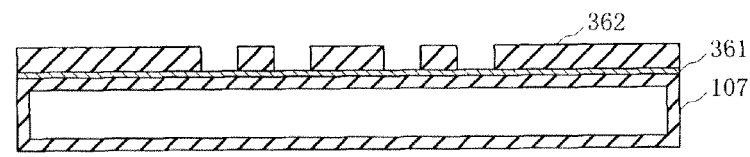

First, the insulating film 107 made of a thermal oxide film is formed on the surface of the base portion 310 made of silicon (FIG. 29A). A metal sputtering film is deposited on the surface of the insulating film 107, and used as a first seed layer 361 of the succeeding plating process (FIG. 29B). Then, a resist is applied to form a resist pattern 362 necessary for forming the driving electrode electrical interconnections 201 by a known lithography technique (FIG. 29C).

Figure 29D:
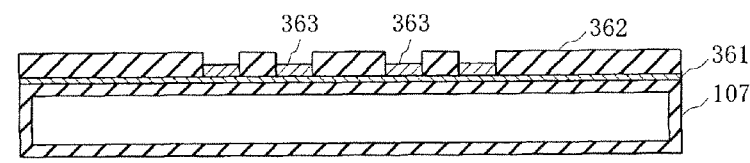
Figure 29E:
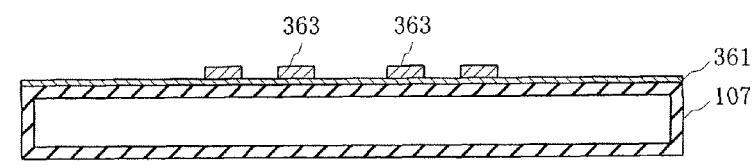
Figure 29F:
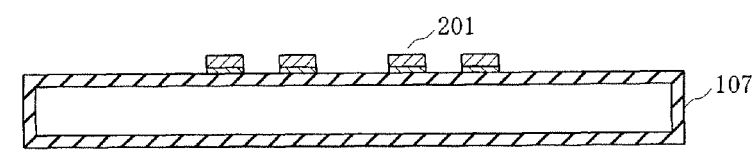

A metal film 363 made of, for example, gold is grown by plating using the resist pattern 362 as a mask (FIG. 29D). After forming the metal film 363, the resist pattern 362 used as a mask is stripped, and the substrate is cleaned (FIG. 29E). Then, the unnecessary first seed layer 361 is removed by etching (FIG. 29F). The driving electrode electrical interconnections 201 formed from the first seed layer 361 and the metal film 363 are thus formed on the insulating film 107.

Figure 29G:
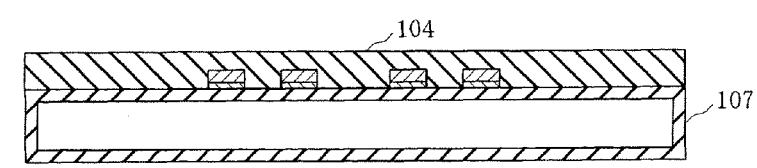

Subsequently, the insulating film 104 formed from, for example, a silicon oxide film is deposited by CVD (Chemical Vapor Deposition) or the like so as to cover the driving electrode electrical interconnections 201 on the insulating film 107 (FIG. 29G). At this time, if the planarity of the surface of the insulating film 104 is poor, a planarization process is executed after depositing the insulating film 104.

Figure 30A:
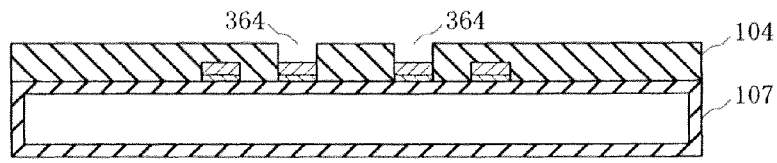
FIGS. 30A to 30F are sectional views showing steps in the manufacture of an electrode substrate according to the eighth embodiment of the present invention.

A resist is applied to the insulating film 104 by spin coating. A resist pattern to be used to form the interlayer vertical electrical interconnections 108 is formed by a known lithography technique. The insulating film 104 is etched by a known etching technique using the resist pattern as a mask, thereby forming vertical holes 364 to be used to form the interlayer vertical electrical interconnections 108 up to such a depth that reaches the driving electrode electrical interconnections 201 (FIG. 30A). The resist that covers the surface is stripped after formation of the vertical holes 364, and the substrate is cleaned to make its surface clean.

Figure 30B:
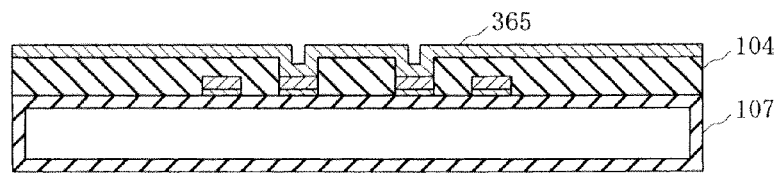
Figure 30C:
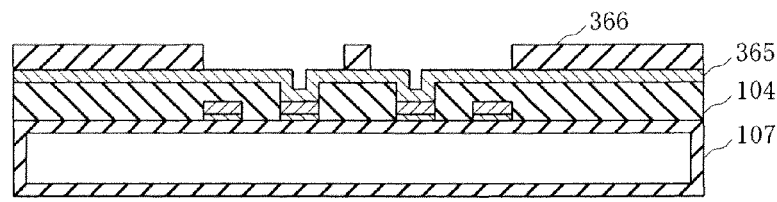
Figure 30D:
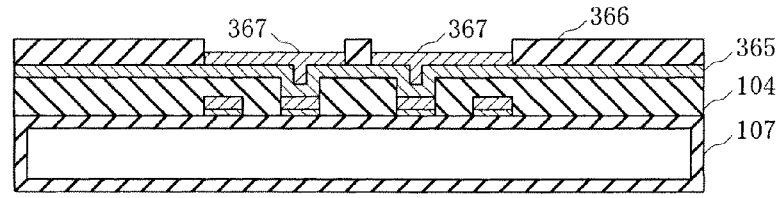
Figure 30E:
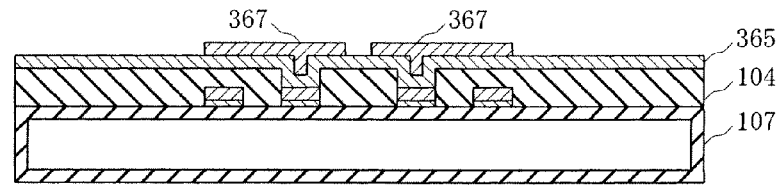
Figure 30F:
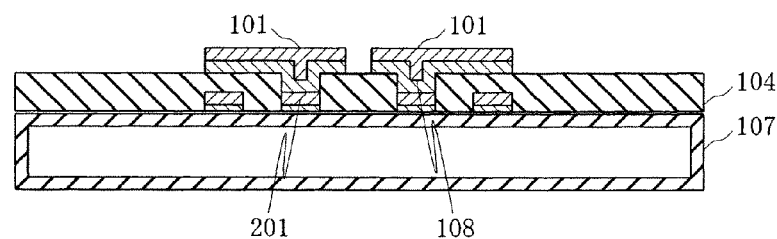

A metal sputtering film is deposited on the surface of the insulating film 104, and used as a second seed layer 365 of the succeeding plating process (FIG. 30B). A resist is applied to form, by a known lithography technique, a resist pattern 366 to be used to form the interlayer vertical electrical interconnections 108 and the driving electrodes 101 (FIG. 30C). A metal film 367 made of, for example, gold is formed by plating using the resist pattern 366 as a mask (FIG. 30D). After the resist pattern 366 is stripped (FIG. 30E), the unnecessary second seed layer 365 is removed by etching (FIG. 30F). The substrate is cleaned again to make its surface clean. The driving electrodes 101 and the interlayer vertical electrical interconnections 108 that connect the driving electrodes 101 to the driving electrode electrical interconnections 201 are thus formed from the metal film 367 and the second seed layer 365.

A thick resist is applied by spin coating. A resist pattern to be used to form the convex portions 360a and 360b is formed by a known lithography technique. The convex portions 360a and 360b are formed by plating using the resist pattern as a mask. After that, the resist that covers the surface is stripped, and the substrate is cleaned to make its surface clean. The electrode substrate 301 is formed in the above-described way.

An example of formation of the electrode substrate 301 has been described above. The interlayer vertical electrical interconnection formation and the electrode structure formation may be separate processes. If an electrical connection state can reliably be ensured, the electrode substrate 301 may be formed without depositing the second seed layer. A metal may be deposited on the driving electrodes 101 by plating to form a driving electrode structure having a terraced surface.

Finally, the mirror substrate 200 and the electrode substrate 301 are aligned with each other. The upper surfaces of the convex portions 360*a* and 360*b* of the electrode substrate 301 are soldered. The solder is melted by heating to bond the mirror substrate 200 to the electrode substrate 301. The micromirror device is thus completed.

As described above, in this embodiment, a structure with the resist pattern 245 projecting from the BOX layer 242 is formed in the process of forming the metal film 246 on the surface of the mirror 230. This makes it possible to form the metal film 246 while separating the metal film 246 adhered to the side walls of the resist pattern 245 and the metal film 246 deposited on the surface of the mirror 230 exposed to the opening portion of the resist pattern 245, as shown in FIG. 28A. For this reason, the metal film 246 deposited on the surface of the mirror 230 is not damaged when the resist pattern 245 is removed by stripping (lift off). In this embodiment, it is therefore possible to form a mirror surface having a fine surface shape without generating burrs at the edge of the metal film 246 deposited on the surface of the mirror 230.

Figure 31A:
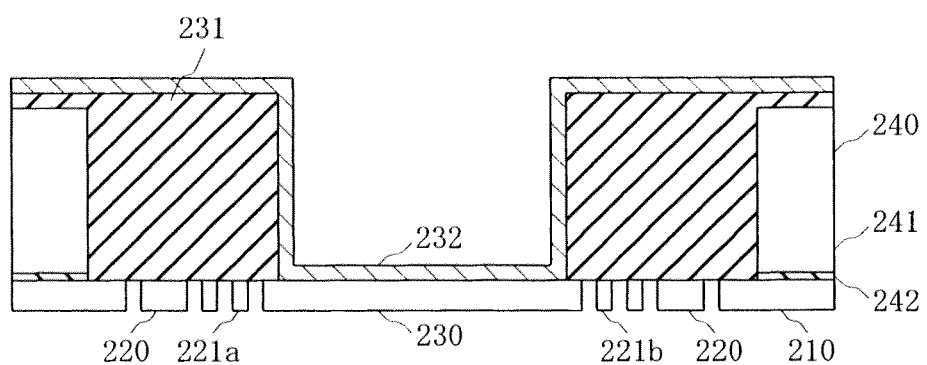
FIGS. 31A and 31B are sectional views showing steps in depositing a metal film on the mirror surface in a conventional micromirror device.
Figure 31B:
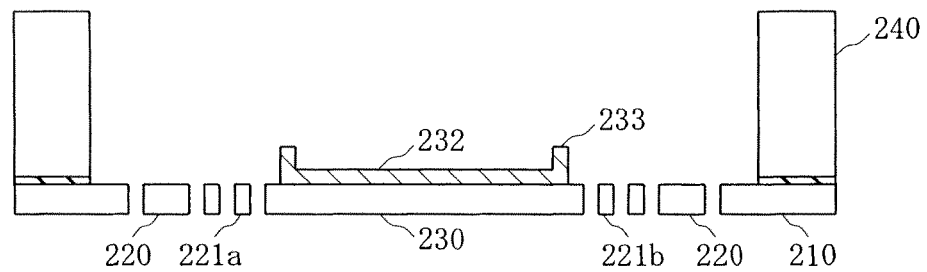

FIGS. 31A and 31B are sectional views showing steps in depositing a metal film on the mirror surface in a conventional micromirror device. To locally form a metal film on the surface of the mirror 230, the silicon base portion 241 and the BOX layer 242 are removed by etching. After that, a resist is applied and exposed to form a resist pattern 231 as shown in FIG. 31A. After a metal film 232 is deposited on the substrate surface with the resist pattern 231, the resist pattern 231 is removed by stripping (lift off), thereby leaving the metal film 232 only on the surface of the mirror 230, as shown in FIG. 31B.

However, the metal film 232 is normally formed even on the side surface of the resist pattern 231, as shown in FIG. 31A. The metal film 232 on the side surface is not separated from that formed on the surface on the mirror 230. For this reason, when removing the resist pattern 231 by stripping, burrs 233 are generated at the edge of the metal film 232 remaining on the surface of the mirror 230, as shown in FIG. 31B. To prevent the metal film from adhering to the side surface of the resist pattern, a resist pattern having a reverse tapered structure may be formed. However, since the resist pattern is as thick as the silicon base portion of the SOI substrate, even a kind of reverse tapered structure cannot prevent the metal film from adhering to the side surface of the resist pattern.

On the other hand, according to this embodiment, it is possible to form a mirror surface having a fine surface shape, as described above.

Additionally, in the conventional micromirror device, the metal film is deposited not only on the mirror surface but also on the mirror connectors that support the mirror and the gimbal connectors that support the gimbal. However, the metal film formed on the surfaces of the connectors changes the spring constants of the connectors over time, and thus causes drift that gradually changes the mirror tilt angle.

On the other hand, in this embodiment, no metal film is formed on the surfaces of the mirror connectors and those of the gimbal connectors. This allows to suppress drift of the mirror tilt angle.

[Ninth Embodiment]

The ninth embodiment of the present invention will be described next. The arrangement of a micromirror device according to this embodiment is the same as in the eighth embodiment, and a description thereof will be made using the reference numerals in FIG. 26.

A method of manufacturing the micromirror device according to this embodiment will be described below. A method of manufacturing a mirror substrate 200 will be described first. The processes up to forming a frame portion 210, gimbal 220, mirror 230, mirror connectors 221*a* and 221*b*, and gimbal connectors on the SOI layer are the same as in the eighth embodiment.

After forming the frame portion 210, gimbal 220, mirror 230, mirror connectors 221*a* and 221*b*, and gimbal connectors, the photosensitive resist used as a mask is removed, and the wafer is cleaned to expose a clean silicon surface.

A resist is applied to the SOI surface side again. A resist pattern is formed by a known lithography technique so as to remove the resist only on the surface of the mirror 230 on which a metal should be deposited. After a metal film of, for example, gold is deposited, the resist is removed by stripping together with an unnecessary metal. The substrate is cleaned to make its surface clean.

After that, the base substrate (silicon base portion) is processed. First, as in the eighth embodiment, a protective organic film is applied to the SOI surface side. Then, a resist pattern to be used to remove the silicon base portion by etching is formed.

Using the formed resist pattern as a mask, the silicon of the unnecessary base substrate on the lower side of a portion where the mirror 230 and the like are formed on the SOI layer is removed by DRIE that is a deep engraving technique for silicon. After etching the silicon, the photosensitive resist used as a mask is removed. After removal, the wafer is cleaned to expose a clean surface.

FIGS. 32A to 32D and 33A to 33D are sectional views showing steps in depositing a metal film on the mirror surface according to this embodiment. The sectional views illustrate steps after the unnecessary base substrate has been removed by etching, and the wafer has been cleaned.

Figure 32A:
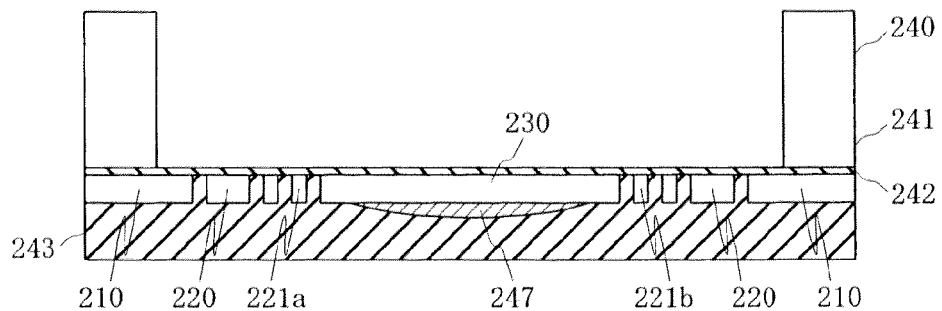
FIGS. 32A to 32D are sectional views showing steps in depositing a metal film on a mirror surface according to the ninth embodiment of the present invention.

As shown in FIG. 32A, the frame portion 210, gimbal 220, mirror 230, mirror connectors 221*a* and 221*b*, and gimbal connectors (not shown) are formed on the SOI layer. A frame member 240 is formed by etching an unnecessary base substrate (silicon base portion) 241 on the lower side of a portion where the frame portion 210, gimbal 220, mirror 230, mirror connectors 221*a* and 221*b*, gimbal connectors, and the like are formed. A protective organic film 243 is formed on the SOI surface side. A metal film 247 is formed on the surface of the mirror 230.

Figure 32B:
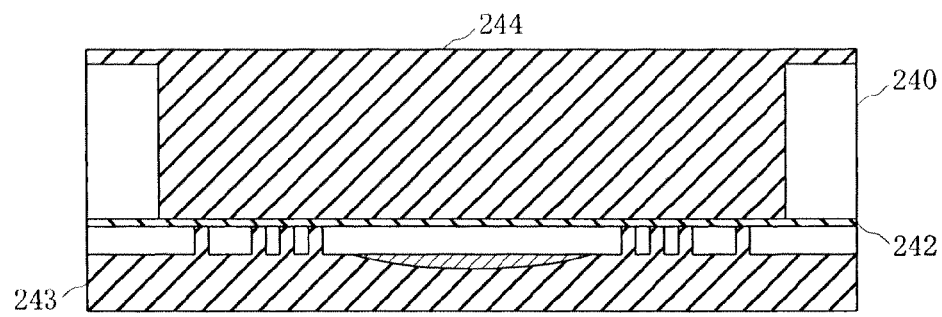
Figure 32C:
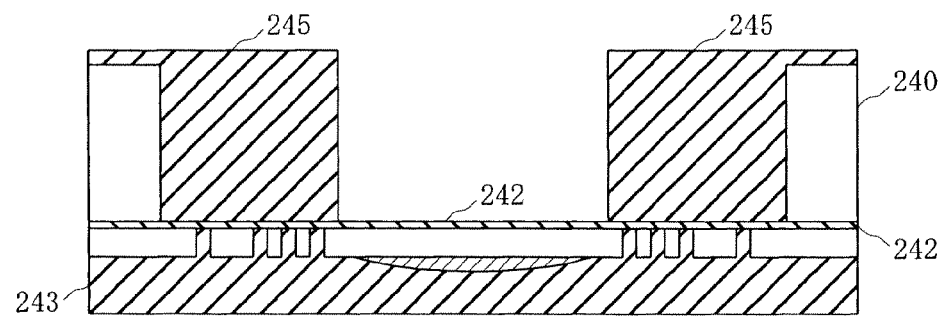
Figure 32D:
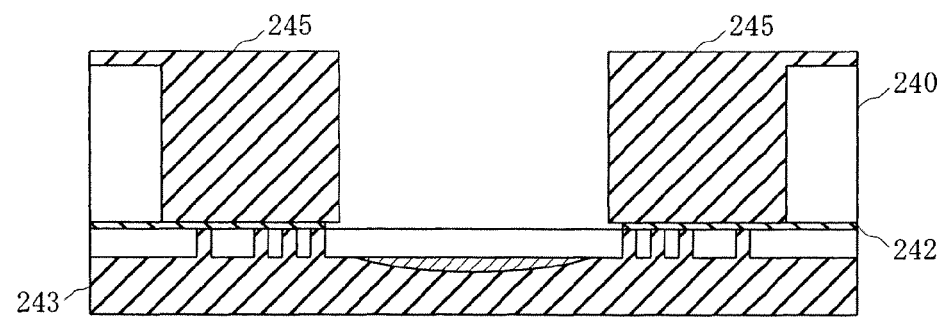

As shown in FIG. 32B, a resist 244 is applied again. A resist pattern 245 is formed on the lower surface of the base substrate by a known lithography technique (FIG. 32C). Using the resist pattern 245 as a mask, a BOX layer 242 made of a silicon oxide film is etched using a hydrofluoric acid-based solution such as buffered hydrofluoric acid. As in the eighth embodiment, after the BOX layer 242 on the mirror 230 has been etched, over etching is performed to some extent (FIG. 32D).

Figure 33A:
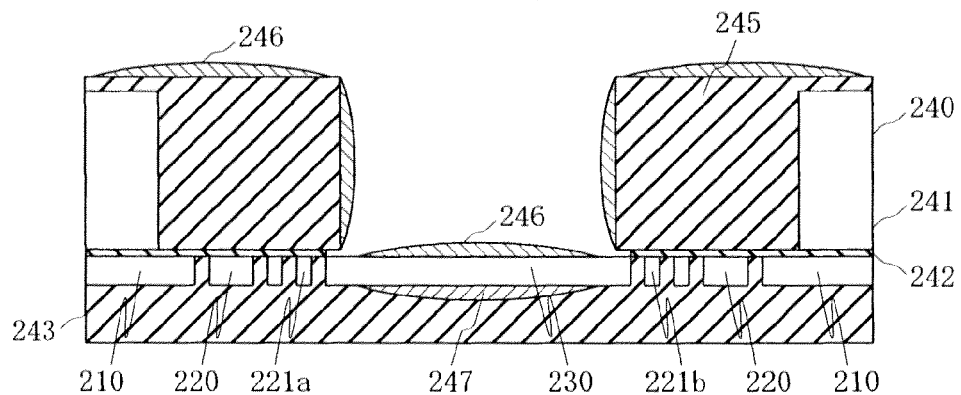
FIGS. 33A to 33D are sectional views showing steps in depositing a metal film on a mirror surface according to the ninth embodiment of the present invention.
Figure 33B:
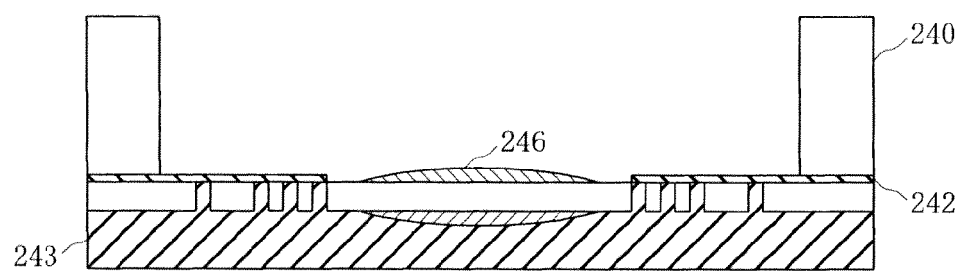
Figure 33C:
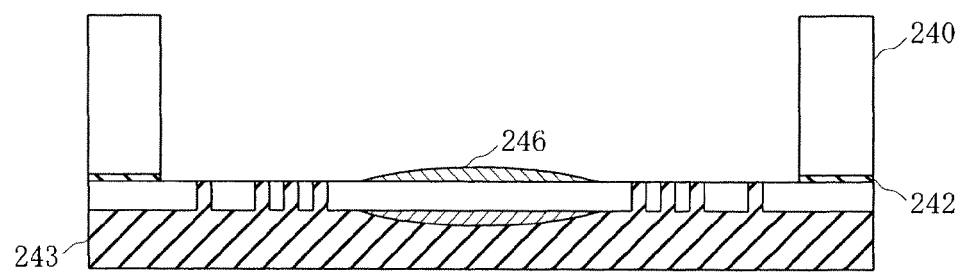

After etching the BOX layer 242, a metal film 246 of gold or the like is deposited by sputtering or deposition (FIG. 33A). After depositing the metal film 246, the resist pattern 245 is stripped together with the metal film 246 adhered to it (FIG. 33B). Next, the BOX layer 242 exposed after the stripping of the resist pattern 245 is etched using a hydrofluoric acid-based solution such as buffered hydrofluoric acid (FIG. 33C). The metal film 246 is thus locally deposited in a desired region of the mirror 230.

Figure 33D:
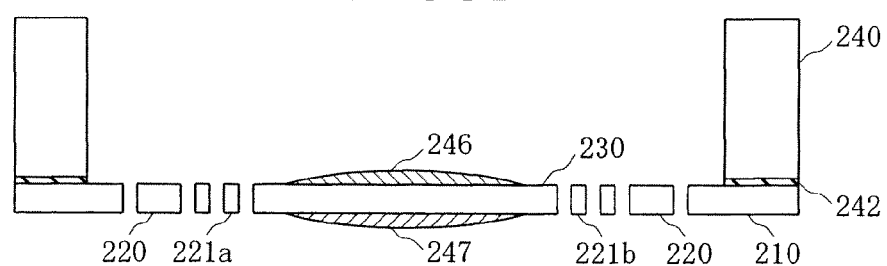

Finally, the organic film 243 that protects the mirror structure and the like is removed by etching, thereby forming a rotatable structure (FIG. 33D). When a plurality of chips are formed on the wafer, a process called dicing is performed to cut the wafer and separate the chips. After that, the organic film 243 is removed by etching. The mirror substrate 200 having the rotatable mirror 230 is formed in the above-described way.

A method of manufacturing an electrode substrate 301 is the same as in the eighth embodiment, and a description thereof will not be repeated. Finally, the mirror substrate 200 and the electrode substrate 301 are aligned with each other. The upper surfaces of convex portions 360a and 360b of the electrode substrate 301 are soldered. The solder is melted by heating to bond the mirror substrate 200 to the electrode substrate 301. The micromirror device is thus completed.

As described above, according to this embodiment, the metal films 246 and 247 are formed on both surfaces of the mirror 230, respectively. This makes it possible to cancel the stresses acting on the mirror 230, which are generated by the metal films formed on the surfaces of the mirror 230. As a result, in this embodiment, bending of the mirror 230 can be suppressed. To suppress bending of the mirror 230, the metal films 246 and 247 are preferably deposited on both surfaces of the mirror 230 by controlling their thicknesses under the same conditions. However, after forming the metal film 247 first, the bending state of the mirror 230 changes due to the quenching effect produced by, e.g., a temperature rise during the process. In this case, it is important to deposit the metal film 246 after determining the conditions for compensating for the bending amount of the mirror 230, instead of forming the film under the same conditions.

Note that in the micromirror devices according to the eighth and ninth embodiments, gold (Au) is used as the material of the driving electrode electrical interconnections 201, driving electrodes 101, and convex portions 360a and 360b. However, the present invention is not limited to this. As the conductive material of these electrical interconnections, electrodes, and convex portions, aluminum (Al), tungsten (W), tantalum (Ta), titanium (Ti), copper (Cu), tin (Sn), silver (Ag), or a compound thereof is usable. Alternatively, a semiconductor material such as silicon may be used.

In the eighth and ninth embodiments, the structure of the conductive material is formed using plating. However, any other known film deposition technique such as sputtering, CVD, or deposition is usable without any problem as long as it can deposit a conductive film to a desired thickness.

[10th Embodiment]

Figure 34:
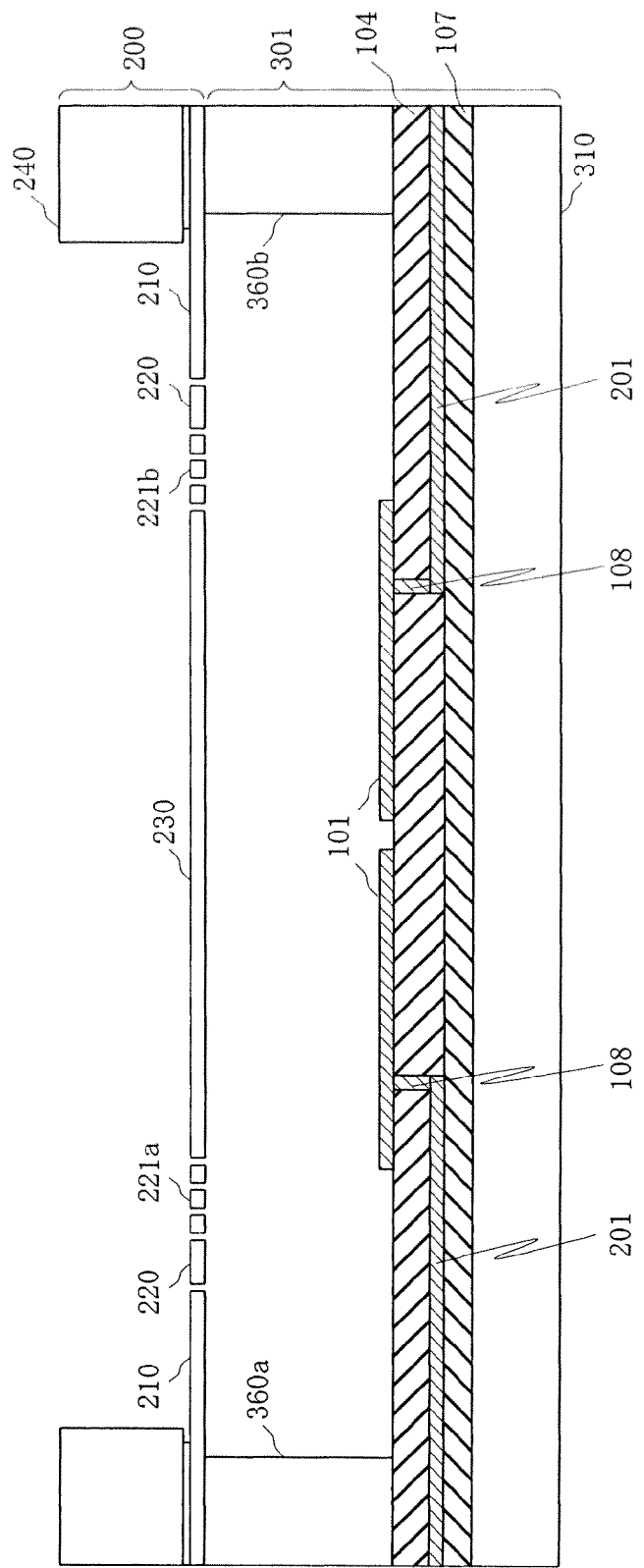
FIG. 34 is a sectional view showing the arrangement of a micromirror device according to the 10th embodiment of the present invention.

The 10th embodiment of the present invention will be described next. FIG. 34 is a sectional view of a micromirror device that is an electrostatically driven MEMS device according to the 10th embodiment of the present invention. Note that a mirror array is formed by one- or two-dimensionally disposing a plurality of micromirror devices shown in FIG. 34. The micromirror device according to this embodiment has a structure in which a mirror substrate 200 having a mirror and an electrode substrate 301 having electrodes are disposed in parallel.

The mirror substrate 200 has almost the same structure as that of the mirror substrate of the conventional micromirror device shown in FIGS. 61 and 62. The mirror substrate 200 includes a plate-shaped frame portion 210 having an opening with an almost circular shape viewed from above, a gimbal 220 having an opening with an almost circular shape viewed from above and disposed in the opening of the frame portion 210 via a pair of gimbal connectors (not shown), and a mirror 230 serving as a movable member having an almost circular shape viewed from above and disposed in the opening of the gimbal 220 via a pair of mirror connectors 221a and 221b. The gimbal 220 can rotate about a gimbal rotation axis which passes through the pair of gimbal connectors (not shown). Similarly, the mirror 230 can rotate about a mirror rotation axis which passes through the pair of mirror connectors 221a and 221b. The gimbal rotation axis and the mirror rotation axis are perpendicular to each other. As a result, the mirror 230 rotates about the two axes perpendicular to each other. Note that although a metal film is formed on the surface of the mirror 230, as will be described later, the metal film is not illustrated in FIG. 34.

The electrode substrate 301 includes a plate-shaped base portion 310 made of, for example, single-crystal silicon, and convex portions 360a and 360b projecting from the surface (upper surface) of the base portion 310 to be bonded to the mirror substrate 200 on the opposite side. An insulating film 107 is formed on the surface of the electrode substrate 301 where the convex portions 360a and 360b are provided. The insulating film 107 has a function of preventing driving electrode electrical interconnections 201 (to be described later) from making an electrical short circuit via the base portion 310 made of a semiconductor such as silicon.

When a silicon substrate is used as the electrode substrate 301, a silicon oxide film is generally used as the insulating film 107. An unprocessed bare silicon substrate is cleaned as needed to make its surface clean, and then thermally oxidized in a thermal oxidation furnace, thereby forming the insulating film 107. A thermal oxide film formed by thermal oxidation out of silicon oxide film forming methods is known to be superior in quality and dielectric breakdown voltage characteristic to, e.g., a silicon oxide film deposited using CVD (Chemical Vapor Deposition) or the like.

The driving electrode electrical interconnections 201 which supply voltages to driving electrodes 101 are formed on the upper surface of the insulating film 107. The driving electrode electrical interconnections 201 are connected, via bonding pads (not shown), to predetermined pins of a package that packages the micromirror device or the mirror array. When a predetermined DC voltage is applied to a pin of the package, the voltage is applied to the driving electrode 101 in a one-to-one correspondence with that pin so that the mirror 230 can rotate. To form the driving electrode electrical interconnections 201, for example, a metal thin film on the insulating film 107 is processed by a known etching technique.

In addition, an insulating film 104 made of a dielectric is formed on the upper surface of the insulating film 107 so as to cover the driving electrode electrical interconnections 201. The driving electrodes 101 for driving the mirror 230 of the mirror substrate 200 on the opposite side are formed on the upper surface of the insulating film 104. The driving electrodes 101 are connected to the driving electrode electrical interconnections 201 via interlayer vertical electrical interconnections 108 that extend through the insulating film 104. Note that the vertical holes formed for the interlayer vertical electrical interconnections are sometimes referred to as via holes, and interlayer vertical electrical interconnections formed by filling the vertical holes with a metal are sometimes referred to as vias.

The mirror substrate 200 and the electrode substrate 301 described above constitute the micromirror device shown in FIG. 34 by bonding the lower surface of the frame portion 210 to the upper surfaces of the convex portions 360a and 360b so that the mirror 230 faces the driving electrodes 101 corresponding to the mirror 230.

Each driving electrode 101 may have a fan shape obtained by dividing a circle concentric to the mirror 230 into four parts, as in the conventional micromirror device shown in FIGS. 61 and 62. The driving electrodes 101 may be formed on the upper surface of a projecting portion provided on the upper surface of the base portion 310, as in the prior art.

The mirror 230 of the micromirror device shown in FIG. 24 rotates due to an electrostatic attraction generated by the potential difference between the mirror 230 and the driving electrodes 101. For example, the mirror 230 is grounded. Predetermined positive voltages (driving voltages) are applied to the driving electrodes 101 via the driving electrode electrical interconnections 201 so as to attract the mirror 230 by an electrostatic attraction and rotate it in an arbitrary direction. To rotate the mirror 230 in a desired direction, different driving voltages are applied to the four driving electrodes 101 to generate potential differences between them.

The mirror 230 stands still when the electrostatic attraction balances the restoring force of springs (the mirror connectors 221a and 221b and the gimbal connectors (not shown)) supporting the mirror 230. If the spring constants of the mirror connectors 221a and 221b and the gimbal connectors can be regarded constant, theoretically, the tilt angle of the mirror 230 is uniquely determined by applying predetermined driving voltages to the driving electrodes 101.

A method of manufacturing the micromirror device according to this embodiment will be described below. A method of manufacturing the mirror substrate 200 will be described first. The mirror substrate 200 is prepared using a SOI substrate. Using a SOI substrate as a starting substrate, the gimbal 220, mirror 230, gimbal connectors, and mirror connectors 221a and 221b are formed on the SOI layer by a known lithography technique.

In the step of manufacturing the mirror substrate 200, first, a photosensitive resist is applied to the SOI layer in a desired thickness by spin coating. A reticle (mask) having a light-shielding body in a shape conforming to a pattern is aligned with the substrate having the photosensitive resist and held. The reticle is irradiated with light having the photosensitive wavelength of the photosensitive resist so as to form an image corresponding to the silhouette of the light-shielding body on the wafer with the photosensitive resist. The irradiation is performed after determining the light irradiation time for obtaining a desired pattern in a desired size. The resist with a latent image formed is immersed in a developer. After determining the time of immersing the wafer with resist in the developer so as to form a desired pattern in a desired size, the wafer is immersed in the developer for the determined time. After that, the entire wafer is dried to harden the resist. A resist pattern is formed on the SOI substrate thus far.

Using the formed resist as a mask, the frame portion 210, gimbal 220, mirror 230, gimbal connectors, mirror connectors 221a and 221b, and the like are formed on the SOI layer by DRIE (Deep Reactive Ion Etching) that is a deep engraving technique for silicon. At this time, an etching intermediate film may be used. Alternatively, the silicon may directly be processed using the resist as an etching mask. After etching the silicon, the photosensitive resist used as a mask is removed. After removal, the wafer is cleaned to expose a clean silicon surface.

Then, the base substrate (silicon base portion) is processed. First, a protective organic film is applied to the SOI surface side. A photosensitive resist or a film of, e.g., polyimide having known workability may be used as the organic film. Since this organic film needs to be removed finally, a film having high strippability and removability is preferably used. However, since a resist is used to process the lower surface while the protective film remains, it is essential to select a material that never poses a problem at that time.

After forming the organic film on the SOI surface, a photosensitive resist is applied to the lower surface of the base substrate on the opposite side of the SOI surface. When applying the photosensitive resist, the SOI surface side comes into contact with the sample table of the coater. However, since the organic film is deposited, there is no damage to the structure formed on the SOI surface. After applying the photosensitive resist, a reticle (mask) having a light-shielding body in a shape conforming to a desired pattern is aligned with the substrate having the photosensitive resist and, more particularly, with the structure on the SOI surface and held. The reticle is irradiated with light having the photosensitive wavelength of the photosensitive resist so as to form an image corresponding to the silhouette of the light-shielding body on the wafer with the photosensitive resist. The irradiation is performed after determining the light irradiation time for obtaining a desired pattern in a desired size. The resist with a latent image formed is immersed in a developer. After determining the time of immersing the wafer with resist in the developer so as to form a desired pattern in a desired size, the wafer is immersed in the developer for the determined time. After that, the entire wafer is dried to harden the resist. A resist pattern is formed on the base substrate thus far.

Using the formed resist as a mask, the silicon of the unnecessary base substrate on the lower side of a portion where the mirror 230 and the like are formed on the SOI layer is removed by DRIE that is a deep engraving technique for silicon. At this time, an etching intermediate film such as a silicon oxide film may be used. Alternatively, the silicon may directly be processed using the resist as an etching mask. After etching the silicon, the photosensitive resist used as a mask is removed.

Subsequently, a BOX layer formed from a silicon oxide film is removed by etching using a hydrofluoric acid-based solution such as buffered hydrofluoric acid. After removal of the silicon oxide film, the wafer is cleaned to expose a clean surface.

FIGS. 35A to 35D and 36A to 36C are sectional views showing steps in depositing a metal film on the mirror surface according to this embodiment. The sectional views illustrate steps after the unnecessary base substrate and the BOX layer have been removed by etching, and the wafer has been cleaned.

Figure 35A:
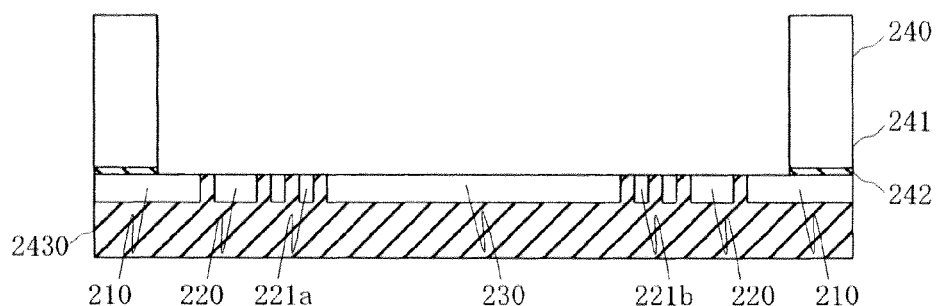
FIGS. 35A to 35D are sectional views showing steps in depositing a metal film on a mirror surface according to the 10th embodiment of the present invention.

As shown in FIG. 35A, the frame portion 210, gimbal 220, mirror 230, mirror connectors 221a and 221b, and gimbal connectors (not shown) are formed on the SOI layer. A frame member 240 is formed by etching an unnecessary base substrate (silicon base portion) 241 and a BOX layer 242 on the lower side of a portion where the frame portion 210, gimbal 220, mirror 230, mirror connectors 221a and 221b, gimbal connectors, and the like are formed. A protective organic film 2430 is formed on the SOI surface side.

Figure 35B:
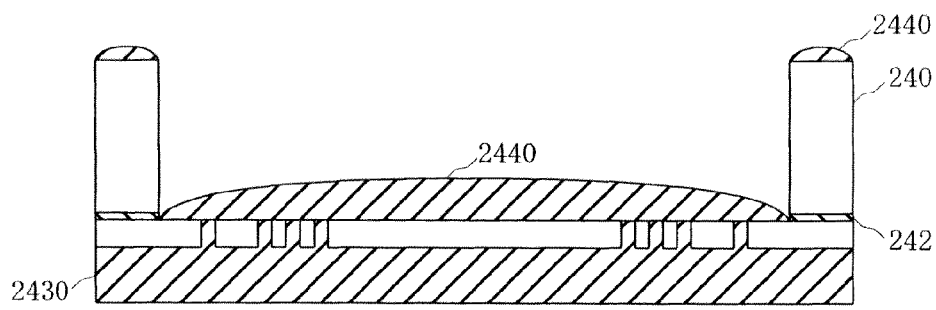

As shown in FIG. 35B, a negative resist 2440 is applied using a spray resist coater. The resist 2440 needs to be thinner than the silicon base portion 241 and thicker than a metal film to be deposited later. When gold is used for the metal film, a gold film having a thickness of about 50 to 200 nm is deposited. Hence, the resist 2440 preferably has a thickness of 500 nm or more. The optimum condition changes depending on the shape of the formed resist pattern and the gold deposition method. It is necessary to only form a resist pattern having a reverse tapered shape thicker by several tens percent than the metal film so as not to produce burrs or the like on the metal film at the time of stripping.

Figure 35C:
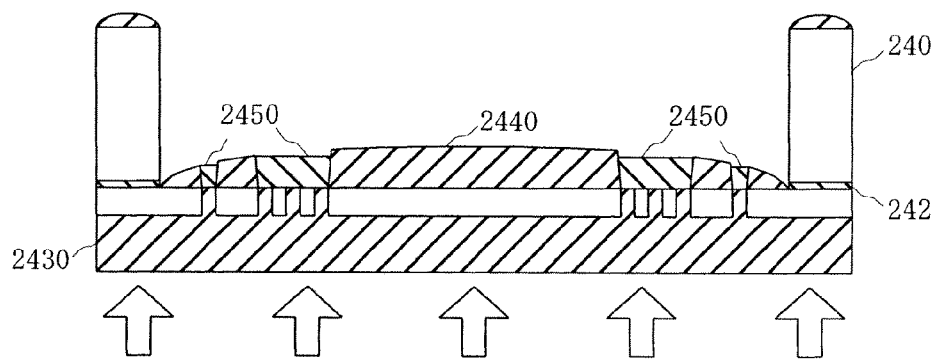

Subsequently, the photosensitive negative resist 2440 is exposed from the surface with the organic film 2430 (FIG. 35C). Reference numeral 2450 in FIG. 35C indicates an exposed portion. Since structures such as the frame portion 210, gimbal 220, mirror 230, mirror connectors 221a and 221b, and gimbal connectors are formed on the SOI layer, sufficiently thick silicon shields light. Light that has come through the gaps between these structures exposes the negative resist 2440. More specifically, the gaps between the structures indicate the portion between the mirror 230 and the mirror connectors 221a and 221b, the portion between the gimbal 220 and the mirror connectors 221a and 221b, the portion between the gimbal 220 and the gimbal connectors, the portion between the gimbal connectors and the frame portion 210, the portion between the mirror 230 and the gimbal 220, and the portion between the gimbal 220 and the frame portion 210. The irradiation is performed after determining the light irradiation time for obtaining a pattern in desired shape and size after development. When the exposure dose is increased, a wide region of the resist 2440 is exposed due to diffractions at the edges of the structures.

Since the mirror connectors 221a and 221b and the gimbal connectors are made of silicon, the resist 2440 existing on them is not supposed to be exposed. However, since the mirror connectors 221a and 221b and the gimbal connectors have thin line structures, the resist 2440 existing on them is exposed to light that has come through the gaps.

Figure 35D:
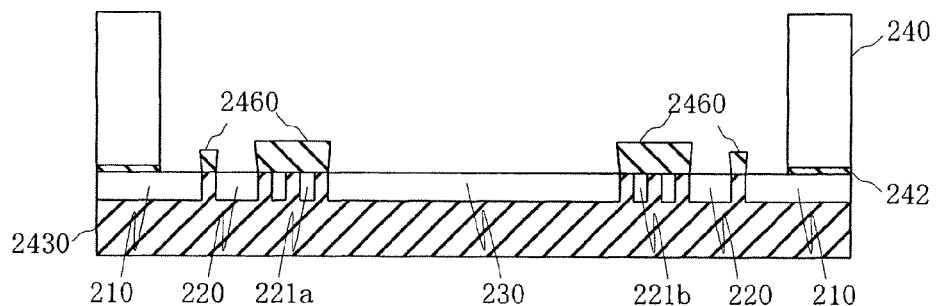

The resist 2440 with a latent image formed is immersed in a developer. After determining the time of immersing the wafer with resist in the developer so as to form a desired pattern in a desired size, the wafer is immersed in the developer for the determined time. After that, the entire wafer is dried to harden the resist 2440. A resist pattern 2460 having a reverse tapered shape which spreads as the distance from the SOI layer increases is formed on the lower surface of the base substrate thus far (FIG. 35D). The resist pattern 2460 has the reverse tapered shape because the resist 2440 is irradiated with spreading light that has come through the gaps between the structures. As shown in FIG. 35D, the resist pattern 2460 has opening regions facing the frame portion 210, gimbal 220, and mirror 230. As described above, since the resist 2440 on the mirror connectors 221a and 221b and the gimbal connectors is exposed to light that has come through the gaps between the structures, the resist pattern 2460 is formed on the mirror connectors 221a and 221b and the gimbal connectors. For this reason, in the process of depositing a metal film to be described later, no metal film is deposited on the mirror connectors 221a and 221b and the gimbal connectors. It is therefore possible to suppress drift of the tilt angle of the mirror 230.

Figure 36A:
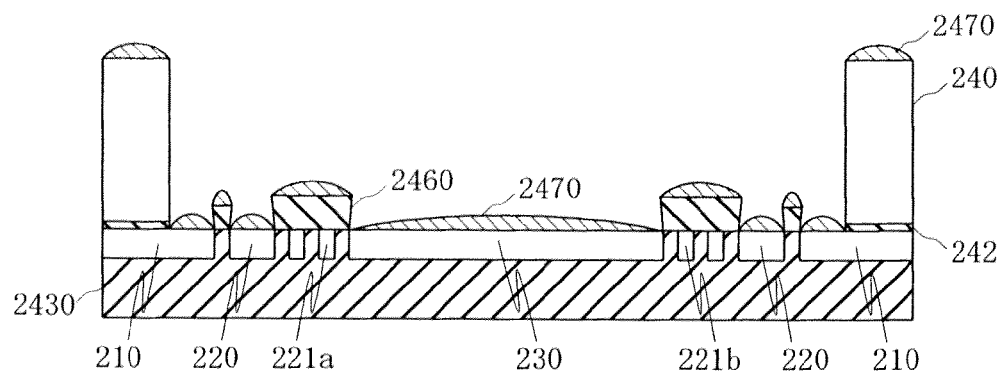
FIGS. 36A to 36C are sectional views showing steps in depositing a metal film on a mirror surface according to the 10th embodiment of the present invention.

Next, a metal film 2470 of gold or the like is deposited by sputtering or deposition (FIG. 36A). Since the frame portion 210, gimbal 220, and mirror 230 are formed from silicon, gold is deposited directly or after an underlying metal such as titanium or chromium is deposited to improve the adhesion between gold and silicon. When depositing different metal films, they are preferably continuously deposited without extracting the wafer from the vacuum apparatus.

Figure 36B:
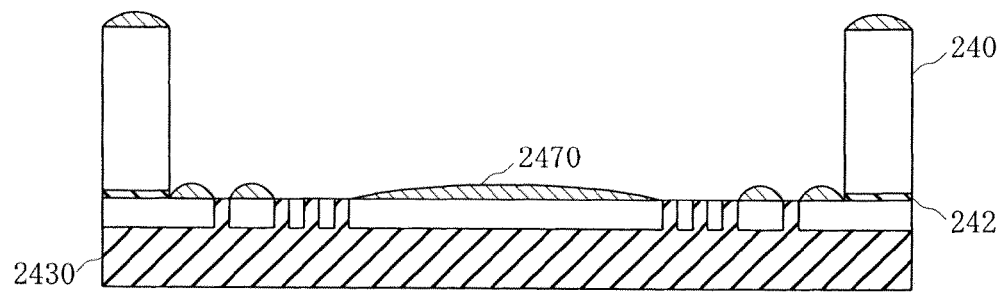

After depositing the metal film 2470, the resist pattern 2460 is stripped together with the metal film 2470 adhered to it (FIG. 36B). In this case, the resist pattern 2460 is stripped using a resist stripper such as N-methylpyrrolidone. The type of the resist stripper can freely be selected in accordance with the resist in use, as a matter of course. When the resist is applied thick, it can easily be stripped by the stress of the thick resist. After stripping the resist pattern 2460, the wafer is cleaned to obtain a clean surface.

Figure 36C:
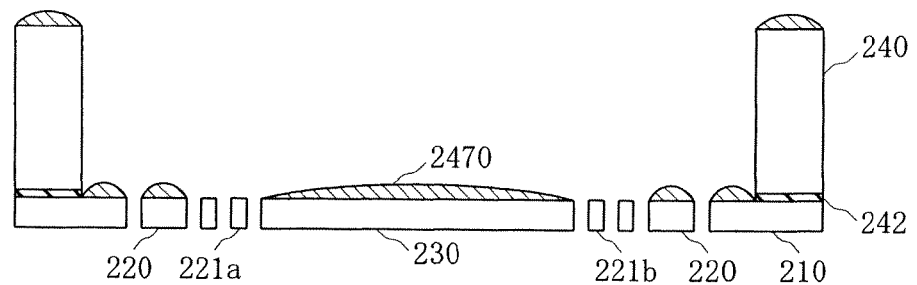

Finally, the organic film 2430 that protects the mirror structure and the like is removed by etching, thereby forming a rotatable structure (FIG. 36C). When a plurality of chips are formed on the wafer, a process called dicing is performed to cut the wafer and separate the chips. After that, the organic film 2430 is removed by etching. Forming a plurality of chips on a wafer is more general than forming only one chip on a wafer. The mirror substrate 200 having the rotatable mirror 230 is formed in the above-described way.

A method of manufacturing the electrode substrate 301 will be described next. FIGS. 37A to 37G and 38A to 38F are sectional views showing steps in the manufacture of the electrode substrate 301.

Figure 37A:
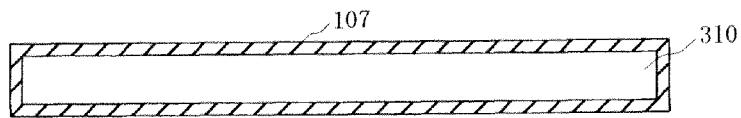
FIGS. 37A to 37G are sectional views showing steps in the manufacture of an electrode substrate according to the 10th embodiment of the present invention.
Figure 37B:
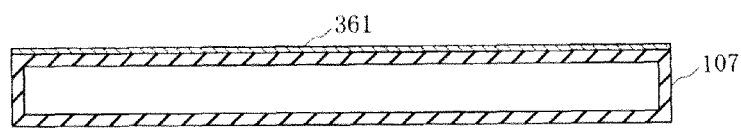
Figure 37C:
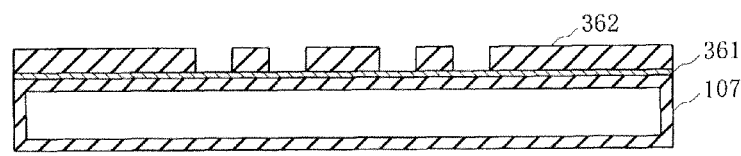

First, the insulating film 107 made of a thermal oxide film is formed on the surface of the base portion 310 made of silicon (FIG. 37A). A metal sputtering film is deposited on the surface of the insulating film 107, and used as a first seed layer 361 of the succeeding plating process (FIG. 37B). Then, a resist is applied to form a resist pattern 362 necessary for forming the driving electrode electrical interconnections 201 by a known lithography technique (FIG. 37C).

Figure 37D:
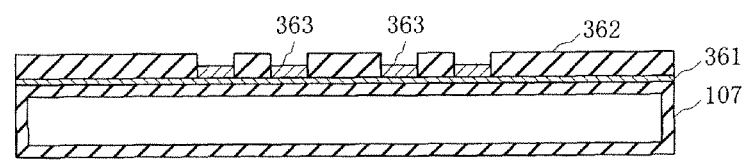
Figure 37E:
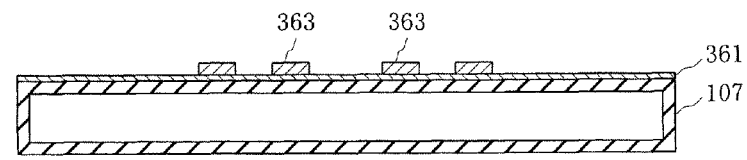
Figure 37F:
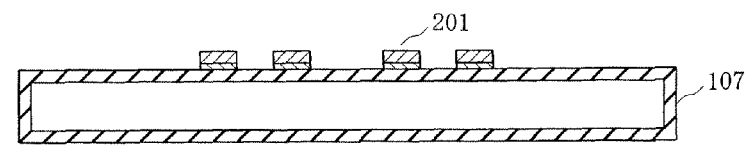

A metal film 363 made of, for example, gold is grown by plating using the resist pattern 362 as a mask (FIG. 37D). After forming the metal film 363, the resist pattern 362 used as a mask is stripped, and the substrate is cleaned (FIG. 37E). Then, the unnecessary first seed layer 361 is removed by etching (FIG. 37F). The driving electrode electrical interconnections 201 formed from the first seed layer 361 and the metal film 363 are thus formed on the insulating film 107.

Figure 37G:
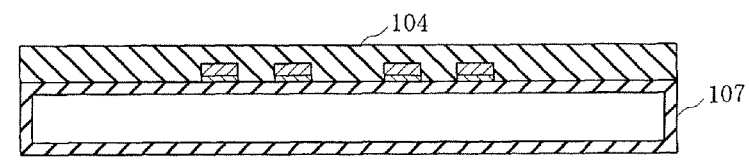

Subsequently, the insulating film 104 formed from, for example, a silicon oxide film is deposited by CVD (Chemical Vapor Deposition) or the like so as to cover the driving electrode electrical interconnections 201 on the insulating film 107 (FIG. 37G). At this time, if the planarity of the surface of the insulating film 104 is poor, a planarization process is executed after depositing the insulating film 104.

Figure 38A:
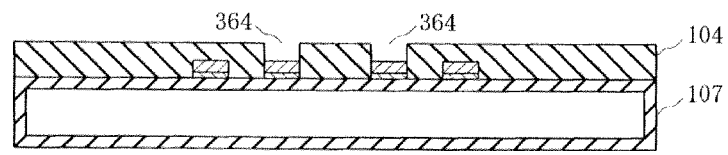
FIGS. 38A to 38F are sectional views showing steps in the manufacture of an electrode substrate according to the 10th embodiment of the present invention.

A resist is applied to the insulating film 104 by spin coating. A resist pattern to be used to form the interlayer vertical electrical interconnections 108 is formed by a known lithography technique. The insulating film 104 is etched by a known etching technique using the resist pattern as a mask, thereby forming vertical holes 364 to be used to form the interlayer vertical electrical interconnections 108 up to such a depth that reaches the driving electrode electrical interconnections 201 (FIG. 38A). The resist that covers the surface is stripped after formation of the vertical holes 364, and the substrate is cleaned to make its surface clean.

Figure 38B:
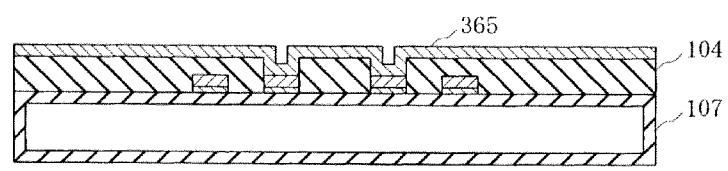
Figure 38C:
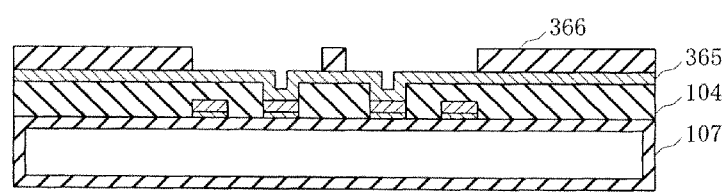
Figure 38D:
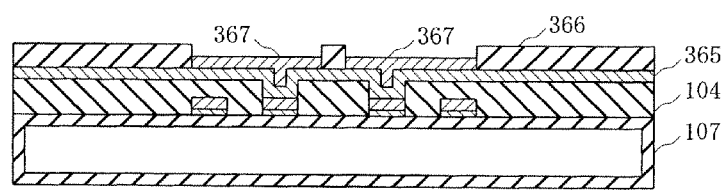
Figure 38E:
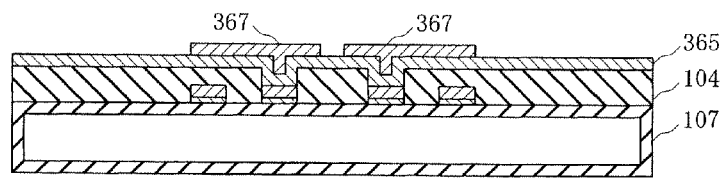
Figure 38F:
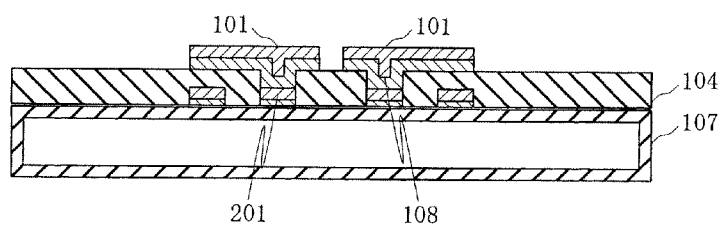

A metal sputtering film is deposited on the surface of the insulating film 104, and used as a second seed layer 365 of the succeeding plating process (FIG. 38B). A resist is applied to form, by a known lithography technique, a resist pattern 366 to be used to form the interlayer vertical electrical interconnections 108 and the driving electrodes 101 (FIG. 38C). A metal film 367 made of, for example, gold is formed by plating using the resist pattern 366 as a mask (FIG. 38D). After the resist pattern 366 is stripped (FIG. 38E), the unnecessary second seed layer 365 is removed by etching (FIG. 38F). The substrate is cleaned again to make its surface clean. The driving electrodes 101 and the interlayer vertical electrical interconnections 108 that connect the driving electrodes 101 to the driving electrode electrical interconnections 201 are thus formed from the metal film 367 and the second seed layer 365.

A thick resist is applied by spin coating. A resist pattern to be used to form the convex portions 360a and 360b is formed by a known lithography technique. The convex portions 360a and 360b are formed by plating using the resist pattern as a mask. After that, the resist that covers the surface is stripped, and the substrate is cleaned to make its surface clean. The electrode substrate 301 is formed in the above-described way.

An example of formation of the electrode substrate 301 has been described above. The interlayer vertical electrical interconnection formation and the electrode structure formation may be separate processes. If an electrical connection state can reliably be ensured, the electrode substrate 301 may be formed without depositing the second seed layer. A metal may be deposited on the driving electrodes 101 by plating to form a driving electrode structure having a terraced surface.

Finally, the mirror substrate 200 and the electrode substrate 301 are aligned with each other. The upper surfaces of the convex portions 360a and 360b of the electrode substrate 301 are soldered. The solder is melted by heating to bond the mirror substrate 200 to the electrode substrate 301. The micromirror device is thus completed.

As described above, in this embodiment, the thin resist pattern 2460 can be formed at a portion where the silicon base portion 241 and the BOX layer 242 have been removed by etching. The metal film 2470 hardly adheres to the side surfaces of the thin resist pattern 2460. This makes it possible to form the metal film 2470 while separating the metal film 2470 adhered to the surface of the resist pattern 2460 and the metal film 2470 deposited on the surface of the SOI layer exposed to the opening portion of the resist pattern 2460, as shown in FIG. 36A. For this reason, the metal film 2470 deposited on the SOI layer is not damaged when the resist pattern 2460 is removed by stripping (lift off). In this embodiment, it is therefore possible to form a mirror surface having a fine surface shape without generating burrs at the edge of the metal film 2470 deposited on the surface of the mirror 230.

Additionally, in this embodiment, the resist 2440 is exposed from the SOI layer side opposite to the silicon base portion 241 via the gaps between the structures, thereby easily forming the resist pattern 2460 having a reverse tapered shape. Since the metal film 2470 hardly adheres to the side surface of the resist pattern 2460, a mirror surface having a fine surface shape can be formed.

Furthermore, in this embodiment, no metal film is formed on the surfaces of the mirror connectors and those of the gimbal connectors. This allows to suppress drift of the mirror tilt angle.

[11th Embodiment]

The 11th embodiment of the present invention will be described next. The arrangement of a micromirror device according to this embodiment is the same as in the 10th embodiment, and a description thereof will be made using the reference numerals in FIG. 34.

A method of manufacturing the micromirror device according to this embodiment will be described below. A method of manufacturing a mirror substrate 200 will be described first. The processes up to forming a frame portion 210, gimbal 220, mirror 230, mirror connectors 221a and 221b, and gimbal connectors on the SOI layer, and removing, by etching, an unnecessary silicon base portion 241 and BOX layer 242 on the lower side of a portion where the mirror 230 and the like are formed on the SOI layer are the same as in the 10th embodiment.

FIGS. 39A to 39D and 40A to 40D are sectional views showing steps in depositing a metal film on the mirror surface according to this embodiment. The sectional views illustrate steps after the unnecessary silicon base portion 241 and BOX layer 242 have been removed by etching, and the wafer has been cleaned.

Figure 39A:
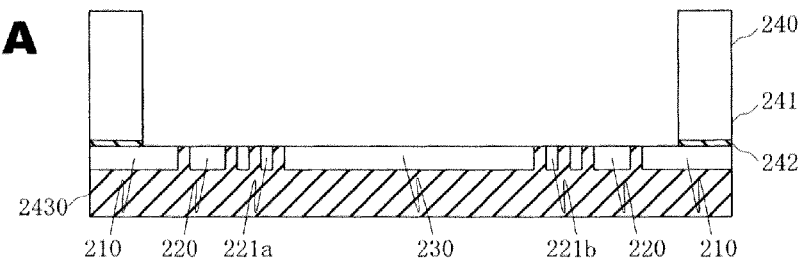
FIGS. 39A to 39D are sectional views showing steps in depositing a metal film on a mirror surface according to the 11th embodiment of the present invention.

As shown in FIG. 39A, the frame portion 210, gimbal 220, mirror 230, mirror connectors 221a and 221b, and gimbal connectors (not shown) are formed on the SOI layer. A frame member 240 is formed by etching an unnecessary base substrate (silicon base portion) 241 and a BOX layer 242 on the lower side of a portion where the frame portion 210, gimbal 220, mirror 230, mirror connectors 221a and 221b, gimbal connectors, and the like are formed.

Figure 39B:
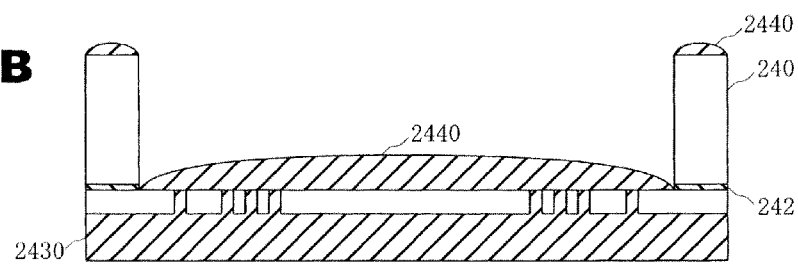

As in the 10th embodiment, a negative resist 2440 is applied using a spray resist coater (FIG. 39B).

Figure 39C:
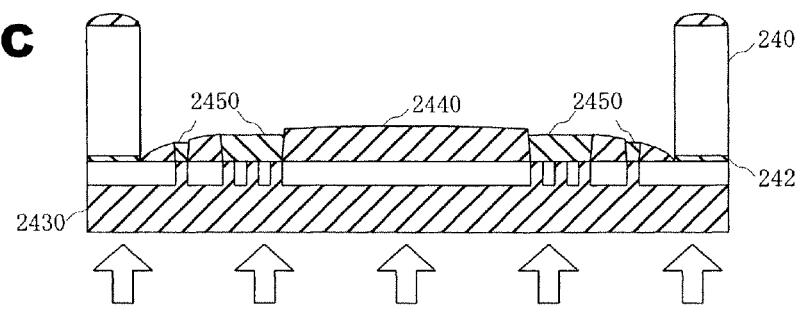

Subsequently, the photosensitive negative resist 2440 is exposed from the surface with an organic film 2430 (FIG. 39C). Reference numeral 2450 in FIG. 39C indicates an exposed portion. As described in the 10th embodiment, since structures such as the frame portion 210, gimbal 220, mirror 230, mirror connectors 221a and 221b, and gimbal connectors are formed on the SOI layer, sufficiently thick silicon shields light. Light that has come through the gaps between these structures exposes the negative resist 2440. In addition, since the mirror connectors 221a and 221b and the gimbal connectors have thin line structures, the resist 2440 existing on them is exposed to light that has come through the gaps.

Figure 39D:
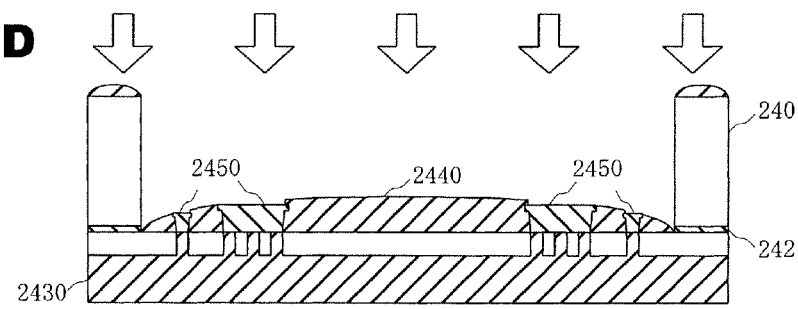

After the exposure, the entire surface is exposed from above the resist 2440 without forming a mask on the surface with the resist 2440 (FIG. 39D). The exposure dose at this time is about 1/10 to 1/2 a minimum critical exposure dose $D_0$ at which a resist pattern is obtained after exposure/development. Only a region where the sum of the exposure dose of the resist 2440 irradiated from the side of the organic film 2430 in the step of FIG. 39C and the exposure dose of the resist 2440 irradiated from above in the step of FIG. 39D exceeds the critical exposure dose $D_0$ is obtained as a resist pattern. The resist pattern has a T-top shape, i.e., T-shaped cross section. The resist pattern with such a shape has a pattern shape necessary in a lift-off process, like a resist pattern having a reverse tapered shape. The condition for each exposure dose is determined such that a pattern in desired shape and size is obtained after development. The step in FIG. 39D may be performed before the step in FIG. 39C.

Figure 40A:
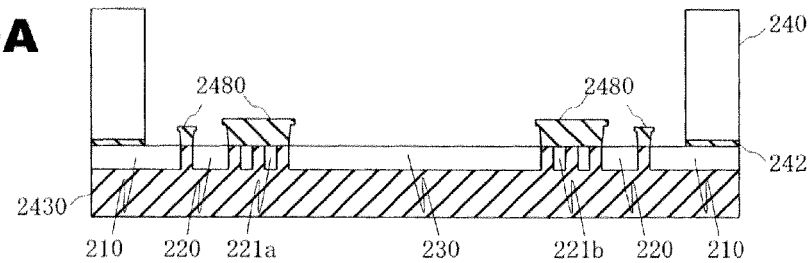
FIGS. 40A to 40D are sectional views showing steps in depositing a metal film on a mirror surface according to the 11th embodiment of the present invention.

The resist 2440 with a latent image formed is immersed in a developer. After determining the time of immersing the wafer with resist in the developer so as to form a desired pattern in a desired size, the wafer is immersed in the developer for the determined time. After that, the entire wafer is dried to harden the resist 2440. A resist pattern 2480 having a T-top shape is formed on the lower surface of the base substrate thus far (FIG. 40A). As shown in FIG. 40A, the resist pattern 2480 has opening regions facing the frame portion 210, gimbal 220, and mirror 230. As in the 10th embodiment, since the resist pattern 2480 is formed on the mirror connectors 221a and 221b and the gimbal connectors, no metal film is deposited on the mirror connectors 221a and 221b and the gimbal connectors in the process of depositing the metal film.

Figure 40B:
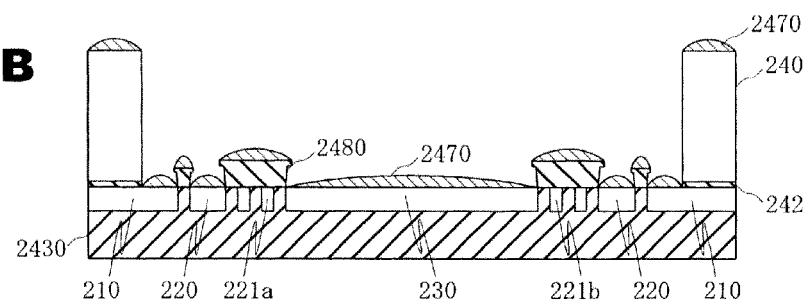
Figure 40C:
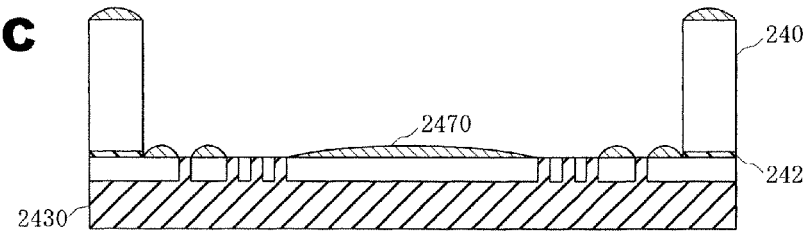

Next, a metal film 2470 of gold or the like is deposited by sputtering or deposition (FIG. 40B). After depositing the metal film 2470, the resist pattern 2480 is stripped together with the metal film 2470 adhered to it (FIG. 40C). After stripping the resist pattern 2480, the wafer is cleaned to obtain a clean surface.

Figure 40D:
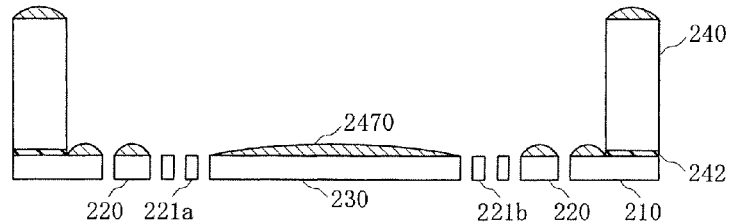

Finally, the organic film 2430 that protects the mirror structure and the like is removed by etching, thereby forming a rotatable structure (FIG. 40D). When a plurality of chips are formed on the wafer, a process called dicing is performed to cut the wafer and separate the chips. After that, the organic film 2430 is removed by etching. The mirror substrate 200 having the rotatable mirror 230 is formed in the above-described way.

A method of manufacturing an electrode substrate 301 is the same as in the 10th embodiment, and a description thereof will not be repeated. Finally, the mirror substrate 200 and the electrode substrate 301 are aligned with each other. The upper surfaces of convex portions 360a and 360b of the electrode substrate 301 are soldered. The solder is melted by heating to bond the mirror substrate 200 to the electrode substrate 301. The micromirror device is thus completed.

As described above, according to this embodiment, since the resist pattern 2480 having a T-top shape can be formed, the metal film 2470 more hardly adheres to the side surface of the resist pattern 2480. It is therefore possible to further reduce the possibility that the metal film 2470 deposited on the SOI layer is damaged upon removing the resist pattern 2480 by stripping, and thus form a mirror surface having a finer surface shape than in the 10th embodiment.

Note that in the micromirror devices according to the 10th and 11th embodiments, gold (Au) is used as the material of the driving electrode electrical interconnections 201, driving electrodes 101, and convex portions 360a and 360b. However, the present invention is not limited to this. As the conductive material of these electrical interconnections, electrodes, and convex portions, aluminum (Al), tungsten (W), tantalum (Ta), titanium (Ti), copper (Cu), tin (Sn), silver (Ag), or a compound thereof is usable. Alternatively, a semiconductor material such as silicon may be used.

In the 10th and 11th embodiments, the structure of the conductive material is formed using plating. However, any other known film deposition technique such as sputtering, CVD, or deposition is usable without any problem as long as it can deposit a conductive film to a desired thickness.

Although not illustrated in the 10th and 11th embodiments, the organic film 2430 may be formed as shown in FIG. 35A or 39A after depositing a metal film on the surface (the surface facing the surface where the metal film 2470 is formed) of the SOI layer on the opposite side of the silicon base portion 241 by a known lithography technique. With this process, the metal film 2470 is deposited after the deposition of the metal film so that the metal films are formed on both surfaces of the mirror 230, respectively. This makes it possible to cancel the stresses acting on the mirror 230, which are generated by the metal films formed on the surfaces of the mirror 230. As a result, bending of the mirror 230 can be suppressed.

[12th Embodiment]

Figure 41:
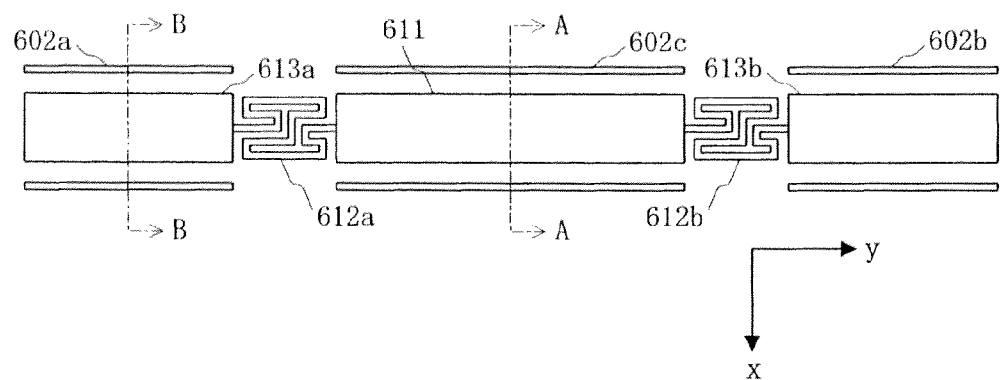
FIG. 41 is a plan view showing the arrangement of a micromirror device according to the 12th embodiment of the present invention.
Figure 42:
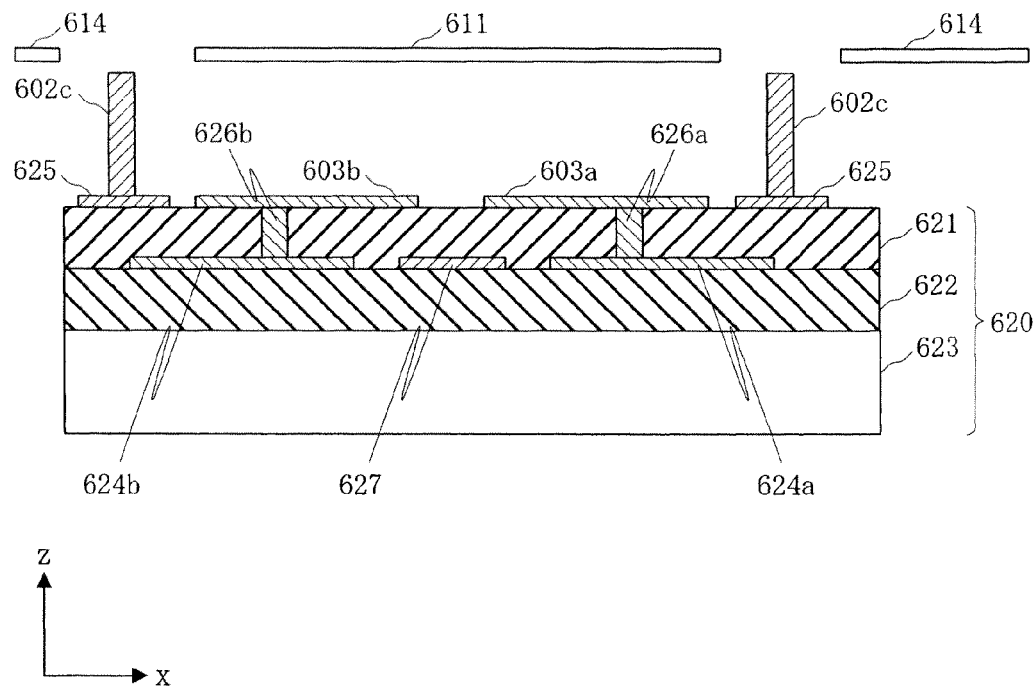
FIG. 42 is a sectional view showing the arrangement of the micromirror device according to the 12th embodiment of the present invention.
Figure 43:
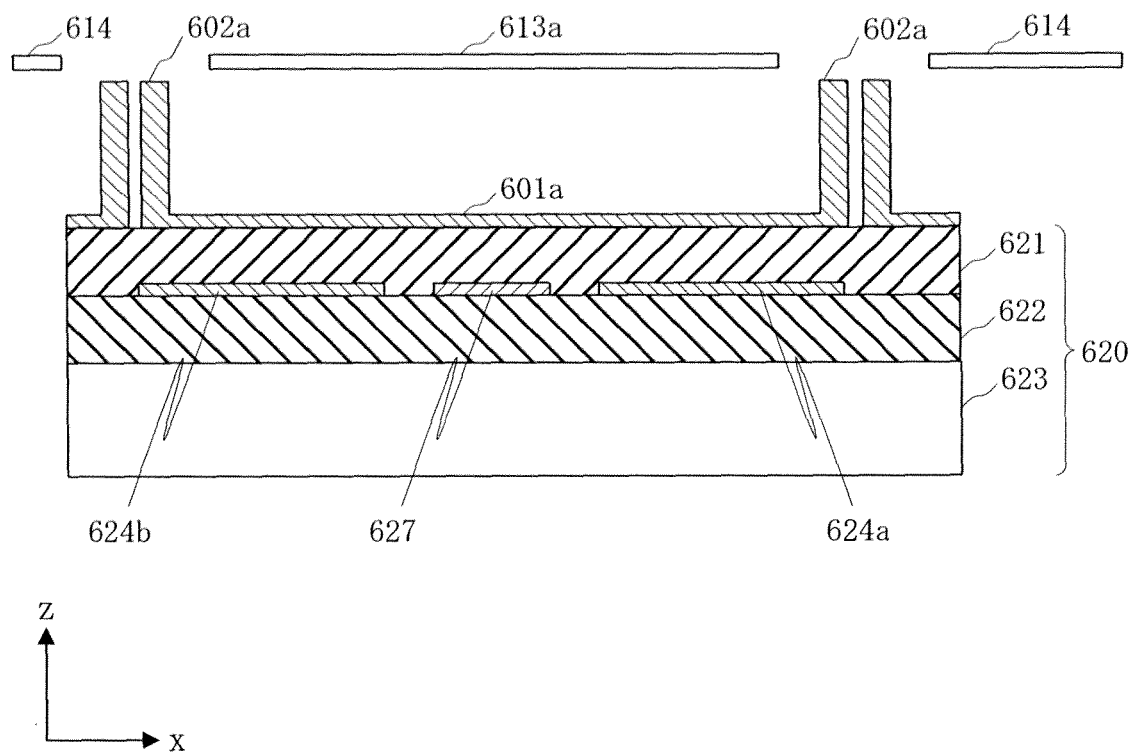
FIG. 43 is a sectional view showing the arrangement of the micromirror device according to the 12th embodiment of the present invention.

In the first to 11th embodiments, the present invention is applied to a micromirror device having a mirror with an almost circular shape viewed from above. However, the present invention is also applicable to a micromirror device having a mirror with an almost rectangular shape viewed from above. FIG. 41 is a plan view showing the arrangement of a micromirror device according to the 12th embodiment of the present invention. FIG. 42 is a sectional view of the micromirror device taken along a line A-A in FIG. 41. FIG. 43 is a sectional view of the micromirror device taken along a line B-B in FIG. 41. The same reference numerals as in FIG. 63 denote the same parts in the drawings. In this embodiment, the arrangement of the first embodiment is applied to the micromirror device shown in FIG. 63.

Referring to FIGS. 41 to 43, reference numeral 601a denotes a movable beam driving electrode; 602a, 602b, and 602c, wall electrodes; 603a and 603b, mirror driving electrodes; 611, a mirror serving as a movable member having an almost rectangular shape viewed from above; 612a and 612b, connectors serving as support members; 613a and 613b,
movable beams; 614, a mirror substrate serving as a first substrate; 620, an electrode substrate serving as a second substrate; 621 and 622, insulating films; 623, a base portion made of a semiconductor such as silicon; 624a and 624b, mirror driving electrode electrical interconnections for applying voltages to the mirror driving electrodes 603a and 603b, respectively; 625, wall electrode electrical interconnections for applying voltages to the wall electrodes 602c; 626a and 626b, interlayer vertical electrical interconnections; and 627, a lower electrode serving as a driving stabilization electrode.

Figure 63:
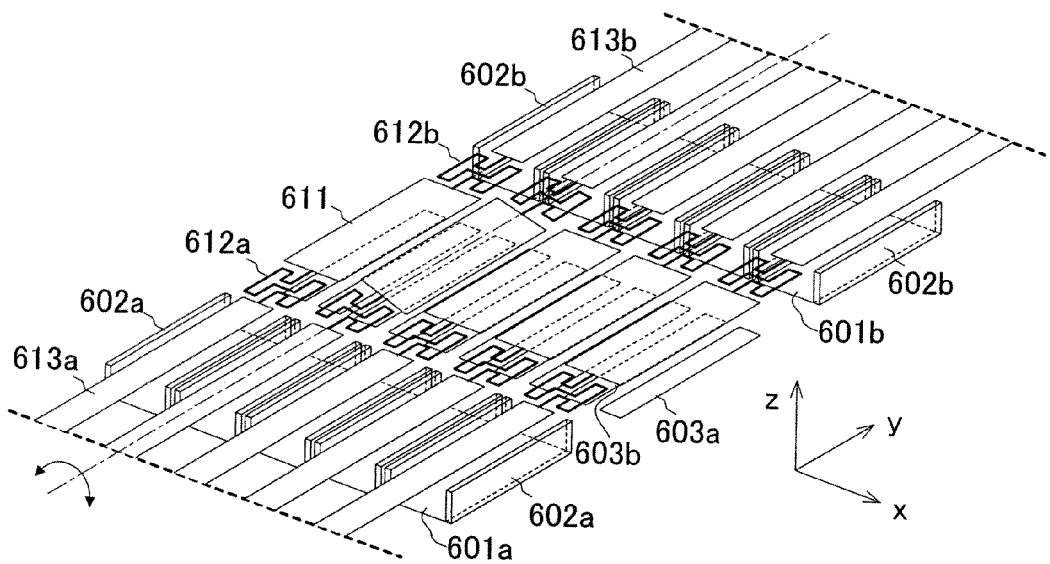
FIG. 63 is a perspective view showing the arrangement of a mirror array used as a wavelength selective switch.

The mirror substrate 614 is fixed above the electrode substrate 620 at a predetermined distance by a support structure (not shown) provided to surround a mirror array region where a plurality of micromirror devices are arranged. The electrode substrate 620 and the mirror substrate 614 are arranged to be parallel to each other. Note that when a number of mirrors 611 are arranged, as shown in FIG. 63, adjacent mirrors 611 are arranged at the portions where the mirror substrates 614 exist in FIGS. 42 and 43. The mirror substrates 614 are arranged here to more easily understand the arrangement of the micromirror device.

The arrangement on the mirror substrate side is the same as that in the conventional micromirror device shown in FIG. 63, and a description thereof will not be repeated.

Figure 44:
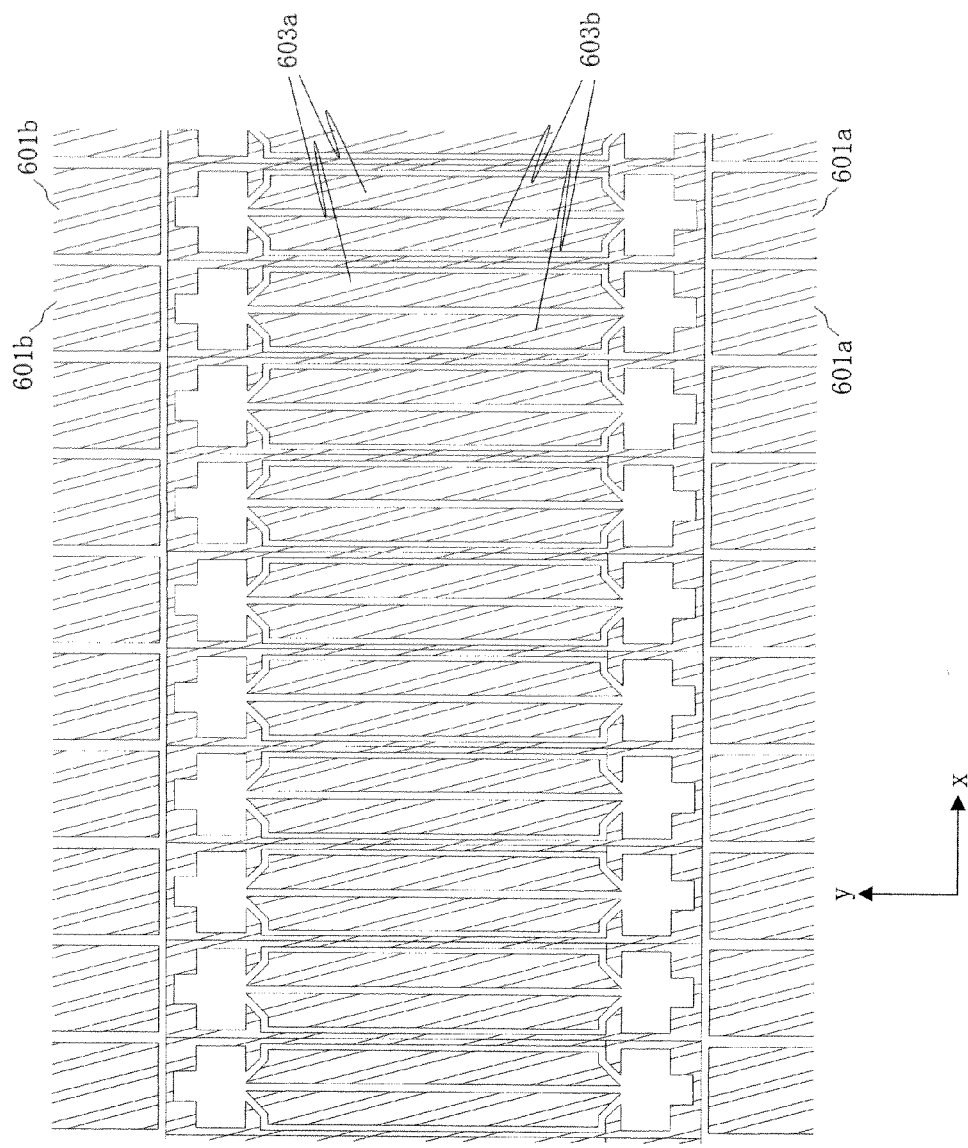
FIG. 44 is a plan view of a layer where mirror driving electrodes and movable beam driving electrodes are formed according to the 12th embodiment of the present invention.
Figure 45:
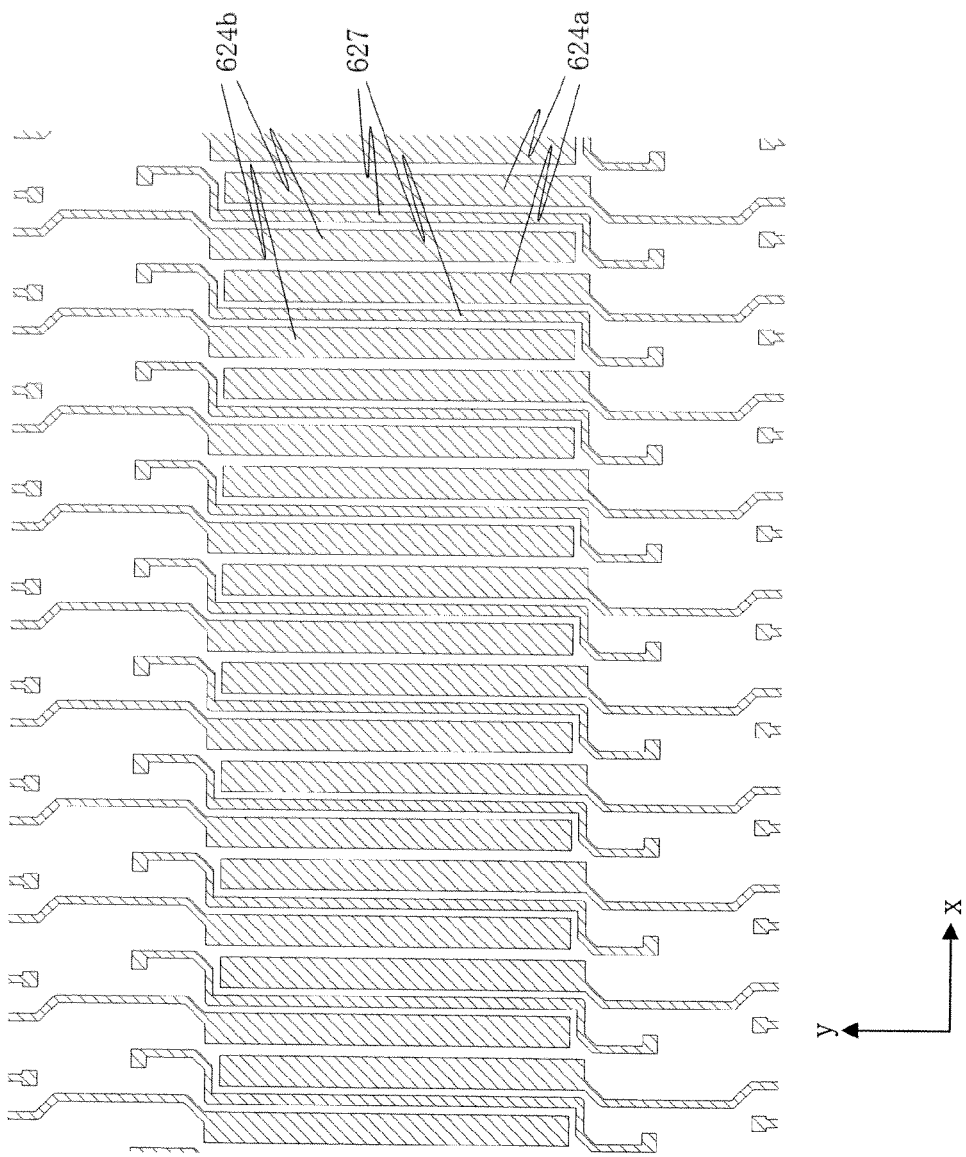
FIG. 45 is a plan view of a layer where mirror driving electrode electrical interconnections and lower electrodes are formed according to the 12th embodiment of the present invention.

FIG. 44 is a plan view of a layer where the mirror driving electrodes 603a and 603b and the movable beam driving electrodes 601a and 601b are formed. FIG. 45 is a plan view of a layer where the mirror driving electrode electrical interconnections 624a and 624b and the lower electrodes 627 are formed. Note that FIGS. 44 and 45 illustrate the arrangement of a mirror array formed by arranging a plurality of micromirror devices.

The insulating film 622 is formed on the base portion 623 of the electrode substrate 620. The insulating film 622 has a function of preventing the mirror driving electrode electrical interconnections 624a and 624b and the lower electrode 627 from making an electrical short circuit via the base portion 623 made of a semiconductor such as silicon.

The mirror driving electrode electrical interconnections 624a and 624b and the lower electrode 627 are formed on the upper surface of the insulating film 622. The mirror driving electrode electrical interconnections 624a and 624b and the lower electrode 627 are formed on the same layer of the electrode substrate 620. Hence, they can be formed simultaneously.

In addition, the insulating film 621 is formed on the upper surface of the insulating film 622 so as to cover the mirror driving electrode electrical interconnections 624a and 624b and the lower electrode 627. The mirror driving electrodes 603a and 603b and the movable beam driving electrodes 601a and 601b are formed on the upper surface of the insulating film 621. The mirror driving electrodes 603a and 603b are connected to the mirror driving electrode electrical interconnections 624a and 624b via the interlayer vertical electrical interconnections 626a and 626b, respectively.

The operation of the micromirror device according to this embodiment is the same as that described with reference to FIG. 63, and a description thereof will not be repeated.

The potential to be applied to the lower electrode 627 may be the same as that (for example, ground potential) of the mirror 611 or that of the mirror driving electrodes 603a and 603b, like the lower electrodes 103 of the first embodiment.

A method of manufacturing the micromirror device of this embodiment is the same as in the first embodiment, and a description thereof will not be repeated.

It is possible to apply the arrangement of the first embodiment to the micromirror device shown in FIG. 63 in this way and thus obtain the same effects as in the first embodiment.

[13th Embodiment]

Figure 46:
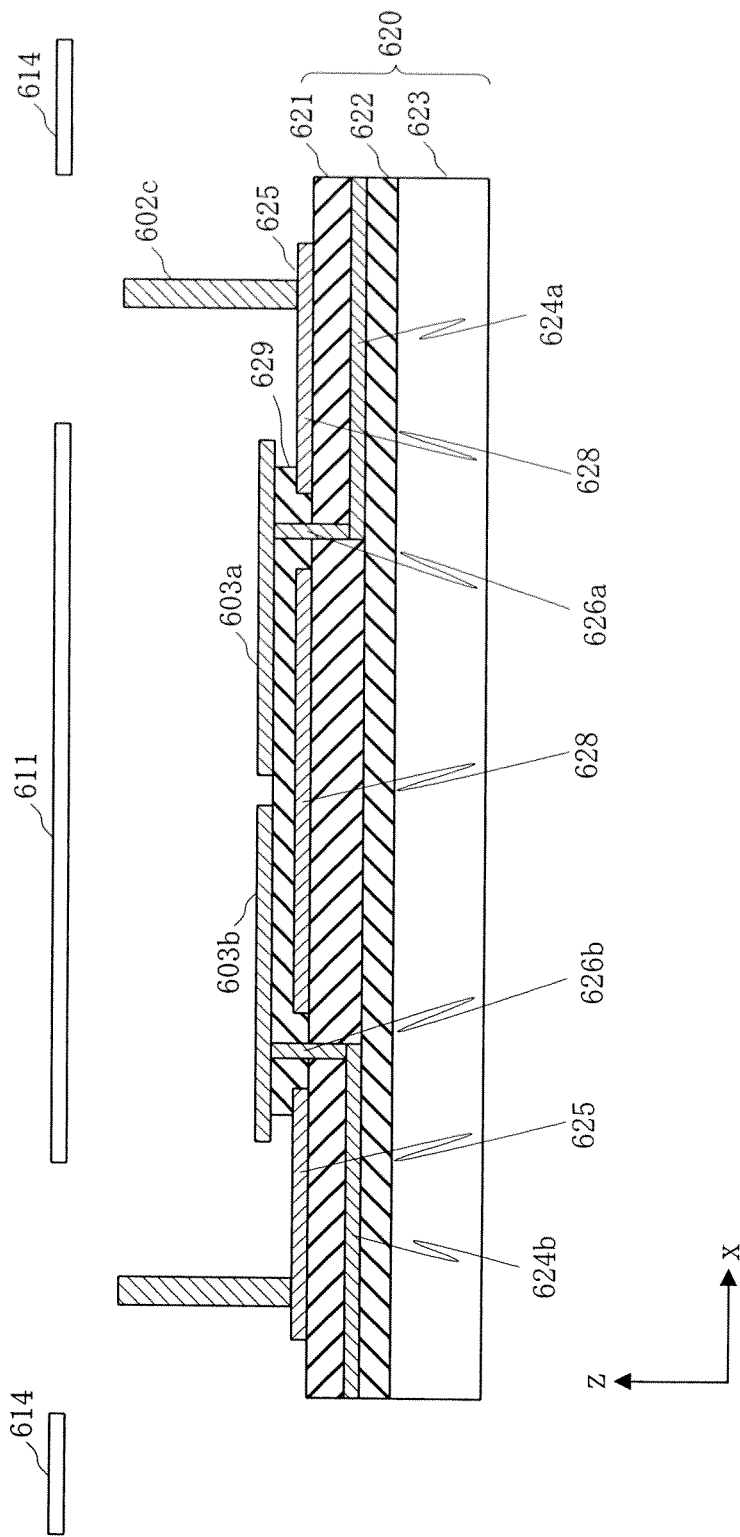
FIG. 46 is a sectional view showing the arrangement of a micromirror device according to the 13th embodiment of the present invention.

FIG. 46 is a sectional view showing the arrangement of a micromirror device according to the 13th embodiment of the present invention. The same reference numerals as in FIGS. 41 to 45 and 63 denote the same parts in FIG. 46. In this embodiment, the arrangement of the fourth embodiment is applied to the micromirror device shown in FIG. 63. FIG. 46 is a sectional view of the micromirror device according to this embodiment taken along a line A-A in FIG. 41.

Referring to FIG. 46, reference numeral 602c denotes wall electrodes; 603a and 603b, mirror driving electrodes; 611, a mirror having an almost rectangular shape viewed from above; 614, a mirror substrate; 620, an electrode substrate; 621, 622, and 629, insulating films; 623, a base portion; 624a and 624b, mirror driving electrode electrical interconnections; 625, wall electrode electrical interconnections; 626a and 626b, interlayer vertical electrical interconnections; and 628, a peripheral electrode serving as a driving stabilization electrode.

When a number of mirrors 611 are arranged, as shown in FIG. 63, adjacent mirrors 611 are arranged at the portions where the mirror substrates 614 exist in FIG. 46. The mirror substrates 614 are arranged here to more easily understand the arrangement of the micromirror device.

The arrangement on the mirror substrate side is the same as that in the conventional micromirror device shown in FIG. 63, and a description thereof will not be repeated. The arrangements of movable beams 613a and 613b and movable beam driving electrodes 601a and 601b are the same as in FIG. 43, and a description thereof will not be repeated.

The insulating film 622 is formed on the base portion 623 of the electrode substrate 620. The mirror driving electrode electrical interconnections 624a and 624b are formed on the upper surface of the insulating film 622. In addition, the insulating film 621 is formed on the upper surface of the insulating film 622 so as to cover the mirror driving electrode electrical interconnections 624a and 624b. The peripheral electrode 628 is formed on the upper surface of the insulating film 621 so that the insulating film 621 such as a silicon oxide film is not exposed to the surface of the electrode substrate 620 when viewed from the side of the mirror 611 of the mirror substrate 614 on the opposite side. To form the peripheral electrode 628, for example, a metal thin film on the insulating film 621 is processed by a known etching technique.

The insulating film 629 made of a dielectric is formed on the upper surface of the peripheral electrode 628 so as to partially cover the peripheral electrode 628. The mirror driving electrodes 603a and 603b for driving the mirror 611 of the mirror substrate 614 on the opposite side are formed on the upper surface of the insulating film 629. When viewed from the side of the mirror 611 of the mirror substrate 614 on the opposite side, the insulating film 629 is almost covered with the mirror driving electrodes 603a and 603b and invisible from the side of the mirror 611 except part thereof. More preferably, the insulating film 629 under the peripheral portions of the mirror driving electrodes 603a and 603b is removed, as shown in FIG. 46.

The mirror driving electrodes 603a and 603b are connected to the mirror driving electrode electrical interconnections 624a and 624b via the interlayer vertical electrical interconnections 626a and 626b that extend through the insulating films 621 and 629. Note that the vertical holes formed for the interlayer vertical electrical interconnections are sometimes referred to as via holes, and interlayer vertical electrical interconnections formed by filling the vertical holes with a metal are sometimes referred to as vias.

As described above, the peripheral electrode 628 is formed in a layer (to be referred to as a second conductive layer hereinafter) between a driving electrode layer (to be referred to as a first conductive layer hereinafter) where the mirror driving electrodes 603a and 603b are provided and an electrode electrical interconnection layer (to be referred to as a third conductive layer hereinafter) where the mirror driving electrode electrical interconnections 624a and 624b are provided, and has a function of avoiding exposure of the insulating film 622 or 621 which causes drift of the mirror tilt angle. The mirror driving electrodes 603a and 603b have a function of driving the mirror 611 and a function of avoiding exposure of the insulating film 629 which causes drift of the mirror tilt angle.

In this embodiment, when the electrode substrate 620 is viewed from the side of the mirror 611, the dielectric that causes drift of the mirror tilt angle is rarely exposed. For this reason, even when the insulating films 621, 622, and 629 are charged, the charging does not influence the electric fields formed between the mirror 611 and the mirror driving electrodes 603a and 603b. It is therefore possible to suppress drift of the mirror tilt angle. Additionally, in this embodiment, the mirror driving electrode electrical interconnections 624a and 624b are provided in the layer under the peripheral electrode 628. Hence, the electric fields emitted from the electrical interconnections 624a and 624b do not influence the electric fields formed between the mirror 611 and the mirror driving electrodes 603a and 603b, and the mirror tilt angle can more accurately be controlled.

The peripheral electrode 628 is preferably formed to almost completely cover the upper surface of the electrode substrate 620. This structure allows to extremely reduce exposure of the insulating film 621.

To provide the interlayer vertical electrical interconnections 626a and 626b, gaps for insulation need to be formed between the interlayer vertical electrical interconnections 626a and 626b and the peripheral electrode 628. Hence, the insulating film 621 is exposed near the interlayer vertical electrical interconnections 626a and 626b in the level of the second conductive layer. However, the interlayer vertical electrical interconnections 626a and 626b are provided immediately under the mirror driving electrodes 603a and 603b. For this reason, even when the insulating film 621 is exposed in the level of the second conductive layer, the insulating film 621 is covered with the mirror driving electrodes 603a and 603b and not exposed when the electrode substrate 620 is viewed from the side of the mirror 611. Hence, the insulating film 621 exposed from the peripheral electrode 628 never induces drift of the mirror tilt angle.

The operation of the micromirror device according to this embodiment is the same as that described with reference to FIG. 63, and a description thereof will not be repeated.

A predetermined potential is applied to the peripheral electrode 628. The predetermined potential may be the same as that of the mirror 611. More preferably, the ground potential is applied to the peripheral electrode 628. The wall electrodes 602c are preferably set at an equipotential to the peripheral electrode 628. To do this, the wall electrode electrical interconnections 625 for applying a voltage to the wall electrodes 602c are connected to the peripheral electrode 628, as shown in FIG. 46.

A method of manufacturing the micromirror device of this embodiment is the same as in the fourth embodiment, and a description thereof will not be repeated.

It is possible to apply the arrangement of the fourth embodiment to the micromirror device shown in FIG. 63 in this way and thus obtain the same effects as in the fourth embodiment.

Note that in this embodiment, a peripheral electrode electrical interconnection (not shown) for applying a voltage to the peripheral electrode 628 is assumed to be arranged in the second conductive layer that is the same layer as the peripheral electrode 628. However, the peripheral electrode electrical interconnection may be arranged in the third conductive layer that is the same layer as the mirror driving electrode electrical interconnections 624a and 624b. In this case, a voltage is applied from the peripheral electrode electrical interconnection via an interlayer vertical electrical interconnection, like the mirror driving electrodes 603a and 603b.

[14th Embodiment]

Figure 47:
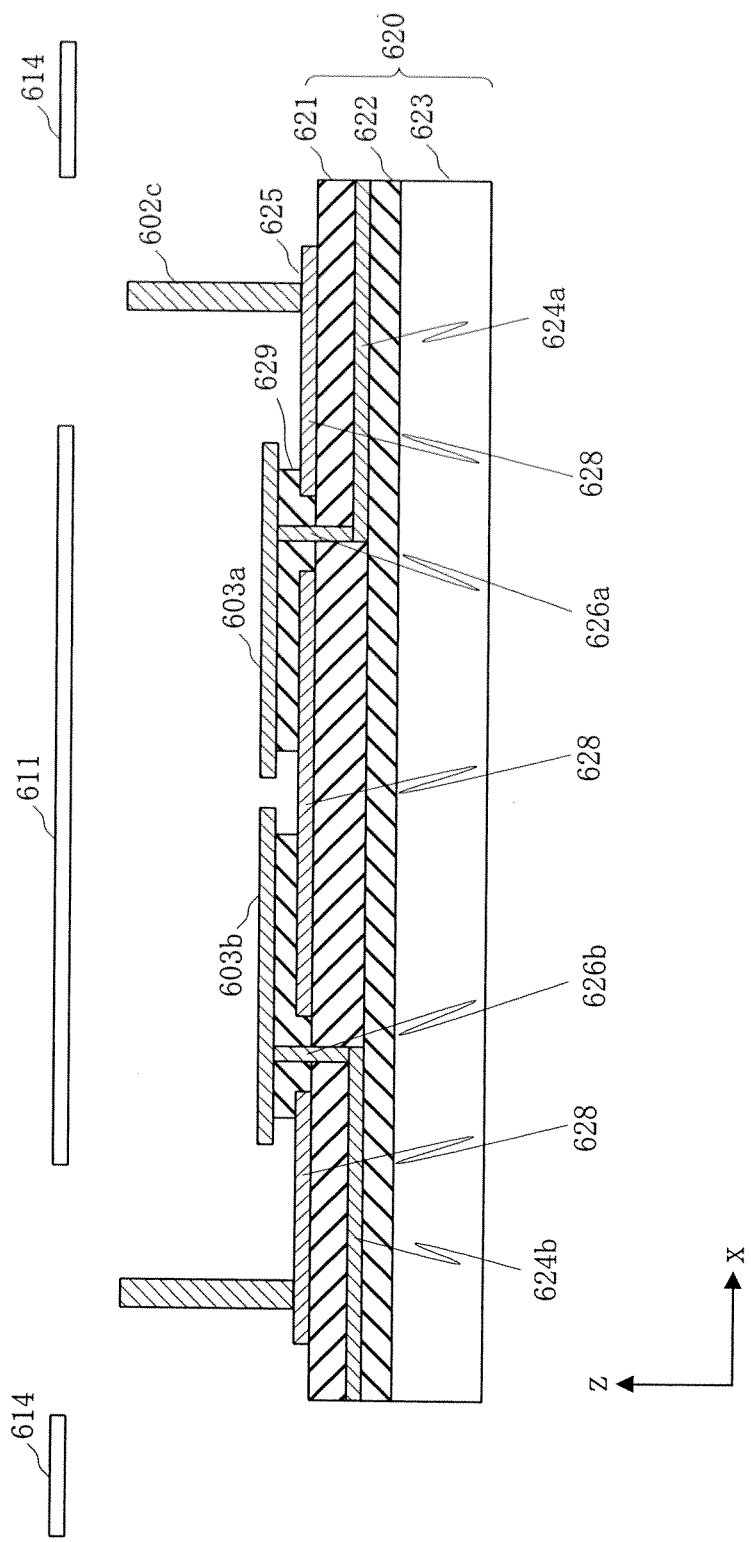
FIG. 47 is a sectional view showing the arrangement of a micromirror device according to the 14th embodiment of the present invention.

The 14th embodiment of the present invention will be described next. FIG. 47 is a sectional view showing the arrangement of a micromirror device according to the 14th embodiment of the present invention. The same reference numerals as in FIGS. 41 to 46 and 63 denote the same parts in FIG. 47. In this embodiment, the arrangement of the fifth embodiment is applied to the micromirror device shown in FIG. 63. FIG. 47 is a sectional view of the micromirror device according to this embodiment taken along a line A-A in FIG. 41.

In the 13th embodiment, the insulating film 629 is exposed to the region sandwiched between the mirror driving electrodes 603a and 603b, as shown in FIG. 46. The influence of the charged exposed insulating film 629 on drift of the mirror tilt angle is small. However, a structure in which the insulating film 629 is not exposed at all when viewed from the side of the mirror 611 is more preferable, as a matter of course. In the 14th embodiment, such a structure in which an insulating film 629 is not exposed at all is implemented.

In this embodiment, the structure with mirror driving electrodes 603a and 603b overhanged from the edge of the insulating film 629 can be implemented in the above-described way. A structure in which the insulating film 629 is not exposed at all when viewed from the side of a mirror 611 is thus implemented.

Note that a method of manufacturing the micromirror device of the 14th embodiment is the same as in the fifth embodiment, and a description thereof will not be repeated.

[15th Embodiment]

Figure 48:
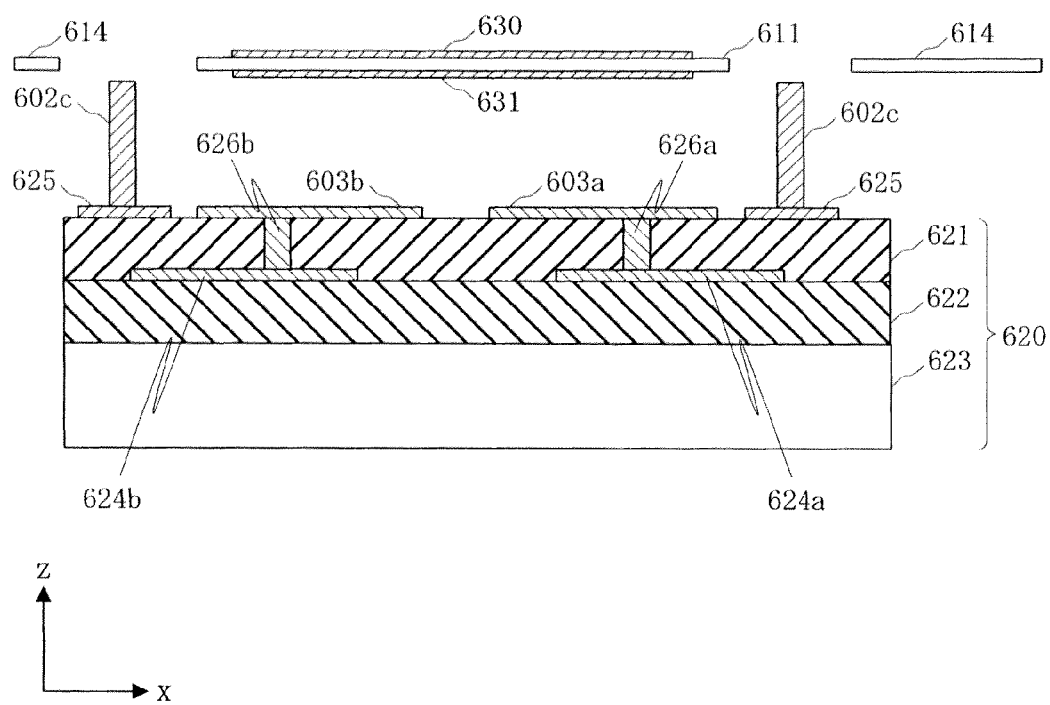
FIG. 48 is a sectional view showing the arrangement of a micromirror device according to the 15th embodiment of the present invention.

The 15th embodiment of the present invention will be described next. FIG. 48 is a sectional view showing the arrangement of a micromirror device according to the 15th embodiment of the present invention. The same reference numerals as in FIGS. 41 to 47 and 63 denote the same parts in FIG. 48. In this embodiment, the arrangement of the sixth embodiment is applied to the micromirror device shown in FIG. 63. FIG. 48 is a sectional view of the micromirror device according to this embodiment taken along a line A-A in FIG. 41.

Referring to FIG. 48, reference numeral 602c denotes wall electrodes; 603a and 603b, mirror driving electrodes; 611, a mirror having an almost rectangular shape viewed from above; 614, a mirror substrate; 620, an electrode substrate; 621 and 622, insulating films; 623, a base portion; 624a and 624b, mirror driving electrode electrical interconnections; 625, wall electrode electrical interconnections; 626a and 626b, interlayer vertical electrical interconnections; and 630 and 631, metal films.

When a number of mirrors 611 are arranged, as shown in FIG. 63, adjacent mirrors 611 are arranged at the portions where the mirror substrates 614 exist in FIG. 48. The mirror substrates 614 are arranged here to more easily understand the arrangement of the micromirror device.

The arrangement on the electrode substrate side is the same as that in the micromirror device of the 12th embodiment shown in FIG. 42 except that the lower electrode 627 is not present, and a description thereof will not be repeated.

The mirror substrate 614 has a frame portion (not shown) having an opening to expose the mirror array region. The frame portion is connected to the upper surface of the support structure. Movable beams (613a and 613b in FIG. 41) each having one end fixed to the frame portion are provided inside the frame portion of the mirror substrate. The mirror 611 is arranged between the movable beams 613a and 613b and connected to them via a pair of flexible connectors (612a and 612b in FIG. 41). The frame portion, movable beams 613a and 613b, connectors 612a and 612b, and mirror 611 are integrally formed from, for example, single-crystal silicon. The arrangements of the movable beams 613a and 613b and the connectors 612a and 612b are the same as in the conventional micromirror device shown in FIG. 63, and a detailed description thereof will not be repeated.

In the micromirror device according to this embodiment, metal films 630 and 631 having the same shape are formed on both surfaces of the mirror 611. The metal films 630 and 631 are made of a metal such as aluminum or Au. If the micromirror device uses infrared rays as light, Au is preferably used in consideration of the reflectance of infrared rays. If light in, for example, the visible range is used, aluminum is usable.

In this embodiment, the metal film 630 serves as the reflecting surface of the mirror 611. The metal film 631 is formed to suppress bending of the mirror 611 upon forming the metal film 630.

In addition, the metal films 630 and 631 are formed to be similar to and smaller than the mirror 611, and arranged concentrically with the mirror 611, i.e., such that their central positions match that of the mirror 611. For example, the metal films 630 and 631 are formed into an almost rectangular shape similar to and smaller than the mirror 611. For this reason, the mirror 611 has regions without the metal films at its peripheral portion.

According to the micromirror device of this embodiment having the above-described arrangement, when the edge of the mirror 611 comes into contact with the mirror driving electrode 603a or 603b, the mirror driving electrode 603a or 603b does not come into contact with the metal film 631. For example, even when the edge of the mirror 611 on the side of the mirror driving electrode 603a comes into contact with the mirror driving electrode 603a as the mirror rotates about a rotation axis that passes through the pair of connectors 612a and 612b, the metal film 631 never comes into contact with the mirror driving electrode 603a. This prevents stick of the mirror driving electrodes and the mirror having, on its surfaces, metal films made of the same metal as that of the mirror driving electrodes when the device is uncontrollable, and the applied voltages are set to zero before collision so that the mirror and the mirror driving electrodes are set at an equipotential and collide with each other.

As in the sixth embodiment, the metal films 630 and 631 are formed by selectively depositing a metal material on the mirror 611 by, for example, focused ion beam deposition. For example, to use the device for communication, Au is used as the metal material to increase the reflectance of signal light (infrared rays) to be used. Note that when Au is used, an adhesion improving layer of, e.g., titanium or chromium may be used to improve the adhesion to silicon.

The metal films 630 and 631 may be formed by depositing the metal material in desired regions by a deposition method using a stencil mask. Alternatively, the metal films 630 and 631 can also be formed by selectively forming metal films using a so-called lift-off method. In the lift-off method, a resist pattern is formed first. After forming the resist pattern, a metal film is formed. Then, the resist pattern is removed to remove the metal film on it to leave the metal film in a desired region, thereby forming the metal films 630 and 631. Otherwise, after a metal film is formed, selective etching may be performed using a resist pattern to form the metal films 630 and 631.

Note that considering the stresses of the metal films to be formed, preferably, metal films having the same thickness are formed on both surfaces of the mirror 611 using the same manufacturing method to implement a state in which the stresses of the metal films formed on both surfaces balance, thereby suppressing deformation of the mirror 611.

As described above, since the metal films 630 and 631 are formed only in the internal regions of the mirror 611, no metal films are formed on, for example, the connectors. The connectors are fine structures that largely deform as the mirror 611 rotates. If metal films adhere to the connectors, their states change over time so as to change the angle of the mirror 611 even when it is controlled to a predetermined tilt angle by applying voltages to the mirror driving electrodes 603*a* and 603*b*, and the like. However, according to this embodiment, metal film formation outside the mirror 611 is suppressed, as described above, thereby preventing metal adhesion to the connectors. This suppresses the above-described time-rate change of the connectors, and enables to accurately control the position of the mirror 611.

The operation of the micromirror device according to this embodiment is the same as that described with reference to FIG. 63, and a description thereof will not be repeated.

It is possible to apply the arrangement of the sixth embodiment to the micromirror device shown in FIG. 63 in this way and thus obtain the same effects as in the sixth embodiment.

[16th Embodiment]

The 16th embodiment of the present invention will be described next. In this embodiment, the manufacturing method of the eighth embodiment is applied to the micromirror device shown in FIG. 63. The arrangement of the micromirror device is the same as that of the micromirror device of the 12th embodiment shown in FIGS. 41 to 45 except that the lower electrode 627 is not present, and a description thereof will be made using the reference numerals in FIGS. 41 to 45 and 63.

A method of manufacturing a mirror substrate 614 will be described first. The mirror substrate 614 is prepared using a SOI substrate. Using a SOI substrate as a starting substrate, a frame portion, movable beams 613*a* and 613*b*, connectors 612*a* and 612*b*, and mirror 611 are formed on the SOI layer by a known lithography technique.

In the step of manufacturing the mirror substrate 614, first, a photosensitive resist is applied to the SOI layer in a desired thickness by spin coating. A reticle (mask) having a light-shielding body in a shape conforming to a pattern is aligned with the substrate having the photosensitive resist and held. The reticle is irradiated with light having the photosensitive wavelength of the photosensitive resist so as to form an image corresponding to the silhouette of the light-shielding body on the wafer with the photosensitive resist. The irradiation is performed after determining the light irradiation time for obtaining a desired pattern in a desired size. The resist with a latent image formed is immersed in a developer. After determining the time of immersing the wafer with resist in the developer so as to form a desired pattern in a desired size, the wafer is immersed in the developer for the determined time. After that, the entire wafer is dried to harden the resist. A resist pattern is formed on the SOI substrate thus far.

Using the formed resist as a mask, the frame portion, movable beams 613*a* and 613*b*, connectors 612*a* and 612*b*, mirror 611 and the like are formed on the SOI layer by DRIE that is a deep engraving technique for silicon. At this time, an etching intermediate film may be used. Alternatively, the silicon may directly be processed using the resist as an etching mask. After etching the silicon, the photosensitive resist used as a mask is removed. After removal, the wafer is cleaned to expose a clean silicon surface.

Then, the base substrate (silicon base portion) is processed. First, a protective organic film is applied to the SOI surface side. A photosensitive resist or a film of, e.g., polyimide having known workability may be used as the organic film. Since this organic film needs to be removed finally, a film having high strippability and removability is preferably used. However, since a resist is used to process the lower surface while the protective film remains, it is essential to select a material that never poses a problem at that time.

After forming the organic film on the SOI surface, a photosensitive resist is applied to the lower surface of the base substrate on the opposite side of the SOI surface. When applying the photosensitive resist, the SOI surface side comes into contact with the sample table of the coater. However, since the organic film is deposited, there is no damage to the structure formed on the SOI surface. After applying the photosensitive resist, a reticle (mask) having a light-shielding body in a shape conforming to a desired pattern is aligned with the substrate having the photosensitive resist and, more particularly, with the structure on the SOI surface and held. The reticle is irradiated with light having the photosensitive wavelength of the photosensitive resist so as to form an image corresponding to the silhouette of the light-shielding body on the wafer with the photosensitive resist. The irradiation is performed after determining the light irradiation time for obtaining a desired pattern in a desired size. The resist with a latent image formed is immersed in a developer. After determining the time of immersing the wafer with resist in the developer so as to form a desired pattern in a desired size, the wafer is immersed in the developer for the determined time. After that, the entire wafer is dried to harden the resist. A resist pattern is formed on the base substrate thus far.

Using the formed resist as a mask, the silicon of the unnecessary base substrate on the lower side of a portion where the mirror 611 and the like are formed on the SOI layer is removed by DRIE that is a deep engraving technique for silicon. At this time, an etching intermediate film such as a silicon oxide film may be used. Alternatively, the silicon may directly be processed using the resist as an etching mask. After etching the silicon, the photosensitive resist used as a mask is removed. After removal, the wafer is cleaned to expose a clean surface.

FIGS. 49A to 49D and 50A to 50D are sectional views showing steps in depositing a metal film on the mirror surface according to this embodiment. The sectional views illustrate steps after the unnecessary base substrate has been removed by etching, and the wafer has been cleaned.

Figure 49A:
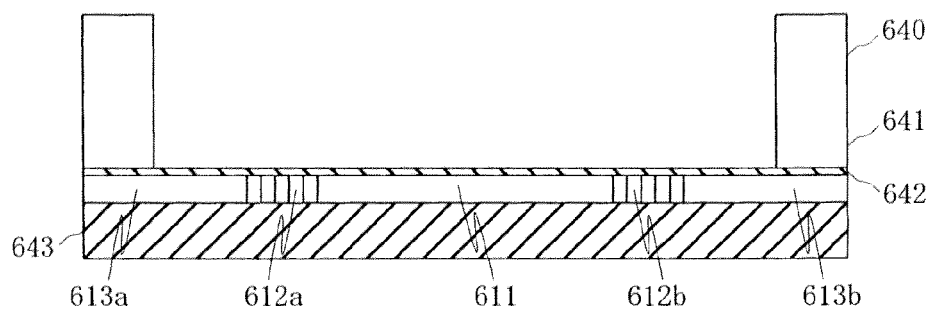
FIGS. 49A to 49D are sectional views showing steps in depositing a metal film on a mirror surface according to the 16th embodiment of the present invention.

As shown in FIG. 49A, the movable beams 613*a* and 613*b*, connectors 612*a* and 612*b*, mirror 611, and frame portion (not shown) are formed on the SOI layer. A frame member 640 is formed by etching an unnecessary base substrate (silicon base portion) 641 on the lower side of a portion where the movable beams 613*a* and 613*b*, connectors 612*a* and 612*b*, mirror 611, frame portion, and the like are formed. A protective organic film 643 is formed on the SOI surface side.

Figure 49B:
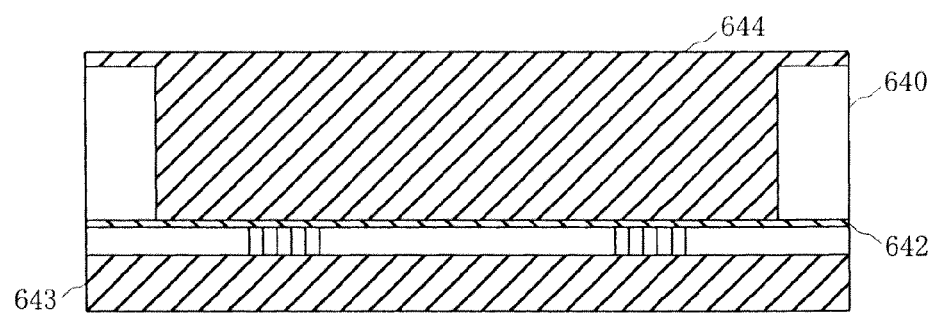

As shown in FIG. 49B, a resist 644 is applied again. To apply the resist 644 into the etched portion of the silicon base portion 641, the resist 644 is applied to be thicker than the silicon base portion 641, or applied using a spray resist coater use of which has started in recent years. In the example shown in FIG. 49B, the resist 644 is applied thick by the conventional method.

Figure 49C:
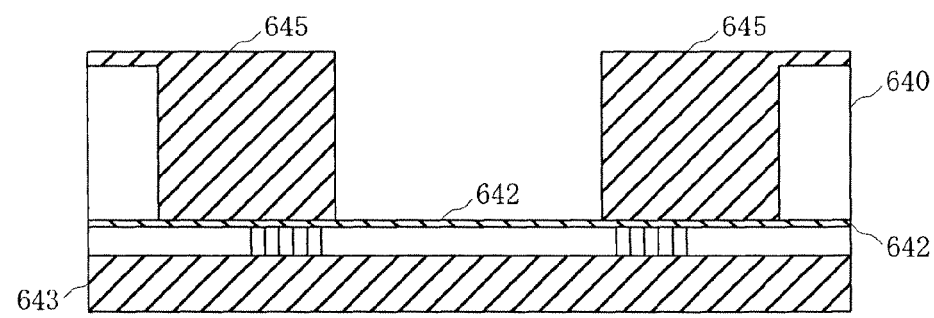

After applying the photosensitive resist 644, a reticle (mask) having a light-shielding body in a shape conforming to a desired pattern is aligned with the substrate having the resist 644 and, more particularly, with the structure on the SOI surface and held. The reticle is irradiated with light having the photosensitive wavelength of the resist 644 so as to form an image corresponding to the silhouette of the light-shielding body on the wafer with the resist 644. The irradiation is performed after determining the light irradiation time for obtaining a desired pattern in a desired size. The resist 644 with a latent image formed is immersed in a developer. After determining the time of immersing the wafer with resist in the developer so as to form a desired pattern in a desired size, the wafer is immersed in the developer for the determined time. After that, the entire wafer is dried to harden the resist 644. A resist pattern 645 is formed on the lower surface of the base substrate thus far (FIG. 49C). As shown in FIG. 49C, the resist pattern 645 has an opening in a region facing the mirror 611. Note that a more vertical, higher-quality pattern can be formed by not a pattern forming technique using a single resist layer but a pattern forming technique using multiple resist layers.

Figure 49D:
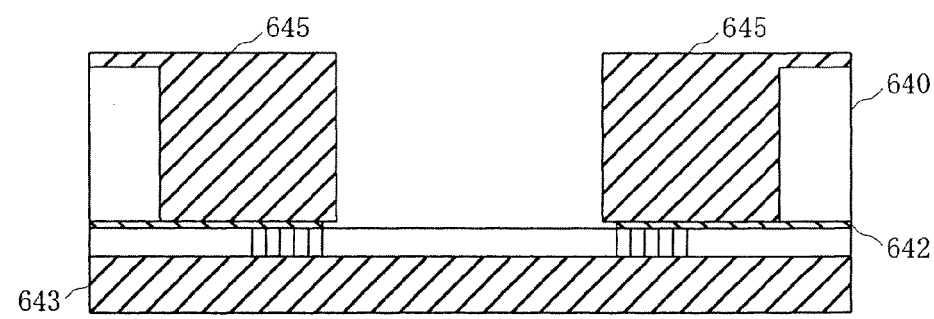

Using the resist pattern 645 as a mask, a BOX layer 642 made of a silicon oxide film is etched using a hydrofluoric acid-based solution such as buffered hydrofluoric acid. When a hydrofluoric acid-based solution is used, isotropic etching occurs. For this reason, the BOX layer 642 under the edges of the resist pattern 645 is also etched in the horizontal direction as much as the vertical thickness of the BOX layer 642. Hence, the etching of the BOX layer 642 progresses horizontally from the edges of the resist pattern 645, and a structure with the resist pattern 645 projecting from the BOX layer 642 can be formed, as shown in FIG. 49D. The BOX layer 642 is preferably thicker than the metal film to be deposited on the mirror surface. The thickness of the metal film necessary for reflecting infrared rays is preferably 50 nm or more and, more preferably, 100 nm or more. Hence, making allowance for errors, the thickness of the BOX layer 642 is preferably 1 μm or more. Note that when the etching should progress horizontally by more than the thickness of the BOX layer 642, the etching amount can be controlled by over etching.

Figure 50A:
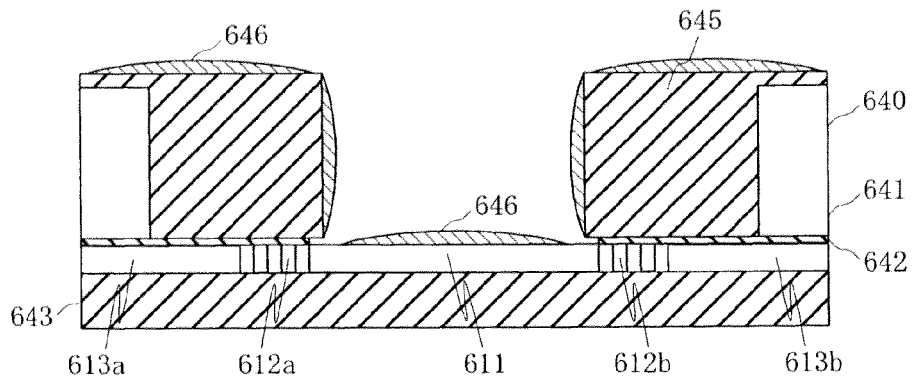
FIGS. 50A to 50D are sectional views showing steps in depositing a metal film on a mirror surface according to the 16th embodiment of the present invention.

After etching the BOX layer 642, a metal film 646 of gold or the like is deposited by sputtering or deposition (FIG. 50A). Since the mirror 611 is formed from silicon, gold is deposited directly or after an underlying metal such as titanium or chromium is deposited to improve the adhesion between gold and silicon. When depositing different metal films, they are preferably continuously deposited without extracting the wafer from the vacuum apparatus.

Figure 50B:
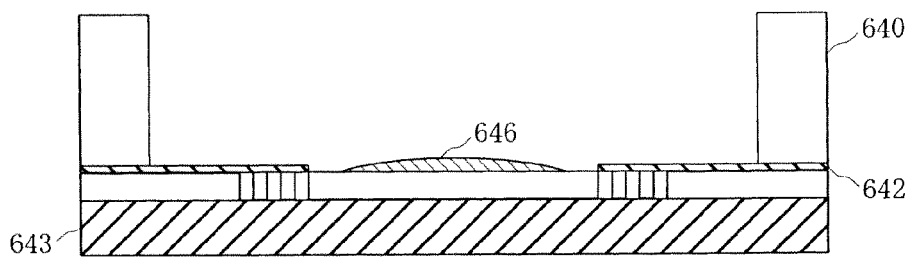

After depositing the metal film 646, the resist pattern 645 is stripped together with the metal film 646 adhered to it (FIG. 50B). In this case, the resist pattern 645 is stripped using a resist stripper such as N-methylpyrrolidone. The type of the resist stripper can freely be selected in accordance with the resist in use, as a matter of course. When the resist is applied thick, it can easily be stripped by the stress of the thick resist.

Figure 50C:
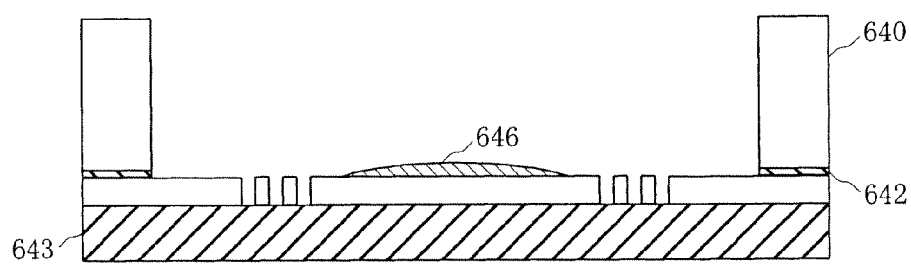

Next, the BOX layer 642 exposed after the stripping of the resist pattern 645 is etched using a hydrofluoric acid-based solution such as buffered hydrofluoric acid (FIG. 50C). The metal film 646 is thus locally deposited in a desired region of the mirror 611.

Figure 50D:
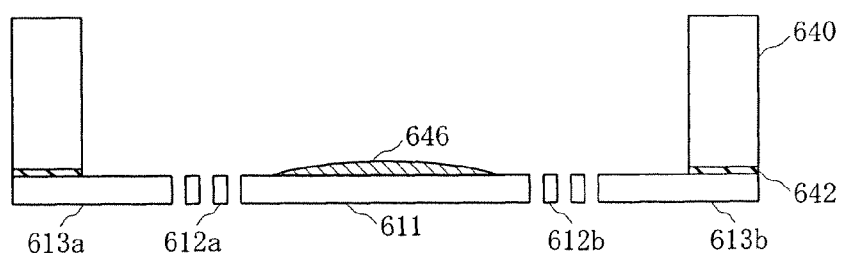

Finally, the organic film 643 that protects the mirror structure and the like is removed by etching, thereby forming a rotatable structure (FIG. 50D). When a plurality of chips are formed on the wafer, a process called dicing is performed to cut the wafer and separate the chips. After that, the organic film 643 is removed by etching. Note that forming protective films on both surfaces of the substrate at the time of dicing allows to prevent damage to the structures such as the connectors 612a and 612b. Forming a plurality of chips on a wafer is more general than forming only one chip on a wafer. The mirror substrate 614 having the rotatable mirror 611 is formed in the above-described way.

The manufacturing method on the electrode substrate side is the same as in the eighth embodiment, and a description thereof will not be repeated. It is possible to apply the arrangement of the eighth embodiment to the micromirror device shown in FIG. 63 in this way and thus obtain the same effects as in the eighth embodiment.

[17th Embodiment]

The 17th embodiment of the present invention will be described next. In this embodiment, the manufacturing method of the ninth embodiment is applied to the micromirror device shown in FIG. 63. In this embodiment as well, the arrangement of the micromirror device is the same as in the 16th embodiment.

A method of manufacturing the micromirror device according to this embodiment will be described below. A method of manufacturing a mirror substrate 614 will be described first. The processes up to forming a frame portion, movable beams 613a and 613b, connectors 612a and 612b, and mirror 611 on the SOI layer are the same as in the 16th embodiment.

After forming the frame portion, movable beams 613a and 613b, connectors 612a and 612b, and mirror 611, the photosensitive resist used as a mask is removed, and the wafer is cleaned to expose a clean silicon surface.

A resist is applied to the SOI surface side again. A resist pattern is formed by a known lithography technique so as to remove the resist only on the surface of the mirror 611 on which a metal should be deposited. After a metal film of, for example, gold is deposited, the resist is removed by stripping together with an unnecessary metal. The substrate is cleaned to make its surface clean.

After that, the base substrate (silicon base portion) is processed. First, as in the 16th embodiment, a protective organic film is applied to the SOI surface side. Then, a resist pattern to be used to remove the silicon base portion by etching is formed.

Using the formed resist pattern as a mask, the silicon of the unnecessary base substrate on the lower side of a portion where the mirror 611 and the like are formed on the SOI layer is removed by DRIE that is a deep engraving technique for silicon. After etching the silicon, the photosensitive resist used as a mask is removed. After removal, the wafer is cleaned to expose a clean surface.

FIGS. 51A to 51D and 52A to 52D are sectional views showing steps in depositing a metal film on the mirror surface according to this embodiment. The sectional views illustrate steps after the unnecessary base substrate has been removed by etching, and the wafer has been cleaned.

Figure 51A:
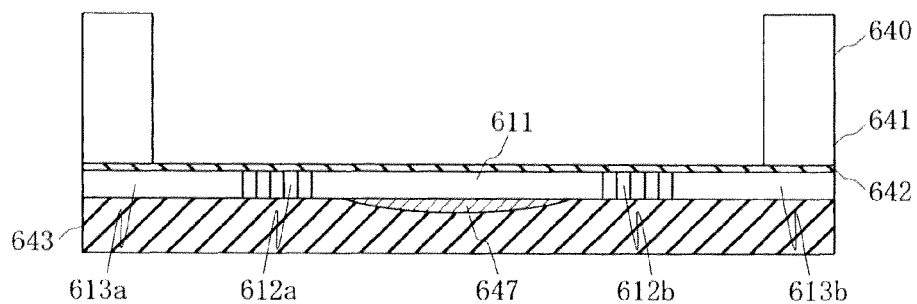
FIGS. 51A to 51D are sectional views showing steps in depositing a metal film on a mirror surface according to the 17th embodiment of the present invention.

As shown in FIG. 51A, the movable beams 613a and 613b, connectors 612a and 612b, mirror 611, and frame portion (not shown) are formed on the SOI layer. A frame member 640 is formed by etching an unnecessary base substrate (silicon base portion) 641 on the lower side of a portion where the movable beams 613a and 613b, connectors 612a and 612b, mirror 611, frame portion, and the like are formed. A protective organic film 643 is formed on the SOI surface side. A metal film 647 is formed on the surface of the mirror 611.

Figure 51B:
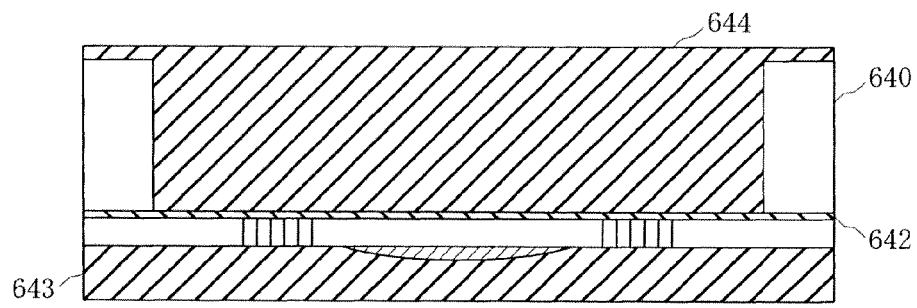
Figure 51C:
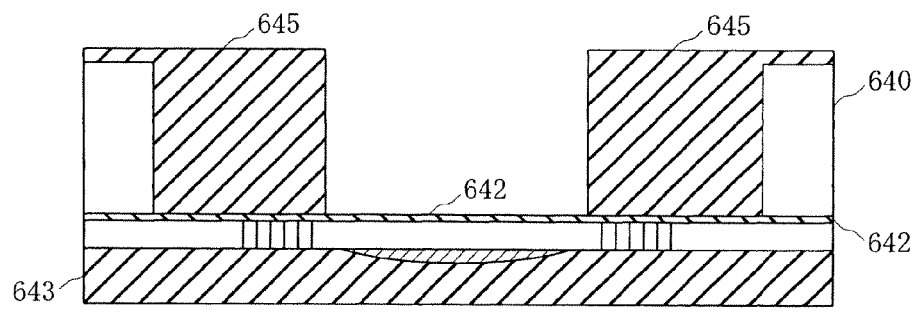
Figure 51D:
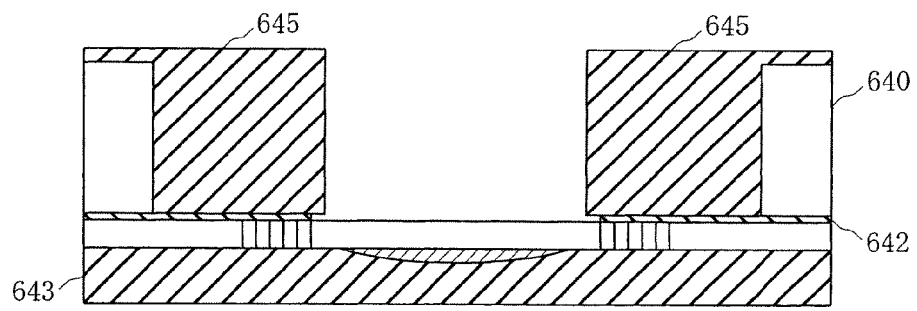

As shown in FIG. 51B, a resist 644 is applied again. A resist pattern 645 is formed on the lower surface of the base substrate by a known lithography technique (FIG. 51C). Using the resist pattern 645 as a mask, a BOX layer 642 made of a silicon oxide film is etched using a hydrofluoric acid-based solution such as buffered hydrofluoric acid. As in the 16th embodiment, after the BOX layer 642 on the mirror 611 has been etched, over etching is performed to some extent (FIG. 51D).

Figure 52A:
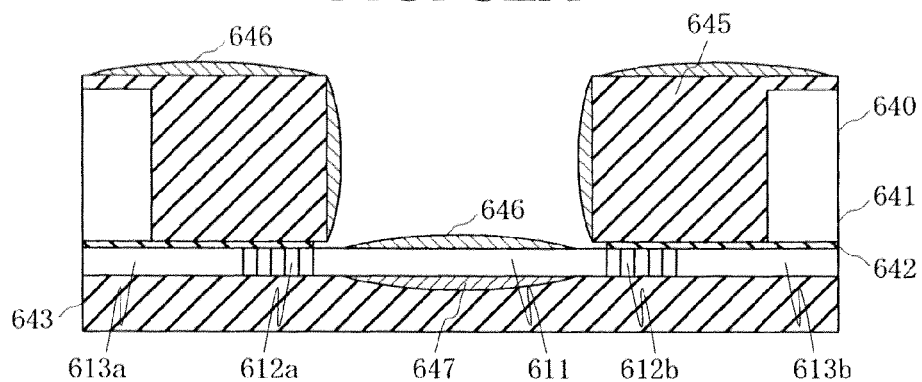
FIGS. 52A to 52D are sectional views showing steps in depositing a metal film on a mirror surface according to the 17th embodiment of the present invention.
Figure 52B:
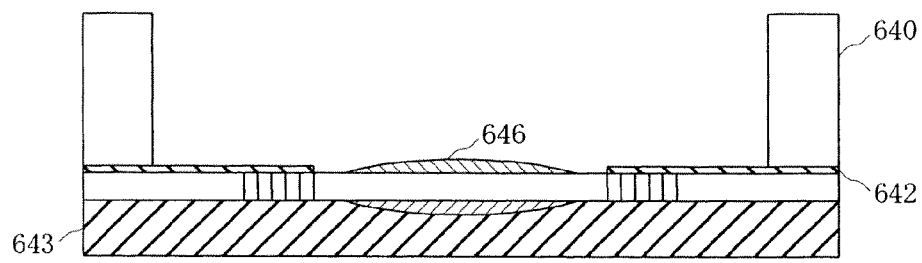
Figure 52C:
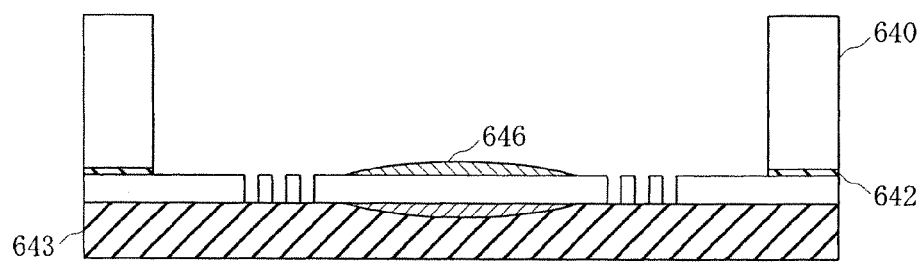

After etching the BOX layer 642, a metal film 646 of gold or the like is deposited by sputtering or deposition (FIG. 52A). After depositing the metal film 646, the resist pattern 645 is stripped together with the metal film 646 adhered to it (FIG. 52B). Next, the BOX layer 642 exposed after the stripping of the resist pattern 645 is etched using a hydrofluoric acid-based solution such as buffered hydrofluoric acid (FIG. 52C). The metal film 646 is thus locally deposited in a desired region of the mirror 611.

Figure 52D:
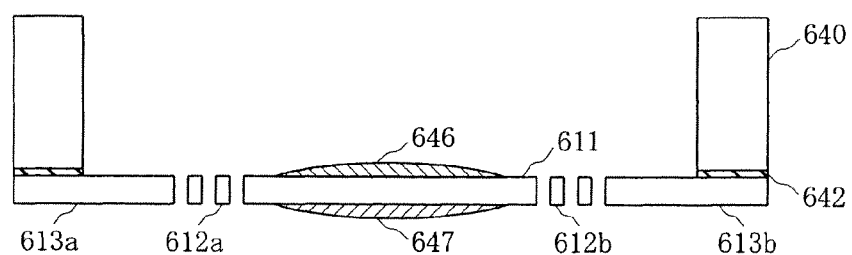

Finally, the organic film 643 that protects the mirror structure and the like is removed by etching, thereby forming a rotatable structure (FIG. 52D). When a plurality of chips are formed on the wafer, a process called dicing is performed to cut the wafer and separate the chips. After that, the organic film 643 is removed by etching. The mirror substrate 614 having the rotatable mirror 611 is formed in the above-described way.

It is possible to apply the arrangement of the ninth embodiment to the micromirror device shown in FIG. 63 in this way and thus obtain the same effects as in the ninth embodiment.

[18th Embodiment]

The 18th embodiment of the present invention will be described next. In this embodiment, the manufacturing method of the 10th embodiment is applied to the micromirror device shown in FIG. 63. The arrangement of the micromirror device is the same as that of the micromirror device of the 12th embodiment shown in FIGS. 41 to 45 except that the lower electrode 627 is not present, and a description thereof will be made using the reference numerals in FIGS. 41 to 45 and 63.

A method of manufacturing a mirror substrate 614 will be described first. The mirror substrate 614 is prepared using a SOI substrate. Using a SOI substrate as a starting substrate, a frame portion, movable beams 613a and 613b, connectors 612a and 612b, and mirror 611 are formed on the SOI layer by a known lithography technique.

In the step of manufacturing the mirror substrate 614, first, a photosensitive resist is applied to the SOI layer in a desired thickness by spin coating. A reticle (mask) having a light-shielding body in a shape conforming to a pattern is aligned with the substrate having the photosensitive resist and held. The reticle is irradiated with light having the photosensitive wavelength of the photosensitive resist so as to form an image corresponding to the silhouette of the light-shielding body on the wafer with the photosensitive resist. The irradiation is performed after determining the light irradiation time for obtaining a desired pattern in a desired size. The resist with a latent image formed is immersed in a developer. After determining the time of immersing the wafer with resist in the developer so as to form a desired pattern in a desired size, the wafer is immersed in the developer for the determined time. After that, the entire wafer is dried to harden the resist. A resist pattern is formed on the SOI substrate thus far.

Using the formed resist as a mask, the frame portion, movable beams 613a and 613b, connectors 612a and 612b, mirror 611, and the like are formed on the SOI layer by DRIE that is a deep engraving technique for silicon. At this time, an etching intermediate film may be used. Alternatively, the silicon may directly be processed using the resist as an etching mask. After etching the silicon, the photosensitive resist used as a mask is removed. After removal, the wafer is cleaned to expose a clean silicon surface.

Then, the base substrate (silicon base portion) is processed. First, a protective organic film is applied to the SOI surface side. A photosensitive resist or a film of, e.g., polyimide having known workability may be used as the organic film. Since this organic film needs to be removed finally, a film having high strippability and removability is preferably used. However, since a resist is used to process the lower surface while the protective film remains, it is essential to select a material that never poses a problem at that time.

After forming the organic film on the SOI surface, a photosensitive resist is applied to the lower surface of the base substrate on the opposite side of the SOI surface. When applying the photosensitive resist, the SOI surface side comes into contact with the sample table of the coater. However, since the organic film is deposited, there is no damage to the structure formed on the SOI surface. After applying the photosensitive resist, a reticle (mask) having a light-shielding body in a shape conforming to a desired pattern is aligned with the substrate having the photosensitive resist and, more particularly, with the structure on the SOI surface and held. The reticle is irradiated with light having the photosensitive wavelength of the photosensitive resist so as to form an image corresponding to the silhouette of the light-shielding body on the wafer with the photosensitive resist. The irradiation is performed after determining the light irradiation time for obtaining a desired pattern in a desired size. The resist with a latent image formed is immersed in a developer. After determining the time of immersing the wafer with resist in the developer so as to form a desired pattern in a desired size, the wafer is immersed in the developer for the determined time. After that, the entire wafer is dried to harden the resist. A resist pattern is formed on the base substrate thus far.

Using the formed resist as a mask, the silicon of the unnecessary base substrate on the lower side of a portion where the mirror 611 and the like are formed on the SOI layer is removed by DRIE that is a deep engraving technique for silicon. At this time, an etching intermediate film such as a silicon oxide film may be used. Alternatively, the silicon may directly be processed using the resist as an etching mask. After etching the silicon, the photosensitive resist used as a mask is removed.

Subsequently, a BOX layer formed from a silicon oxide film is removed by etching using a hydrofluoric acid-based solution such as buffered hydrofluoric acid. After removal of the silicon oxide film, the wafer is cleaned to expose a clean surface.

FIGS. 53A to 53D and 54A to 54C are sectional views showing steps in depositing a metal film on the mirror surface according to this embodiment. The sectional views illustrate steps after the unnecessary base substrate and the BOX layer have been removed by etching, and the wafer has been cleaned.

Figure 53A:
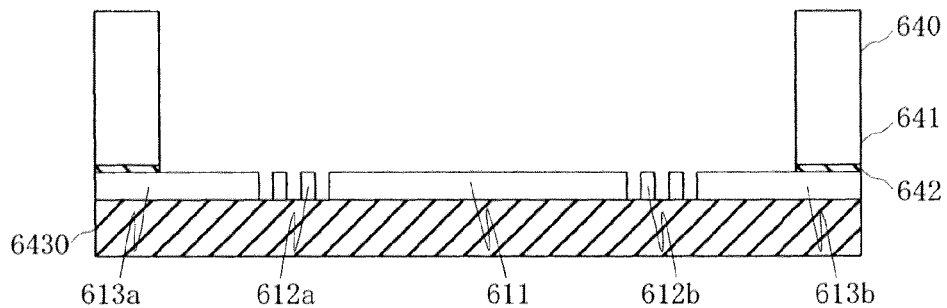
FIGS. 53A to 53D are sectional views showing steps in depositing a metal film on a mirror surface according to the 18th embodiment of the present invention.

As shown in FIG. 53A, the movable beams 613a and 613b, connectors 612a and 612b, mirror 611, and frame portion (not shown) are formed on the SOI layer. A frame member 640 is formed by etching an unnecessary base substrate (silicon base portion) 641 and a BOX layer 642 on the lower side of a portion where the movable beams 613a and 613b, connectors 612a and 612b, mirror 611, frame portion, and the like are formed. A protective organic film 6430 is formed on the SOI surface side.

Figure 53B:
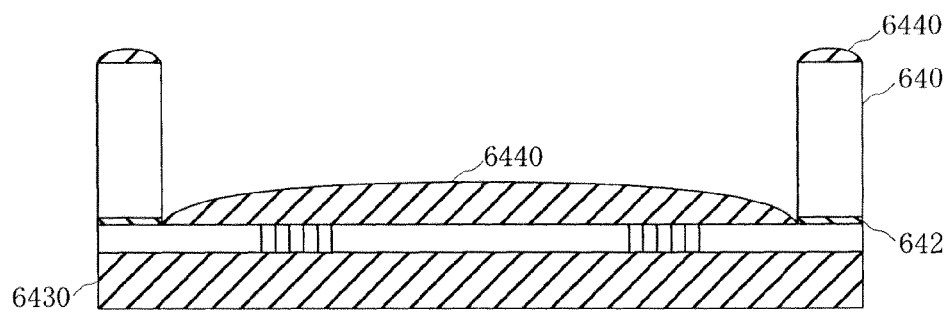

As shown in FIG. 53B, a negative resist 6440 is applied using a spray resist coater. The resist 6440 needs to be thinner than the silicon base portion 641 and thicker than a metal film to be deposited later. When gold is used for the metal film, a gold film having a thickness of about 50 to 200 nm is deposited. Hence, the resist 6440 preferably has a thickness of 500 nm or more. The optimum condition changes depending on the shape of the formed resist pattern and the gold deposition method. It is necessary to only form a resist pattern having a reverse tapered shape thicker by several tens percent than the metal film so as not to produce burrs or the like on the metal film at the time of stripping.

Figure 53C:
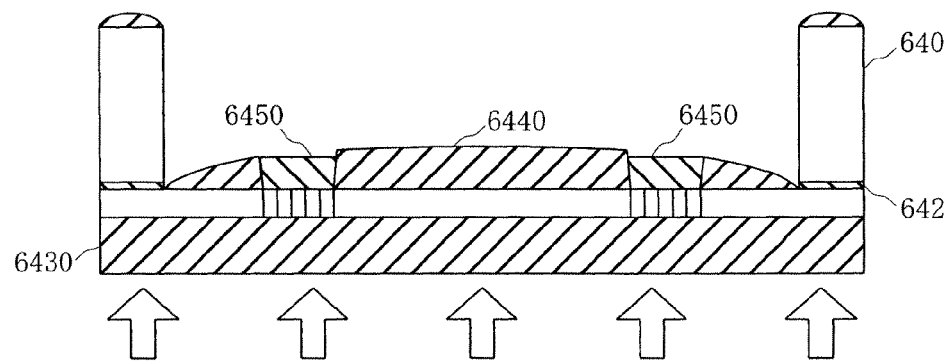

Subsequently, the photosensitive negative resist 6440 is exposed from the surface with the organic film 6430 (FIG. 53C). Reference numeral 6450 in FIG. 53C indicates an exposed portion. Since structures such as the movable beams 613a and 613b, connectors 612a and 612b, mirror 611, and frame portion are formed on the SOI layer, sufficiently thick silicon shields light. Light that has come through the gaps between these structures exposes the negative resist 6440. More specifically, the gaps between the structures indicate the portion between the mirror 611 and the connectors 612a and 612b and the portion between the connectors 612a and 612b and the movable beams 613a and 613b. The irradiation is performed after determining the light irradiation time for obtaining a pattern in desired shape and size after development. When the exposure dose is increased, a wide region of the resist 6440 is exposed due to diffractions at the edges of the structures.

Since the connectors 612a and 612b are made of silicon, the resist 6440 existing on them is not supposed to be exposed. However, since connectors 612a and 612b have thin line structures, the resist 6440 existing on them is exposed to light that has come through the gaps.

Figure 53D:
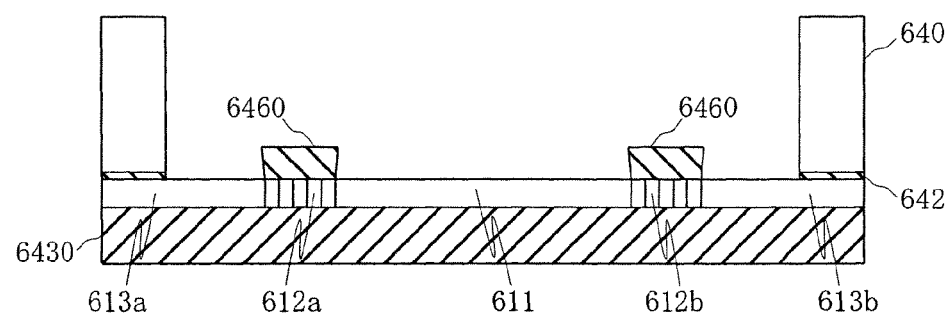

The resist 6440 with a latent image formed is immersed in a developer. After determining the time of immersing the wafer with resist in the developer so as to form a desired pattern in a desired size, the wafer is immersed in the developer for the determined time. After that, the entire wafer is dried to harden the resist 6440. A resist pattern 6460 having a reverse tapered shape which spreads as the distance from the SOI layer increases is formed on the lower surface of the base substrate thus far (FIG. 53D). The resist pattern 6460 has the reverse tapered shape because the resist 6440 is irradiated with spreading light that has come through the gaps between the structures. As shown in FIG. 53D, the resist pattern 6460 has opening regions facing the movable beams 613a and 613b and the mirror 611. As described above, since the resist 6440 on the connectors 612a and 612b is exposed to light that has come through the gaps between the structures, the resist pattern 6460 is formed on the connectors 612a and 612b. For this reason, in the process of depositing a metal film to be described later, no metal film is deposited on the connectors 612a and 612b. It is therefore possible to suppress drift of the tilt angle of the mirror 611.

Figure 54A:
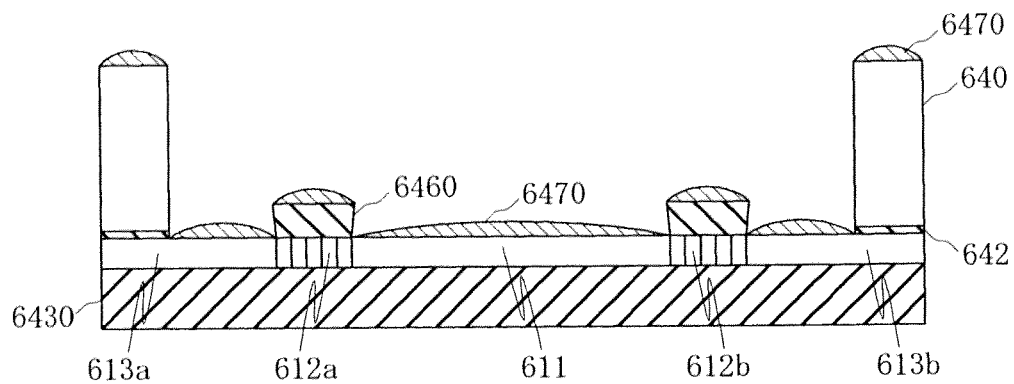
FIGS. 54A to 54C are sectional views showing steps in depositing a metal film on a mirror surface according to the 18th embodiment of the present invention.

Next, a metal film 6470 of gold or the like is deposited by sputtering or deposition (FIG. 54A). Since the movable beams 613a and 613b and the mirror 611 are formed from silicon, gold is deposited directly or after an underlying metal such as titanium or chromium is deposited to improve the adhesion between gold and silicon. When depositing different metal films, they are preferably continuously deposited without extracting the wafer from the vacuum apparatus.

Figure 54B:
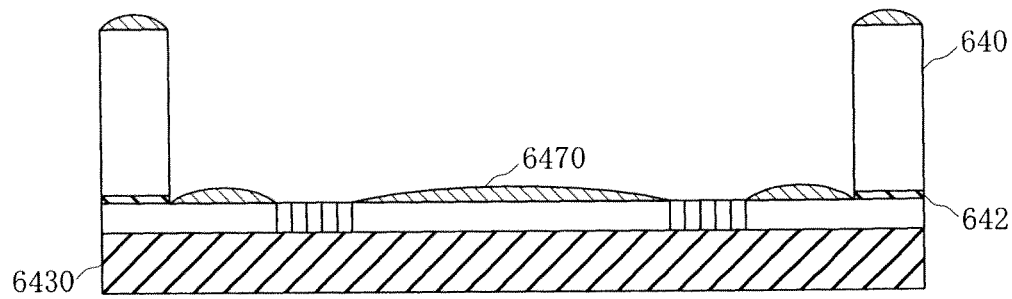

After depositing the metal film 6470, the resist pattern 6460 is stripped together with the metal film 6470 adhered to it (FIG. 54B). In this case, the resist pattern 6460 is stripped using a resist stripper such as N-methylpyrrolidone. The type of the resist stripper can freely be selected in accordance with the resist in use, as a matter of course. When the resist is applied thick, it can easily be stripped by the stress of the thick resist. After stripping the resist pattern 6460, the wafer is cleaned to obtain a clean surface.

Figure 54C:
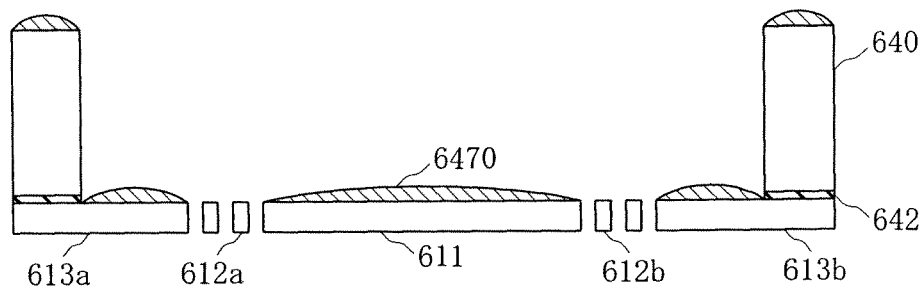

Finally, the organic film 6430 that protects the mirror structure and the like is removed by etching, thereby forming a rotatable structure (FIG. 54C). When a plurality of chips are formed on the wafer, a process called dicing is performed to cut the wafer and separate the chips. After that, the organic film 6430 is removed by etching. Forming a plurality of chips on a wafer is more general than forming only one chip on a wafer. The mirror substrate 614 having the rotatable mirror 611 is formed in the above-described way.

The manufacturing method on the electrode substrate side is the same as in the 10th embodiment, and a description thereof will not be repeated. It is possible to apply the arrangement of the 10th embodiment to the micromirror device shown in FIG. 63 in this way and thus obtain the same effects as in the 10th embodiment.

[19th Embodiment]

The 19th embodiment of the present invention will be described next. In this embodiment, the manufacturing method of the 11th embodiment is applied to the micromirror device shown in FIG. 63. In this embodiment as well, the arrangement of the micromirror device is the same as in the 18th embodiment.

A method of manufacturing the micromirror device according to this embodiment will be described below. A method of manufacturing a mirror substrate 614 will be described first. The processes up to forming a frame portion, movable beams 613a and 613b, connectors 612a and 612, and mirror 611 on the SOI layer, and removing, by etching, an unnecessary silicon base portion 641 and BOX layer 642 on the lower side of a portion where the mirror 611 and the like are formed on the SOI layer are the same as in the 18th embodiment.

FIGS. 55A to 55D and 56A to 56D are sectional views showing steps in depositing a metal film on the mirror surface according to this embodiment. The sectional views illustrate steps after the unnecessary silicon base portion 641 and BOX layer 642 have been removed by etching, and the wafer has been cleaned.

Figure 55A:
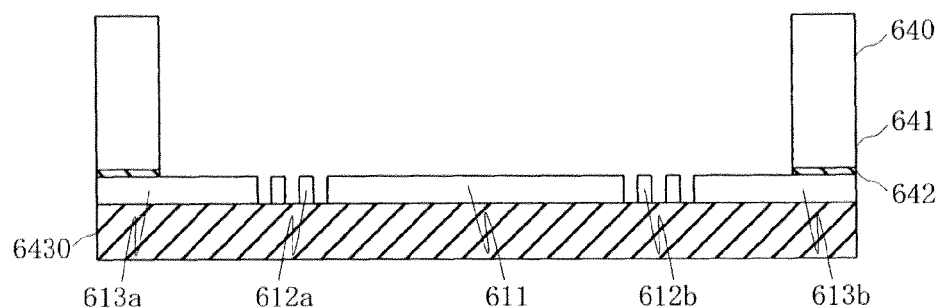
FIGS. 55A to 55D are sectional views showing steps in depositing a metal film on a mirror surface according to the 19th embodiment of the present invention.

As shown in FIG. 55A, the movable beams 613a and 613b, connectors 612a and 612b, mirror 611, and frame portion (not shown) are formed on the SOI layer. A frame member 640 is formed by etching an unnecessary base substrate (silicon base portion) 641 and a BOX layer 642 on the lower side of a portion where the movable beams 613a and 613b, connectors 612a and 612b, mirror 611, frame portion, and the like are formed.

Figure 55B:
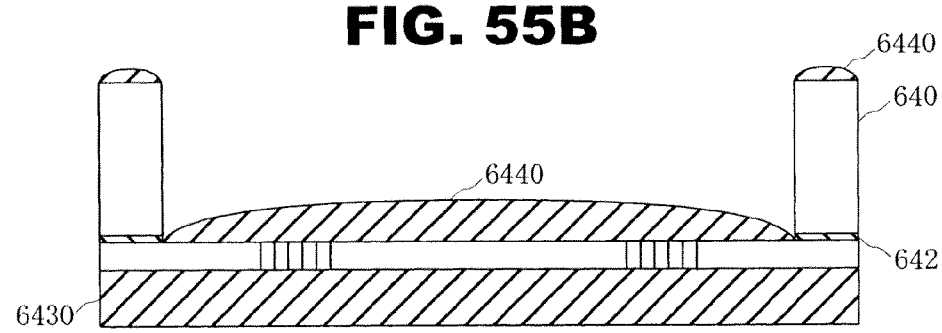

As in the 18th embodiment, a negative resist 6440 is applied using a spray resist coater (FIG. 55B).

Figure 55C:
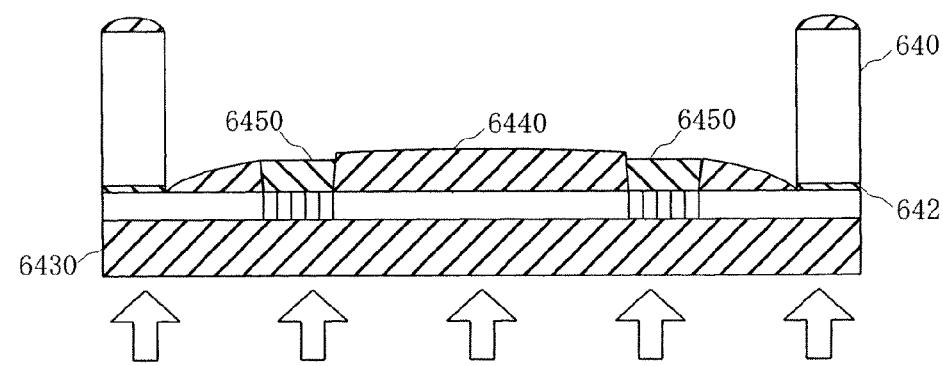

Subsequently, the photosensitive negative resist 6440 is exposed from the surface with an organic film 6430 (FIG. 55C). Reference numeral 6450 in FIG. 55C indicates an exposed portion. As described in the 18th embodiment, since structures such as the movable beams 613a and 613b, connectors 612a and 612b, mirror 611, and frame portion are formed on the SOI layer, sufficiently thick silicon shields light. Light that has come through the gaps between these structures exposes the negative resist 6440. In addition, since the connectors 612a and 612b have thin line structures, the resist 6440 existing on them is exposed to light that has come through the gaps.

Figure 55D:
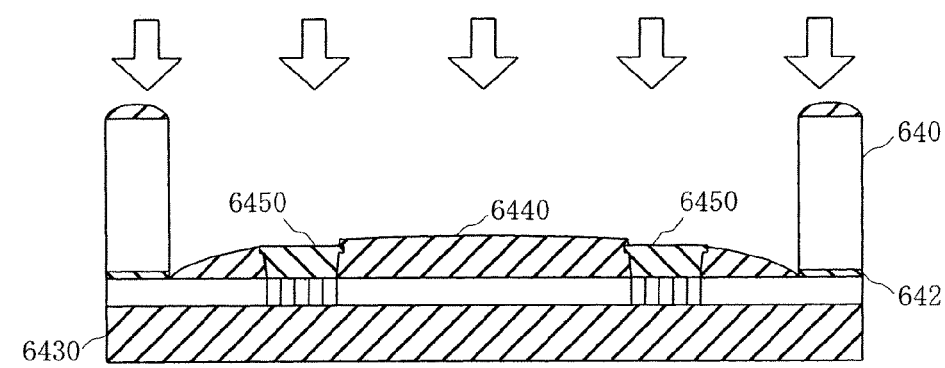

After the exposure, the entire surface is exposed from above the resist 6440 without forming a mask on the surface with the resist 6440 (FIG. 55D). The exposure dose at this time is about $\frac{1}{10}$ to $\frac{1}{2}$ a minimum critical exposure dose $D_0$ at which a resist pattern is obtained after exposure/development. Only a region where the sum of the exposure dose of the resist 6440 irradiated from the side of the organic film 6430 in the step of FIG. 55C and the exposure dose of the resist 6440 irradiated from above in the step of FIG. 55D exceeds the critical exposure dose $D_0$ is obtained as a resist pattern. The resist pattern has a T-top shape, i.e., T-shaped cross section. The resist pattern with such a shape has a pattern shape necessary in a lift-off process, like a resist pattern having a reverse tapered shape. The condition for each exposure dose is determined such that a pattern in desired shape and size is obtained after development. The step in FIG. 55D may be performed before the step in FIG. 55C.

Figure 56A:
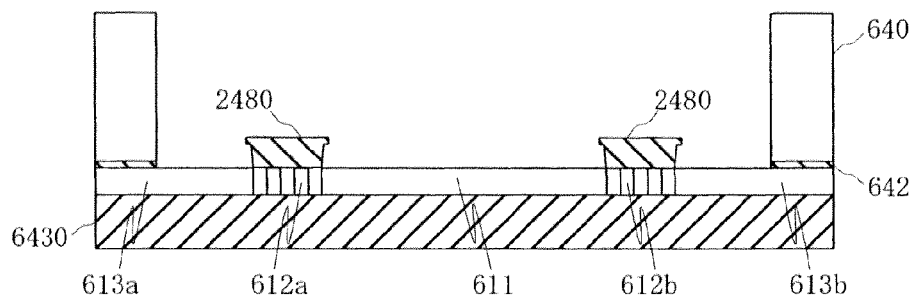
FIGS. 56A to 56D are sectional views showing steps in depositing a metal film on a mirror surface according to the 19th embodiment of the present invention.

The resist 6440 with a latent image formed is immersed in a developer. After determining the time of immersing the wafer with resist in the developer so as to form a desired pattern in a desired size, the wafer is immersed in the developer for the determined time. After that, the entire wafer is dried to harden the resist 6440. A resist pattern 2480 having a T-top shape is formed on the lower surface of the base substrate thus far (FIG. 56A). As shown in FIG. 56A, the resist pattern 2480 has opening regions facing the movable beams 613a and 613b and the mirror 611. As in the 18th embodiment, since the resist pattern 2480 is formed on the connectors 612a and 612b, no metal film is deposited on the connectors 612a and 612b in the process of depositing the metal film.

Figure 56B:
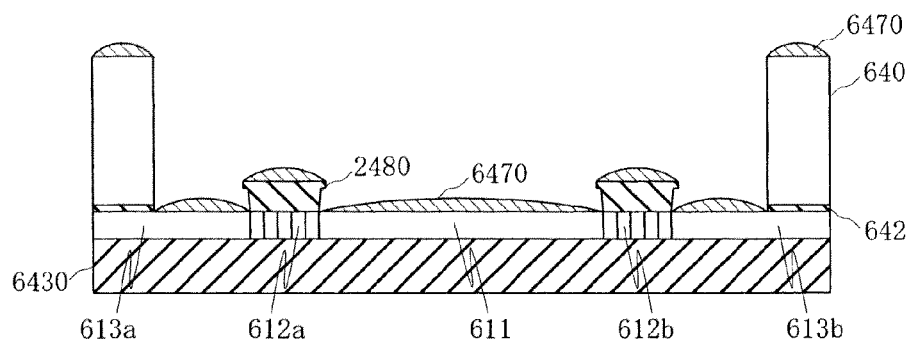
Figure 56C:
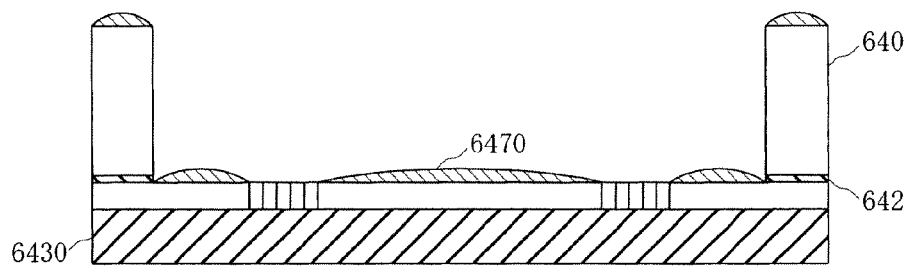

Next, a metal film 6470 of gold or the like is deposited by sputtering or deposition (FIG. 56B). After depositing the metal film 6470, the resist pattern 2480 is stripped together with the metal film 6470 adhered to it (FIG. 56C). After stripping the resist pattern 2480, the wafer is cleaned to obtain a clean surface.

Figure 56D:
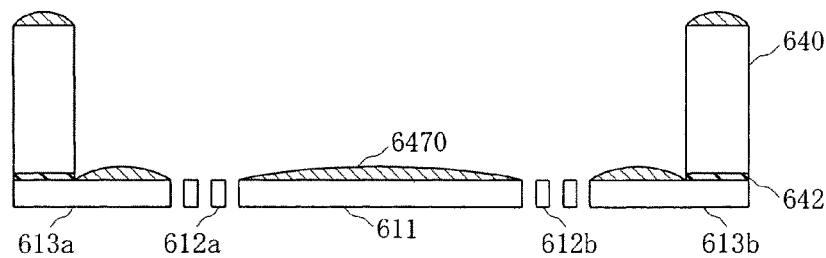

Finally, the organic film 6430 that protects the mirror structure and the like is removed by etching, thereby forming a rotatable structure (FIG. 56D). When a plurality of chips are formed on the wafer, a process called dicing is performed to cut the wafer and separate the chips. After that, the organic film 6430 is removed by etching. The mirror substrate 614 having the rotatable mirror 611 is formed in the above-described way.

It is possible to apply the arrangement of the 11th embodiment to the micromirror device shown in FIG. 63 in this way and thus obtain the same effects as in the 11th embodiment.

[20th Embodiment]

Figure 57:
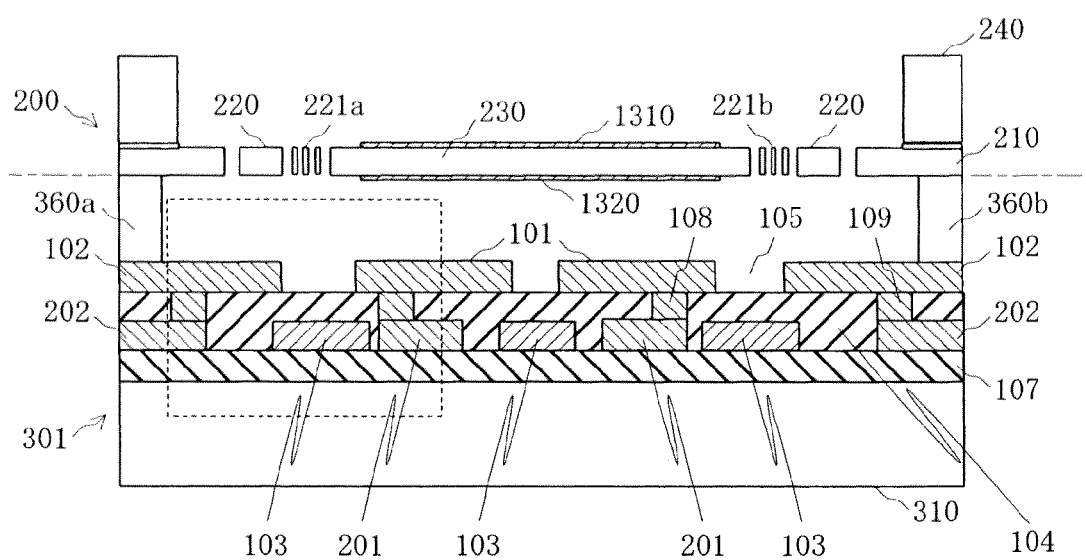
FIG. 57 is a sectional view showing the arrangement of a micromirror device according to the 20th embodiment of the present invention.

The 20th embodiment of the present invention will be described next. This embodiment is a combination of the first and seventh embodiments. FIG. 57 is a sectional view showing the arrangement of a micromirror device according to the 20th embodiment of the present invention. Referring to FIG. 57, metal films 1310 and 1320 are formed on both surfaces of a mirror 230, respectively. The arrangement of this embodiment is the same as that described in the first and seventh embodiments, and a description thereof will not be repeated. Note that the seventh embodiment may be combined with the second or third embodiment, as a matter of course.

[21st Embodiment]

Figure 58:
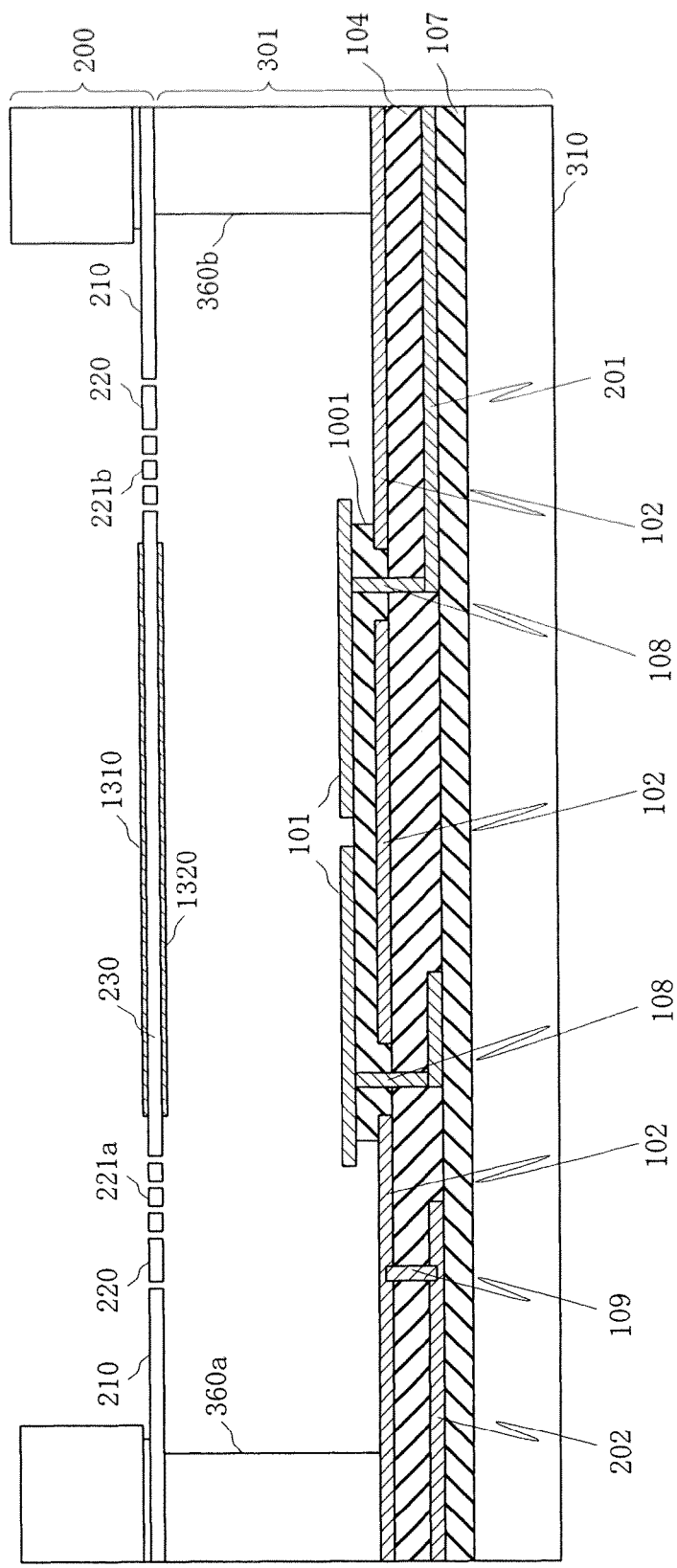
FIG. 58 is a sectional view showing the arrangement of a micromirror device according to the 21st embodiment of the present invention.

The 21st embodiment of the present invention will be described next. This embodiment is a combination of the fourth and seventh embodiments. FIG. 58 is a sectional view showing the arrangement of a micromirror device according to the 21st embodiment of the present invention. The arrangement of this embodiment is the same as that described in the fourth and seventh embodiments, and a description thereof will not be repeated. Note that the seventh embodiment may be combined with the fifth embodiment, as a matter of course.

[22nd Embodiment]

Figure 59:
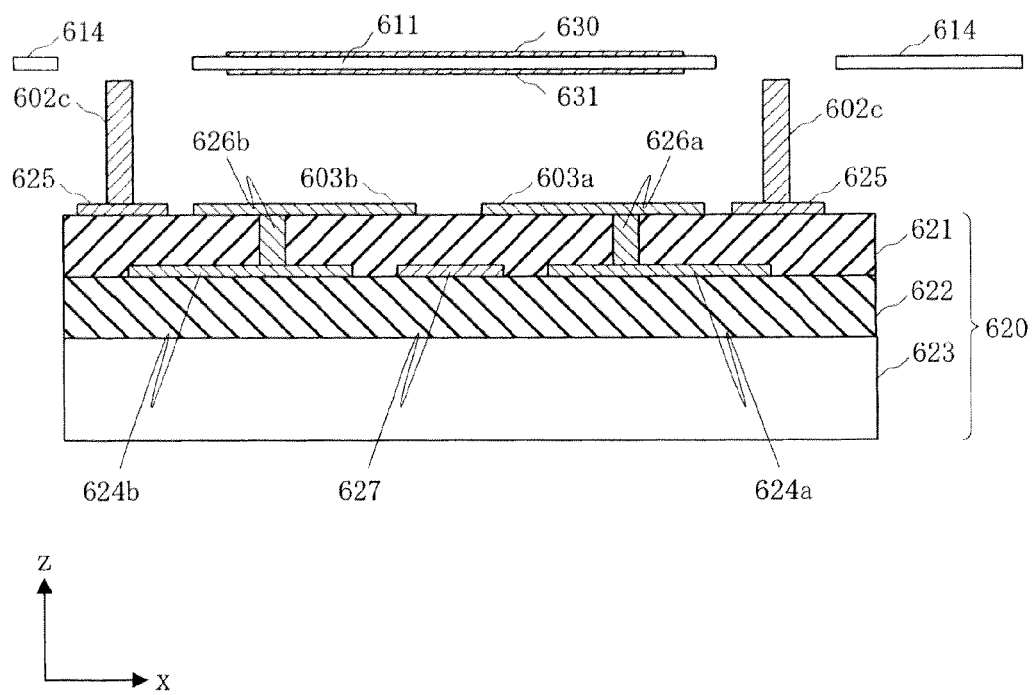
FIG. 59 is a sectional view showing the arrangement of a micromirror device according to the 22nd embodiment of the present invention.

The 22nd embodiment of the present invention will be described next. This embodiment is a combination of the 12th and 15th embodiments. FIG. 59 is a sectional view showing the arrangement of a micromirror device according to the 22nd embodiment of the present invention. The arrangement of this embodiment is the same as that described in the 12th and 15th embodiments, and a description thereof will not be repeated.

[23rd Embodiment]

Figure 60:
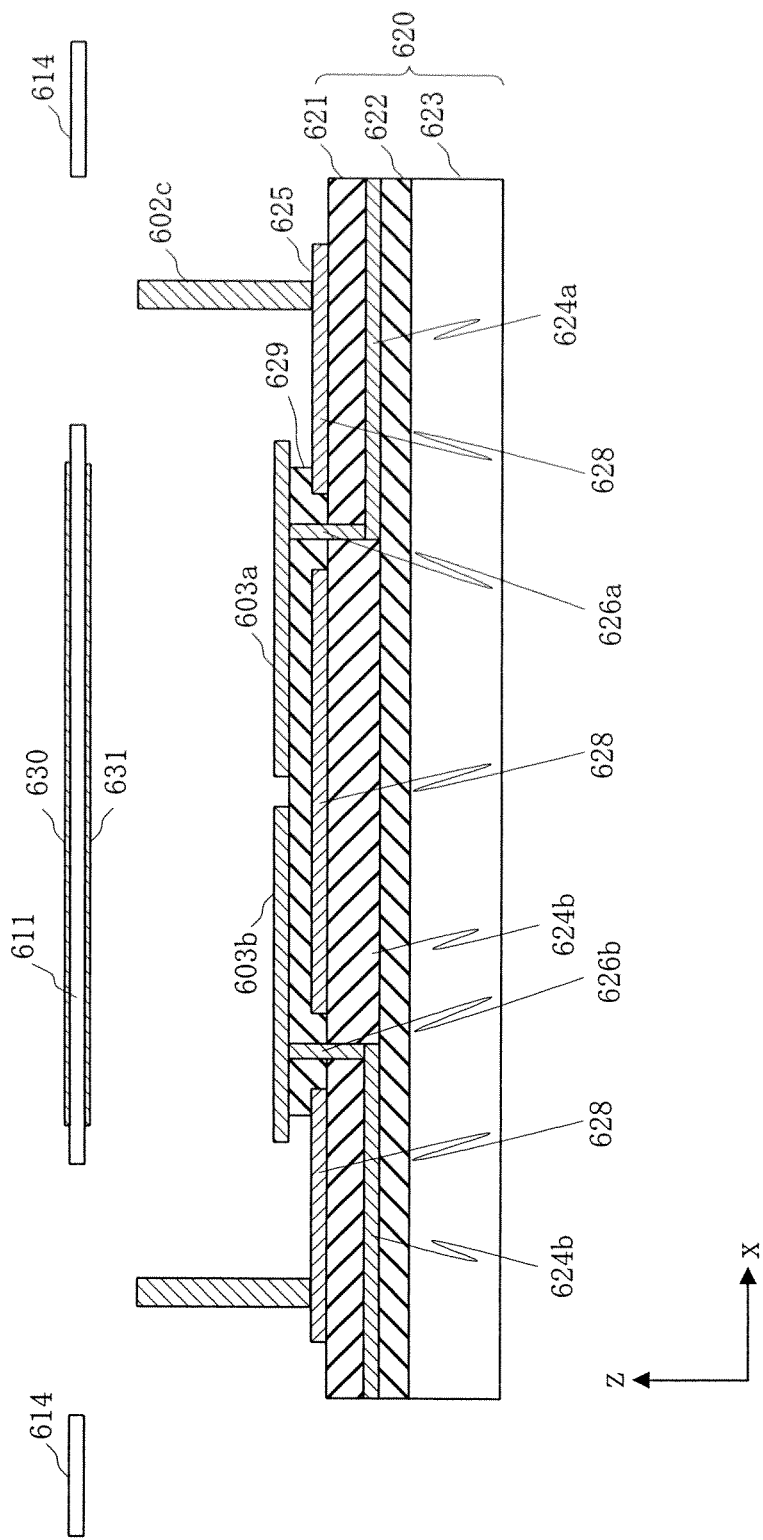
FIG. 60 is a sectional view showing the arrangement of a micromirror device according to the 23rd embodiment of the present invention.

The 23rd embodiment of the present invention will be described next. This embodiment is a combination of the 13th and 15th embodiments. FIG. 60 is a sectional view showing the arrangement of a micromirror device according to the 23rd embodiment of the present invention. The arrangement of this embodiment is the same as that described in the 13th and 15th embodiments, and a description thereof will not be repeated. Note that the 15th embodiment may be combined with the 14th embodiment, as a matter of course.

Industrial Applicability

The present invention is applicable to an electrostatically driven MEMS device such as a micromirror device.

The invention claimed is:

1. A MEMS device comprising:
   a first substrate;
   a second substrate arranged so as to face said first substrate;
   a movable member rotatably supported in an opening portion of said first substrate via support members;
   a driving electrode arranged on an insulating film on a surface of said second substrate facing said first substrate so as to face said movable member across a gap and drive said movable member; and
   a driving stabilization electrode made of one of a metal and a semiconductor and formed in contact with the insulating film of said second substrate, wherein said driving stabilization electrode is formed under the insulating film of said second substrate, which is exposed to the air gap, while being in contact with the insulating film,
   wherein said driving stabilization electrode is formed in a region wider than a region of the insulating film exposed to the air gap.

2. A MEMS device according to claim 1, wherein said driving stabilization electrode is formed in both a region under the insulating film exposed to the air gap and a region under said driving electrode.

3. A MEMS device comprising:
   a first substrate;
   a second substrate arranged so as to face said first substrate; and
   a movable member rotatably supported in an opening portion of said first substrate via support members,
   wherein said second substrate comprise:
   a driving electrode,
   a first insulating film formed on an upper surface of a base portion made of a semiconductor,
   a driving electrode electrical interconnection formed on an upper surface of said first insulating film so as to apply a driving voltage to said driving electrode,
   a second insulating film which covers said driving electrode electrical interconnection, a driving stabilization electrode which is made of one of a metal and a semiconductor and formed on an upper surface of said second insulating film so as to cover said second insulating film, and a third insulating film formed on said driving stabilization electrode at a position facing said movable member, wherein said driving electrode is formed on an upper surface of said third insulating film so as to face said movable member and cover said third insulating film, and electrically connected to said driving electrode electrical interconnection via a vertical electrical interconnection, said driving stabilization electrode is formed at least in a region under said driving electrode and a peripheral region outside of said driving electrode, and when viewed from a side of said movable member of said first substrate, said first insulating film, said second insulating film, and said third insulating film are not exposed to the surface of said second substrate.

4. A MEMS device according to claim 3, wherein at least part of an horizontal edge of said driving electrode projects outward from an edge of said third insulating film.

5. A MEMS device according to claim 3, wherein said driving electrode, said driving stabilization electrode, and said driving electrode electrical interconnection are made of a metal.

6. A MEMS device according to claim 3, wherein said driving stabilization electrode has an equipotential to said movable member.

* * * * *